(12) United States Patent
Lin et al.

(10) Patent No.: US 12,745,436 B2
(45) Date of Patent: Sep. 22, 2026

(54) BIAXIAL OXIDE DIRECTION COMPLEMENTARY FIELD EFFECT TRANSISTOR

(71) Applicant: TAIWAN SEMICONDUCTOR MANUFACTURING COMPANY, LTD., Hsinchu (TW)

(72) Inventors: Meng-Yu Lin, New Taipei City (TW); Chun-Fu Cheng, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 459 days.

(21) Appl. No.: 18/338,935

(22) Filed: Jun. 21, 2023

(65) Prior Publication Data

US 2024/0429279 A1 Dec. 26, 2024

(51) Int. Cl.

| | |
|---|---|
| ***H10D 62/10*** | (2025.01) |
| ***H10D 30/01*** | (2025.01) |
| ***H10D 30/43*** | (2025.01) |
| ***H10D 30/67*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |

(52) U.S. Cl.

CPC ......... *H10D 62/121* (2025.01); *H10D 30/014* (2025.01); *H10D 30/43* (2025.01); *H10D 30/6729* (2025.01); *H10D 30/6735* (2025.01); *H10D 30/6757* (2025.01); *H10D 64/017* (2025.01); *H10D 84/017* (2025.01); *H10D 84/038* (2025.01); *H10D 84/85* (2025.01)

(58) Field of Classification Search

CPC .... H10D 62/121; H10D 30/014; H10D 30/43; H10D 30/6729; H10D 30/6735; H10D 30/6757; H10D 30/019; H10D 30/501; H10D 64/017; H10D 64/256; H10D 84/017; H10D 84/038; H10D 84/85; H10D 84/0135; H10D 84/0151; H10D 84/0172; H10D 84/0188; H10D 84/83; H10D 88/01; H10D 88/00; B82Y 10/00

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |

(Continued)

*Primary Examiner* — William B Partridge
*Assistant Examiner* — Chevy J Boegel
(74) *Attorney, Agent, or Firm* — Birch, Stewart, Kolasch & Birch, LLP

(57) ABSTRACT

A semiconductor device includes a substrate, a semiconductor nanostructure over the substrate, a gate dielectric layer wrapping around the semiconductor nanostructure and a gate electrode over the gate dielectric layer. The semiconductor nanostructure includes a plurality of first strips extending along a first direction and a plurality of second strips along a second direction, and wherein the second direction crosses the first direction.

20 Claims, 47 Drawing Sheets

(56) References Cited

U.S. PATENT DOCUMENTS

| | | | | |
|---|---|---|---|---|
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2016/0005617 | A1* | 1/2016 | Wu | H01L 21/308<br>438/702 |
| 2021/0193828 | A1* | 6/2021 | Cheng | H10D 84/038 |

* cited by examiner

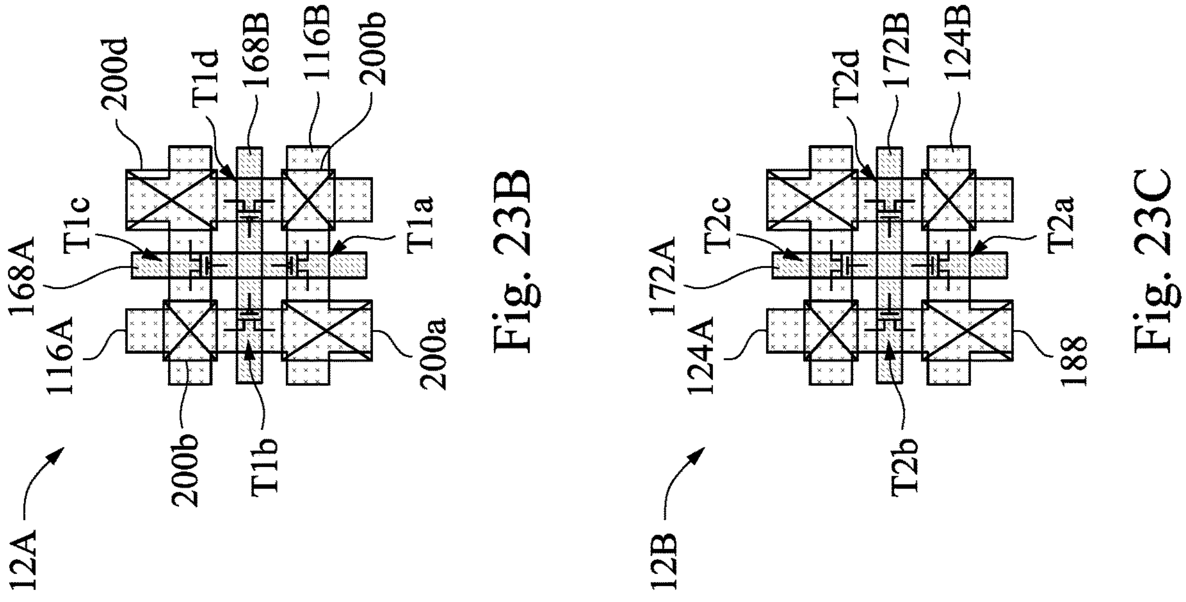
Fig. 23B
Fig. 23C
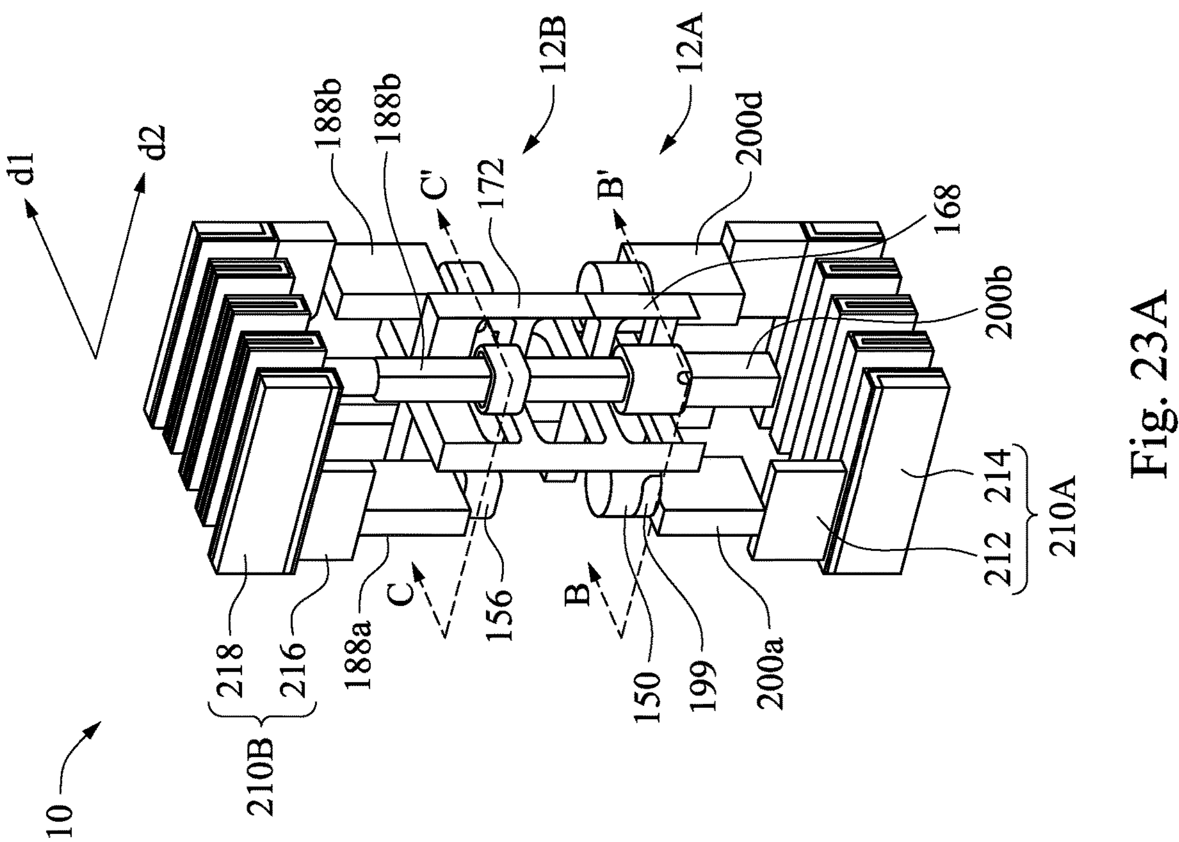
Fig. 23A

BIAXIAL OXIDE DIRECTION COMPLEMENTARY FIELD EFFECT TRANSISTOR

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 21A, 22A and 23A are perspective views of manufacturing the IC structure in accordance with some embodiments.

FIG. 23B is a cross-sectional view along line B-B' of FIG. 23A.

FIG. 23C is a cross-sectional view along line C-C' of FIG. 23A.

DETAILED DESCRIPTION

Figure 1:
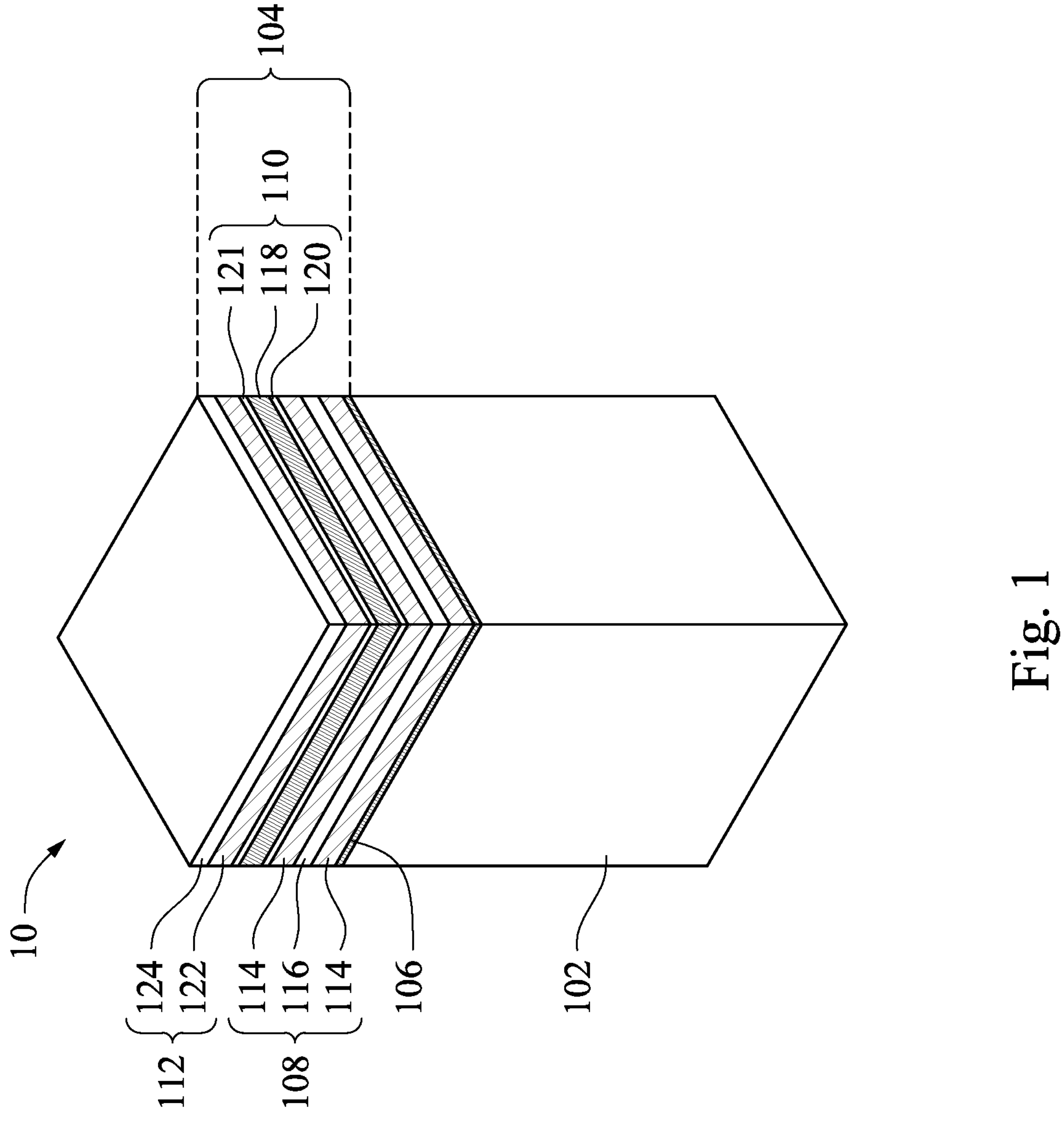
FIGS. 1, 2A, 3A and 4A are perspective views of manufacturing the IC structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numerals in different figures refer to the same or similar component formed by a same or similar process using a same or similar material(s).

From Fin field effect transistor (FinFET) to nanosheet-FET, most of metal oxide semiconductor FETs (MOSFETs)

has an oxide definition (OD) design along a single direction, which is usually parallel to a power metal line. The OD refers to an active area for an active device. Cell size shrink has become a bottleneck because a cell height is related to an OD width and an OD spacing. A reason is that a side-by-side n-type FET and p-type FET (n/p FETs) placement make the n/p FETs need to be placed at the same surface. Although complementary field effect transistor (CFET)'s n/p FET stacking structure would be a temporary solution for moor's law, the cell height definition is still restricted by the OD width and the OD spacing design.

Embodiments of the present disclosure provide a bi-axial OD direction CFET design to offer more OD width (effect width) under the same cell area. The bi-axial OD direction design can provide OD with different directions, which is beneficial for OD width design flexibility and improved control over lateral dimension of an epitaxial source/drain structure.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-23C show various stages of manufacturing operations for an integrated circuit (IC) structure 10 according to some embodiments of the present disclosure. In greater details, the IC structure 10 discussed in FIGS. 1-23C is a complementary FET (CFET). Generally, a CFET includes a second transistor (e.g., a second semiconductor device 12B in FIG. 23A) vertically stacked over a first transistor (e.g., a first semiconductor device 12A in FIG. 23A), in which the first and second transistors include different conductivity types. For example, the first transistor and the second transistor may be n-type transistor and p-type transistor, respectively. Alternatively, the first transistor and the second transistor may be p-type transistor and n-type transistor, respectively.

Figure 3A:
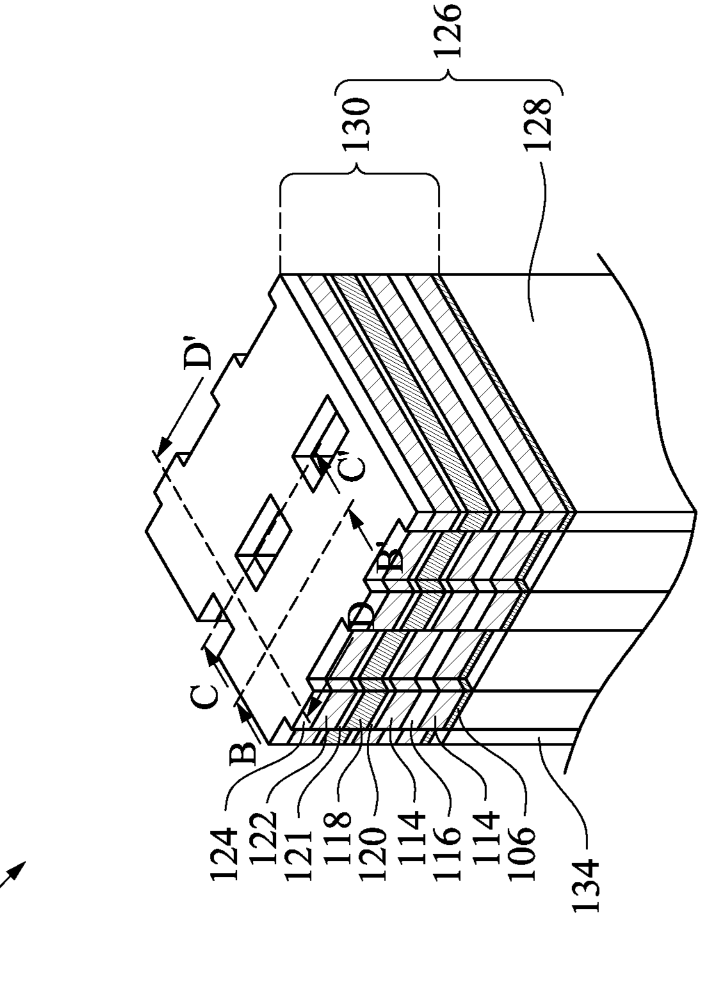
Figure 3C:
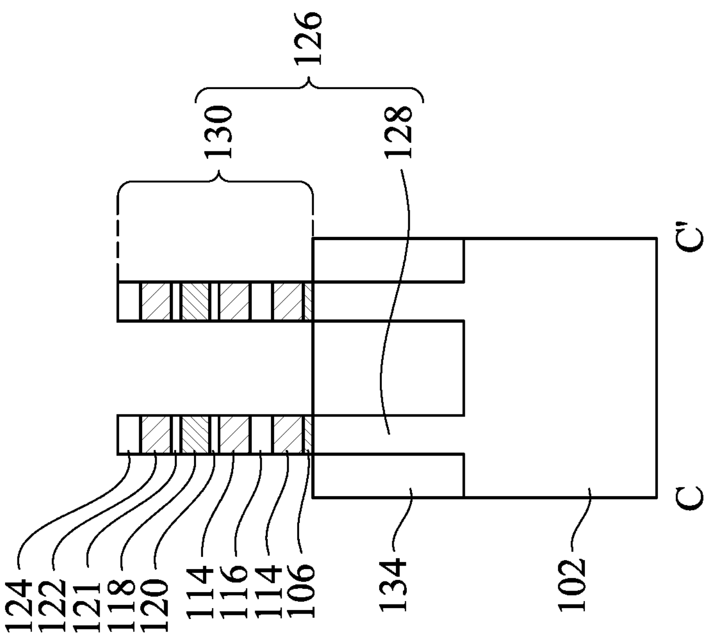
FIGS. 3C and 4C are cross-sectional views along line C-C' of FIGS. 3A and 4A, respectively.
Figure 3B:
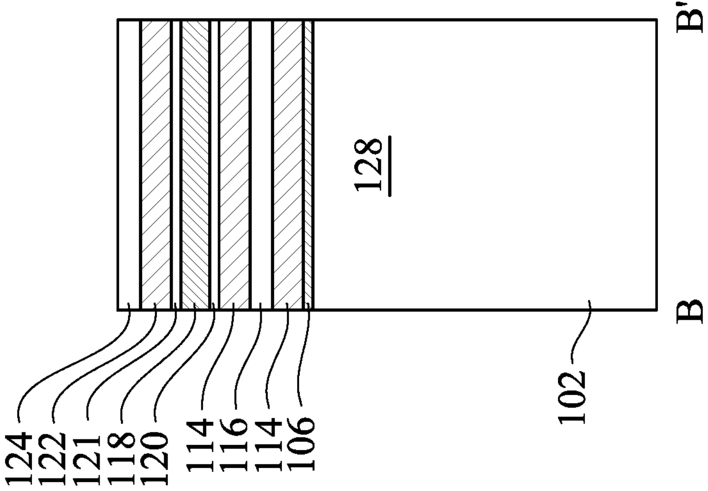
FIGS. 3B and 4B are cross-sectional views along line B-B' of FIGS. 3A and 4A, respectively.
Figure 3D:
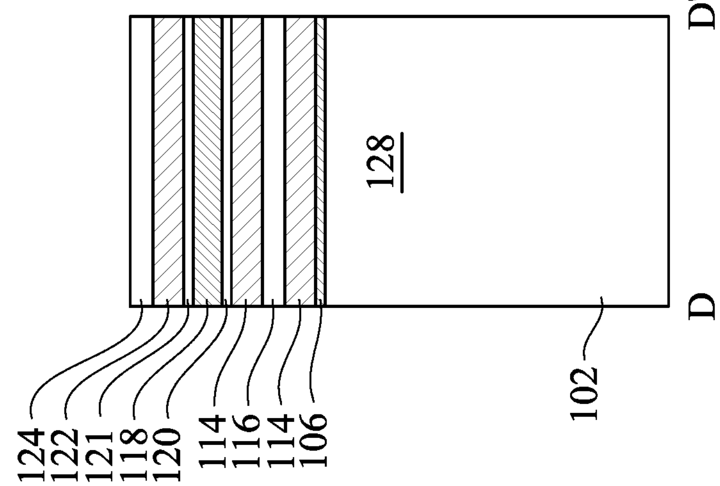
FIGS. 3D and 4D are cross-sectional views along line D-D' of FIGS. 3A and 4A, respectively.
Figure 4B:
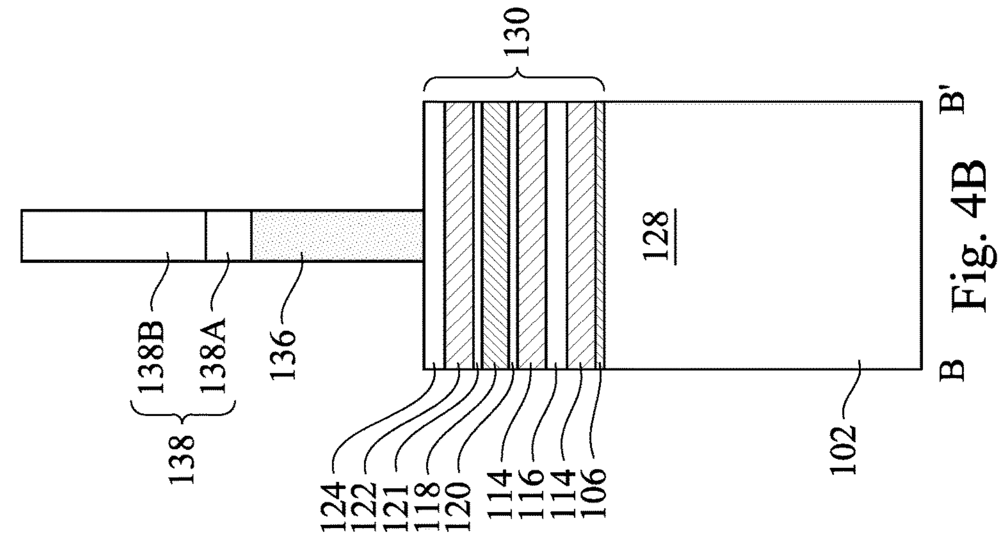
Figure 4A:
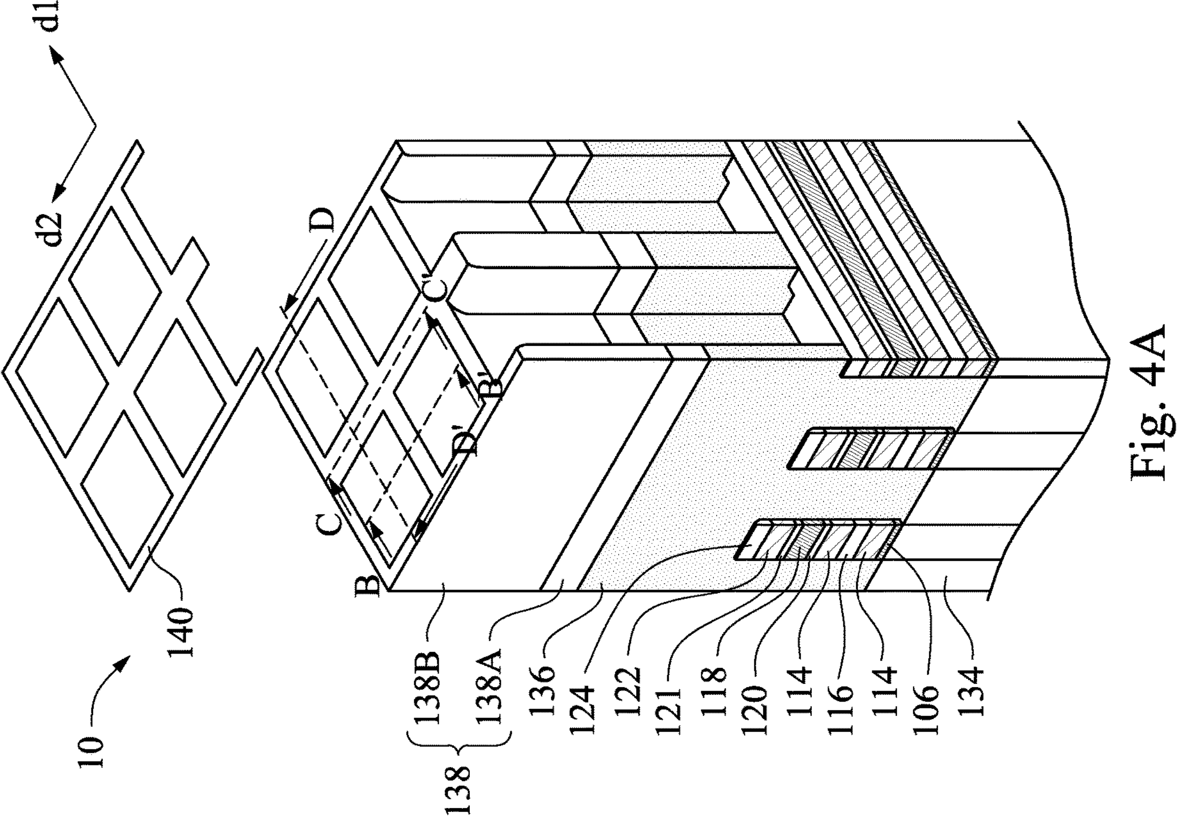
Figure 4D:
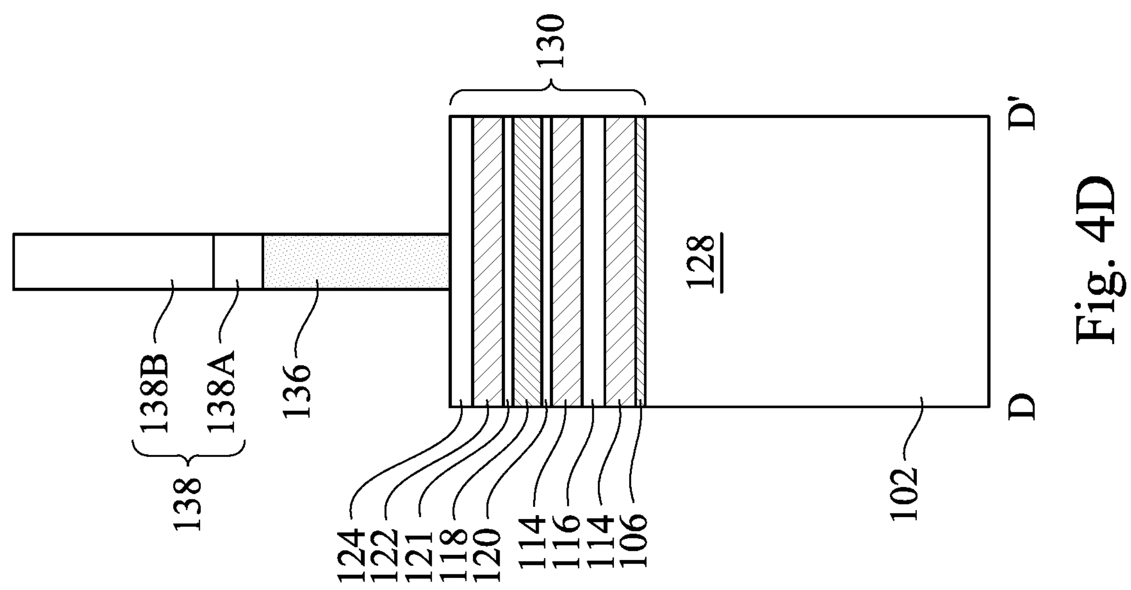
Figure 4C:
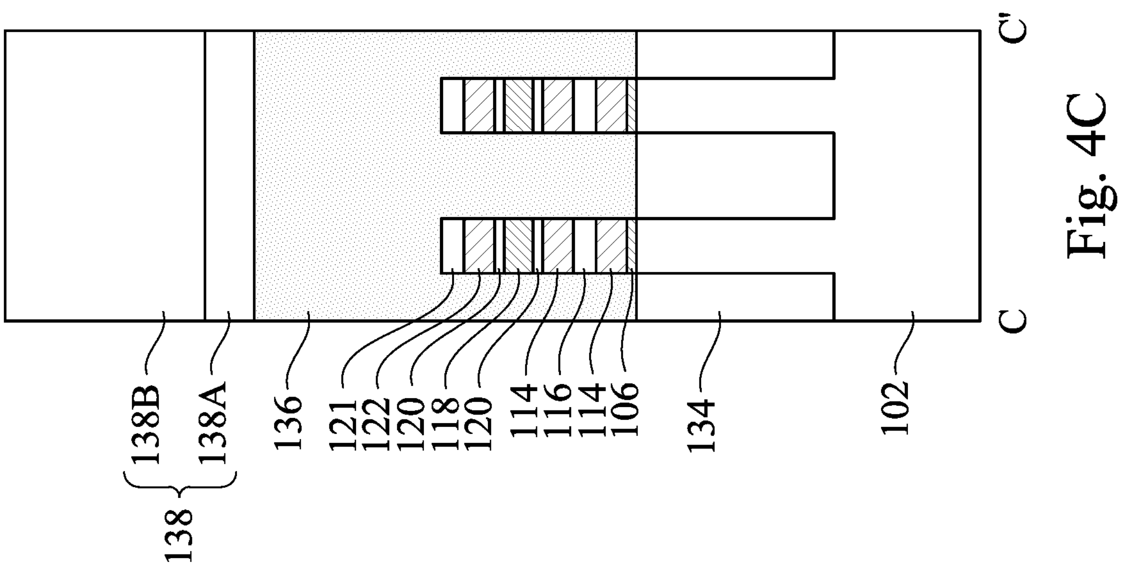
Figure 4E:
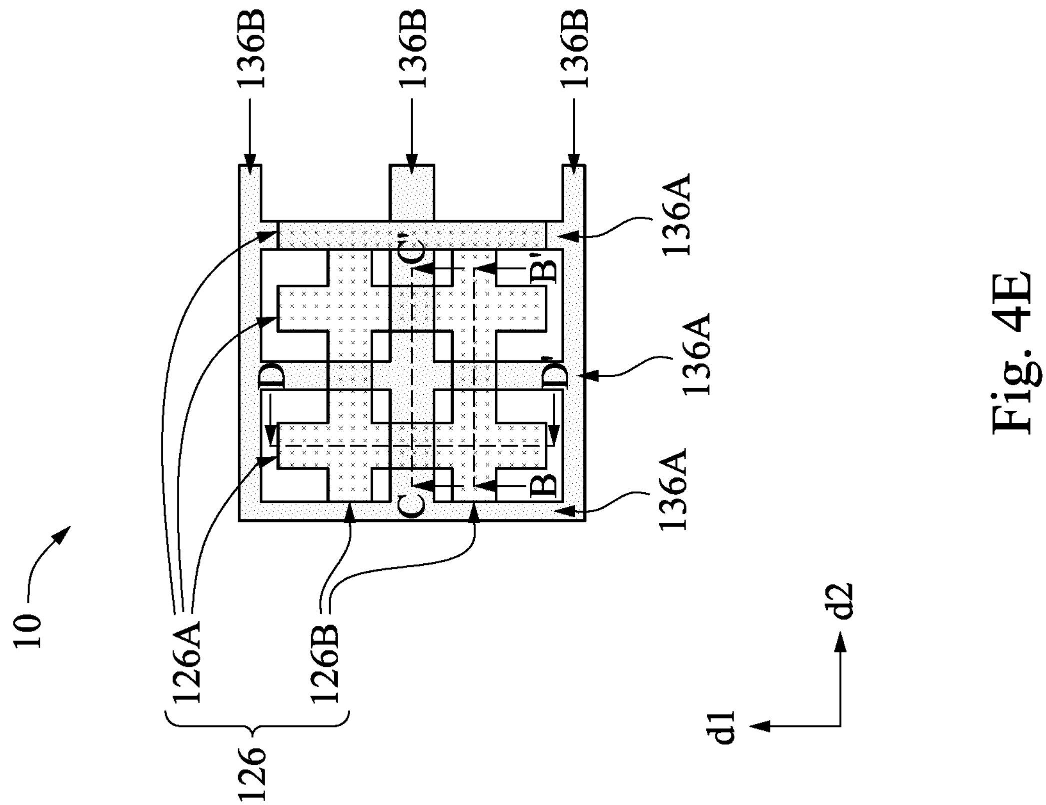
FIG. 4E is a top view of FIG. 4A.
Figure 5B:
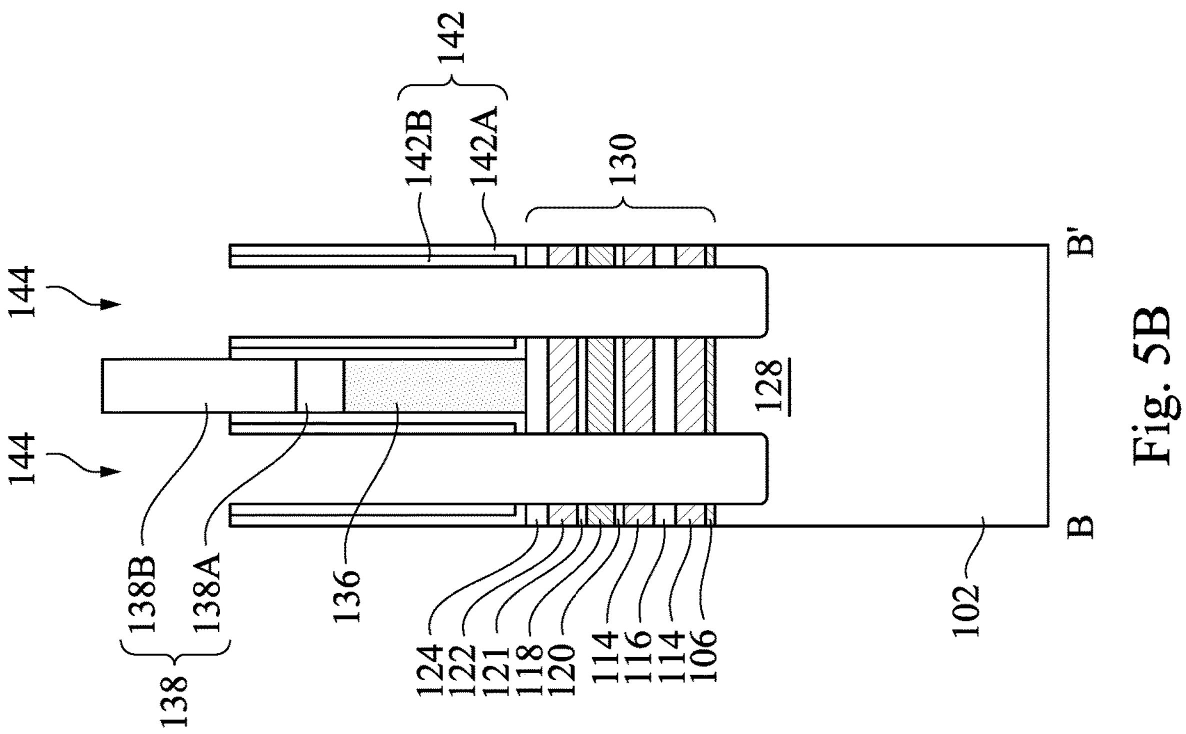
FIGS. 5B, 6B, 7B and 8B are cross-sectional views along line B-B' of FIGS. 5A, 6A, 7A and 8A, respectively.
Figure 5A:
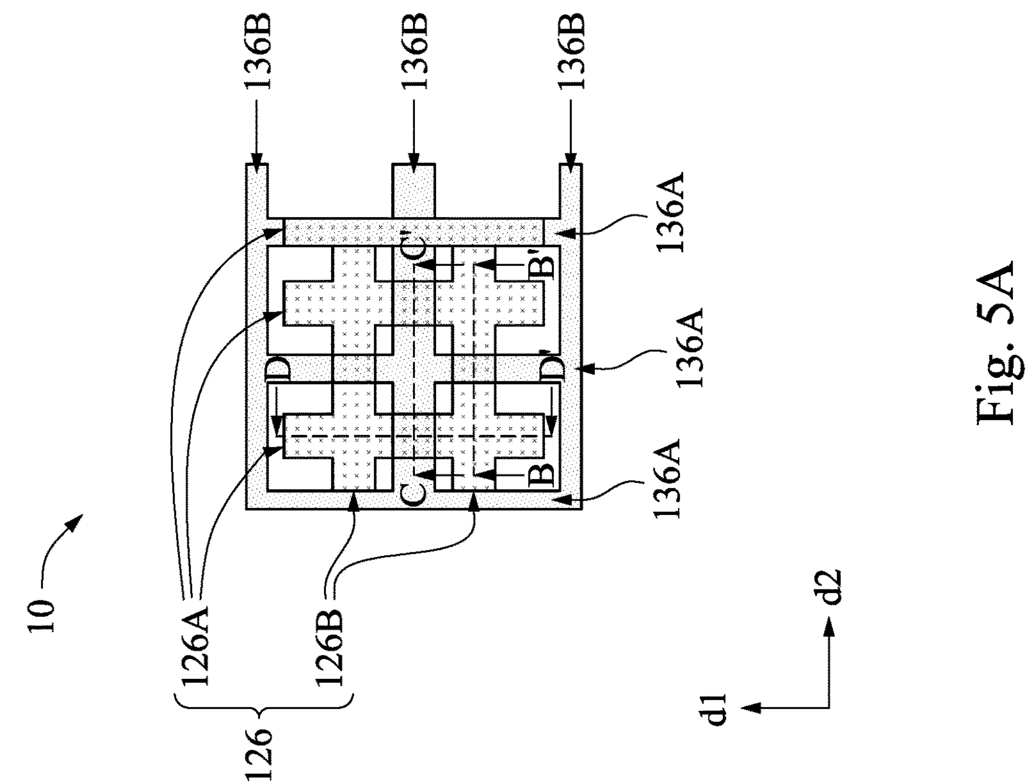
FIGS. 5A, 6A, 7A and 8A are top views of manufacturing the IC structure in accordance with some embodiments.
Figure 5D:
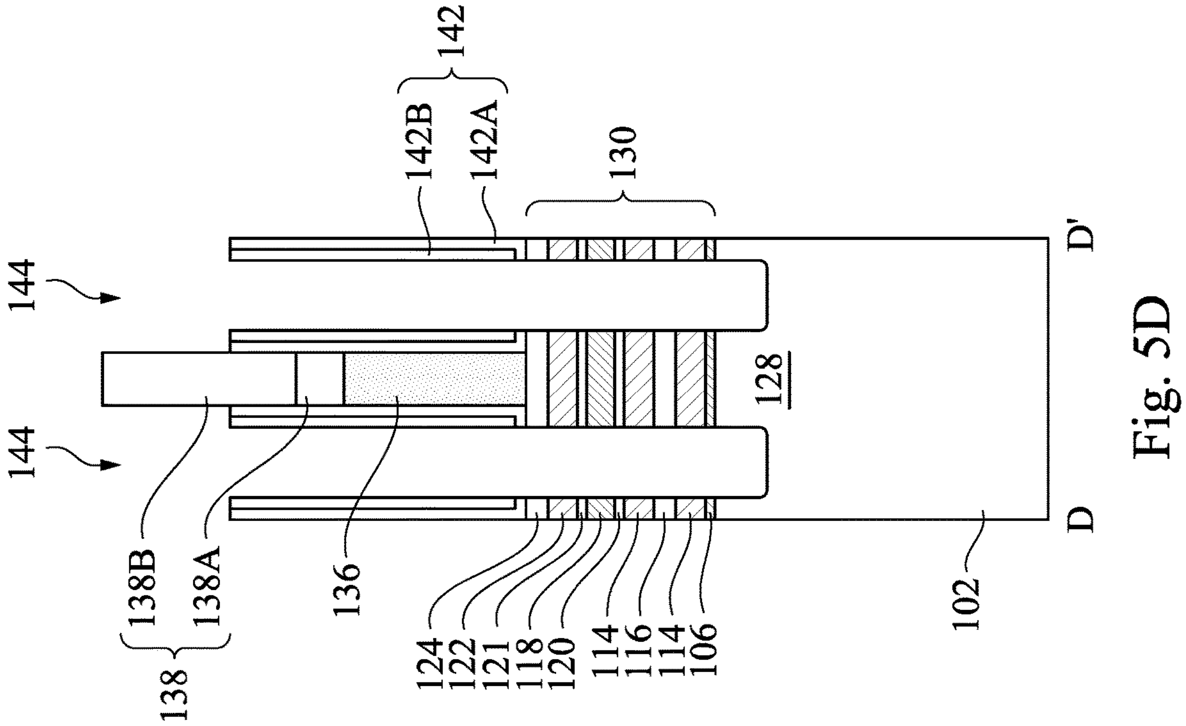
FIGS. 5D, 6D, 7D and 8D are cross-sectional views along line D-D' of FIGS. 5A, 6A, 7A, and 8A respectively.
Figure 5C:
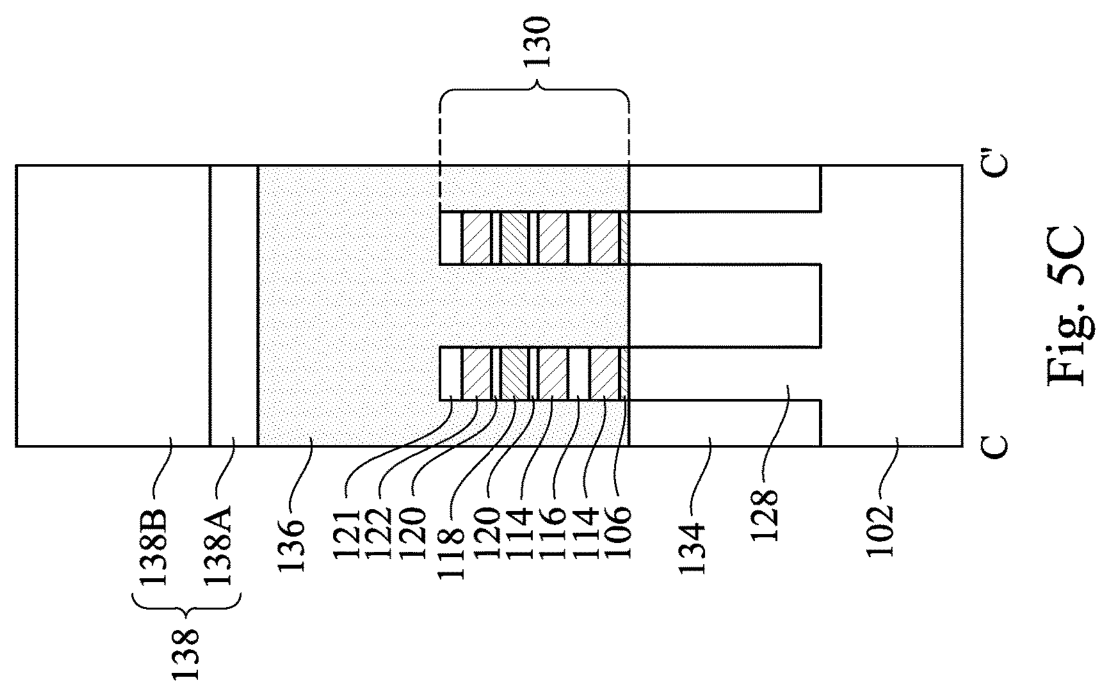
FIGS. 5C, 6C, 7C and 8C are cross-sectional views along line C-C' of FIGS. 5A, 6A, 7A and 8A, respectively.
Figure 6B:
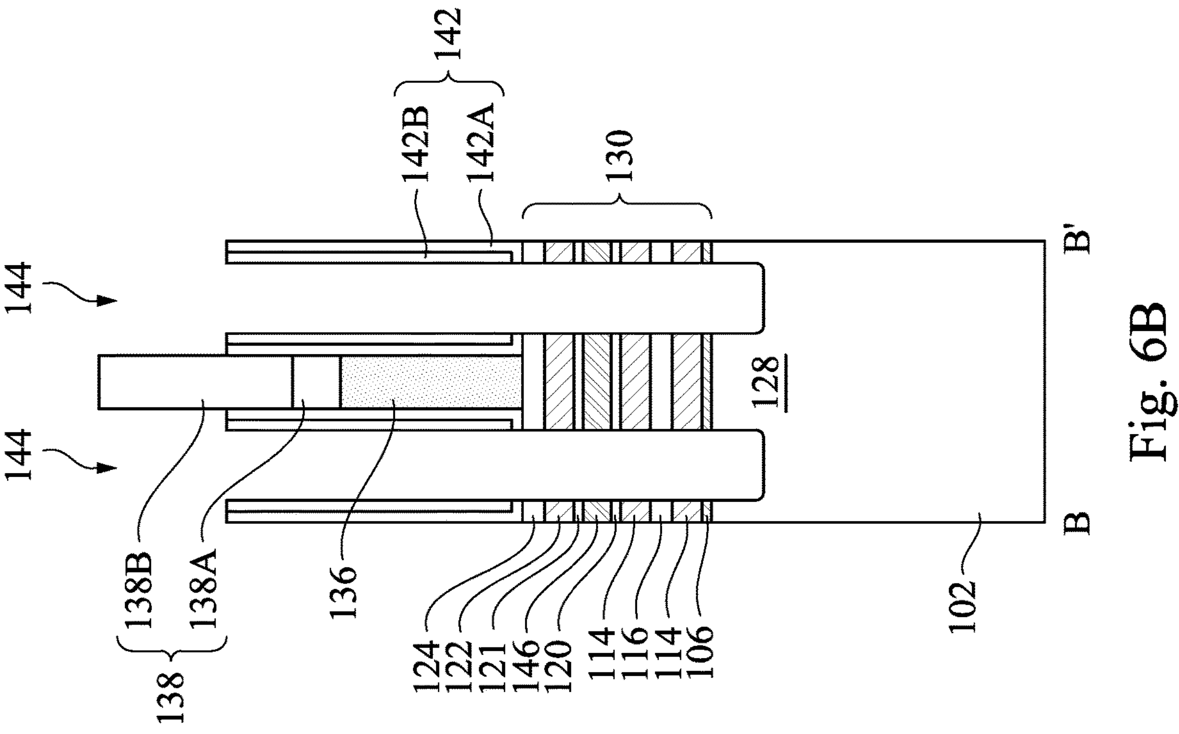
Figure 6A:
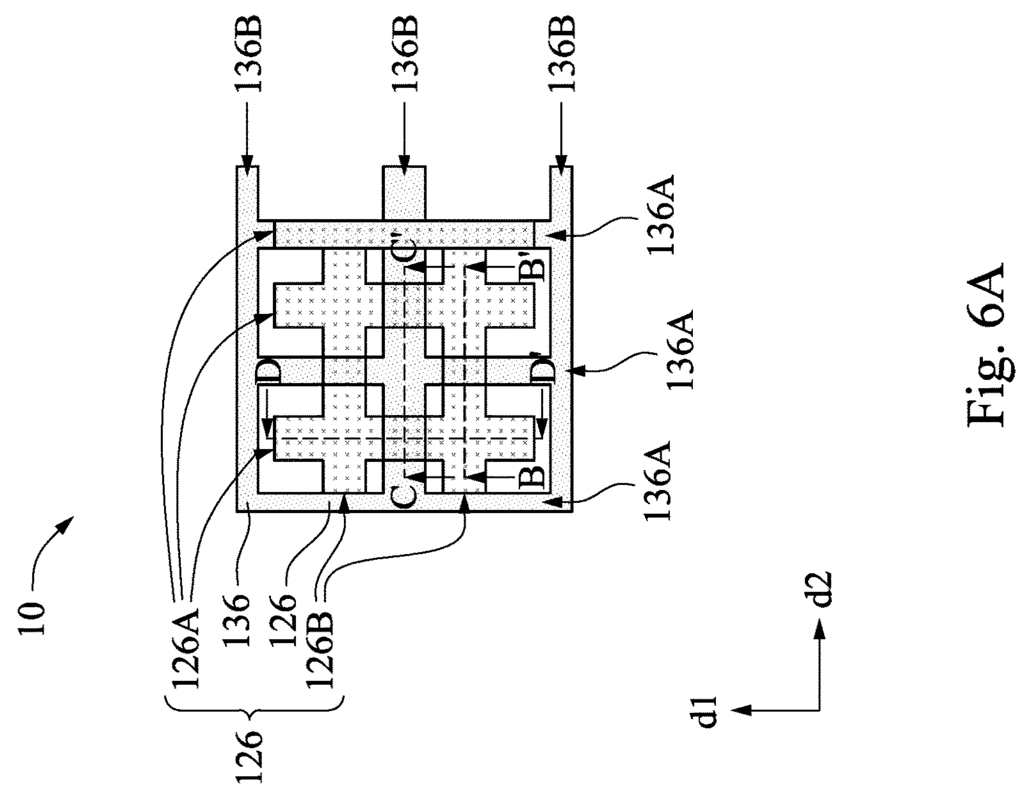
Figure 6D:
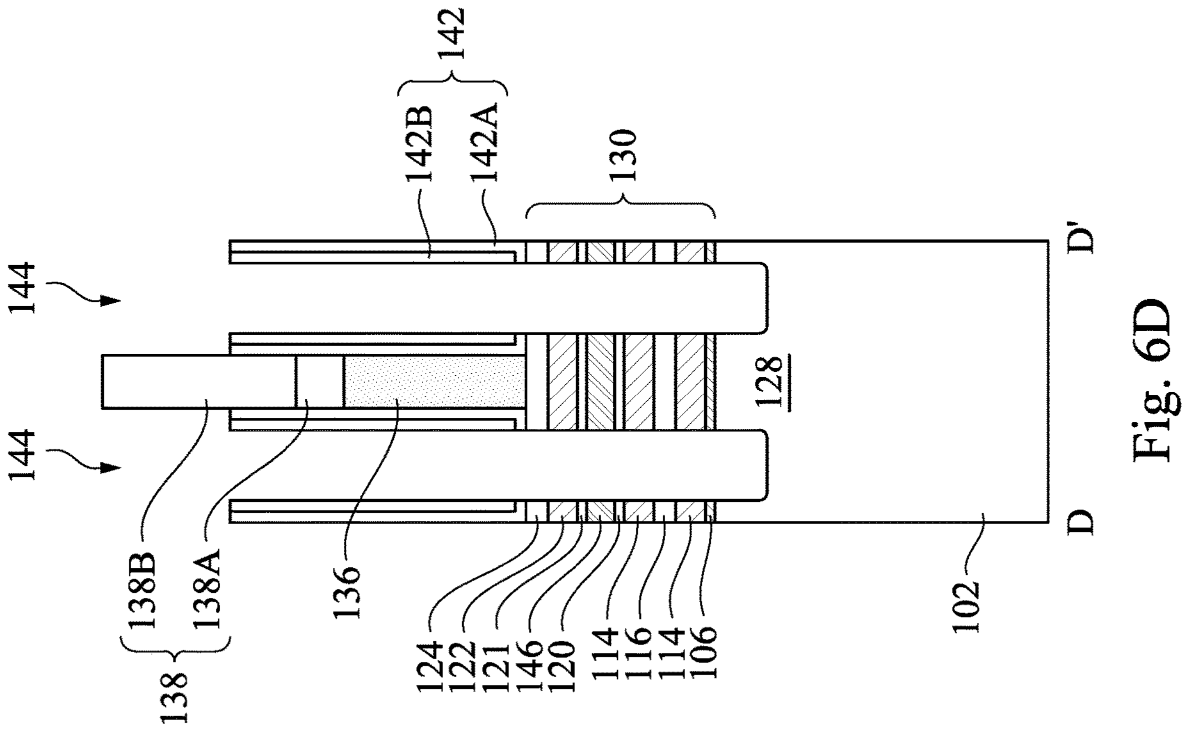
Figure 6C:
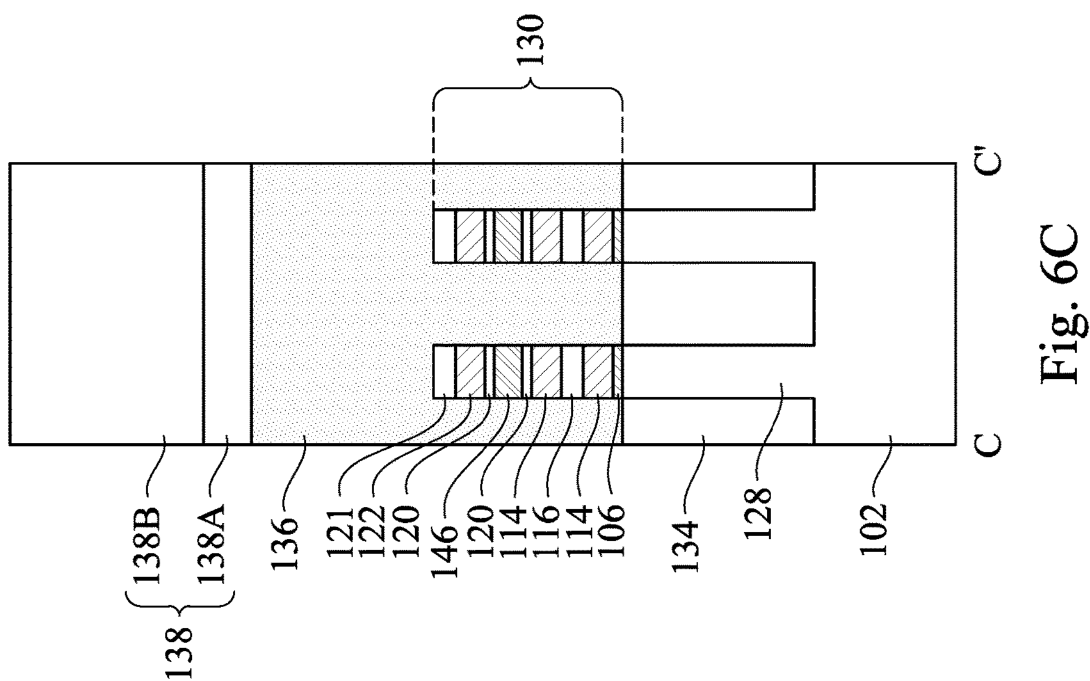
Figure 7B:
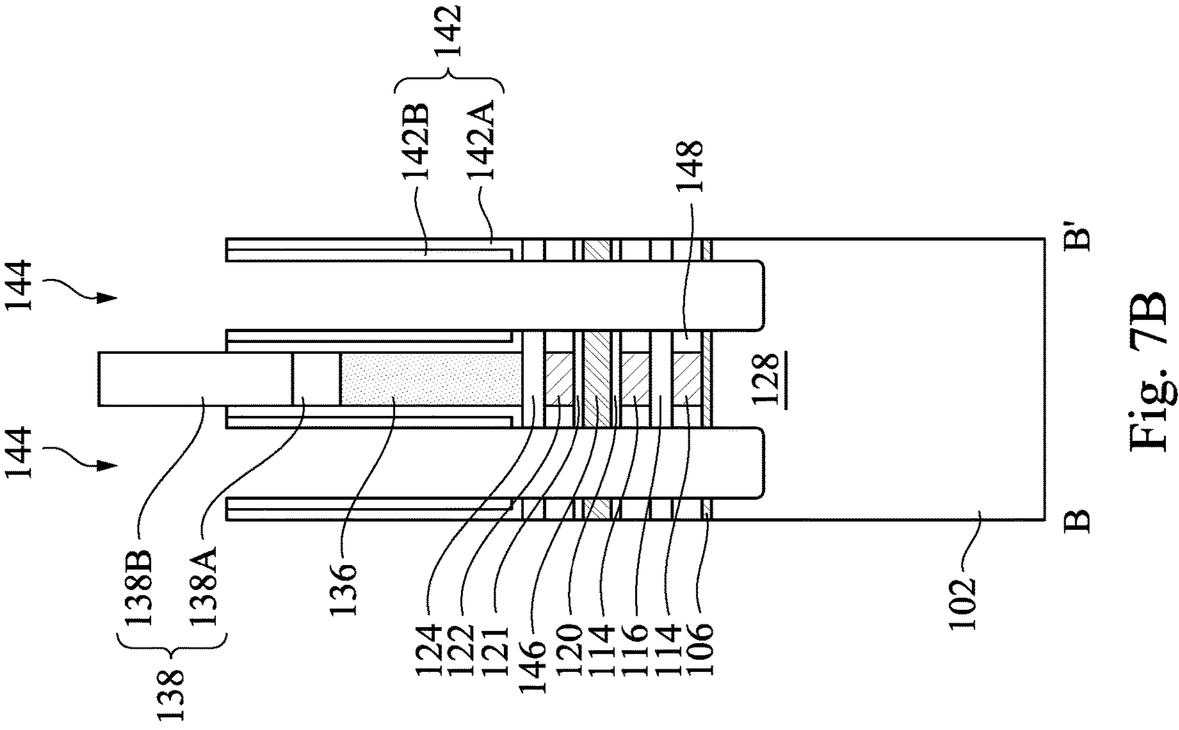
Figure 7A:
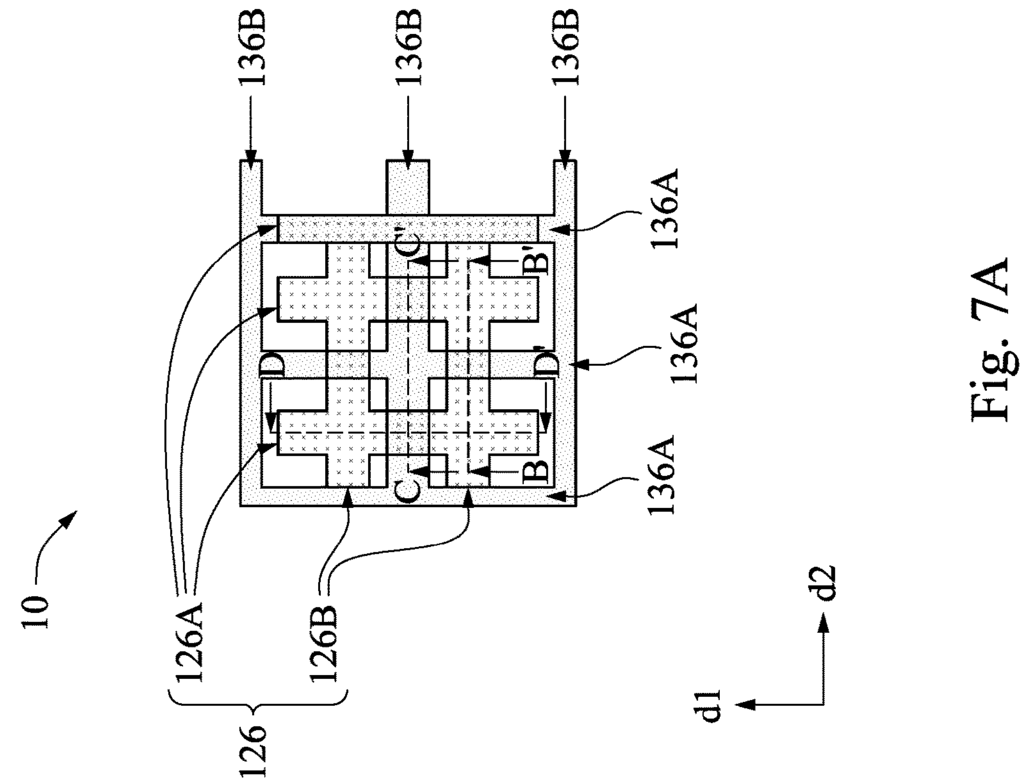
Figure 7D:
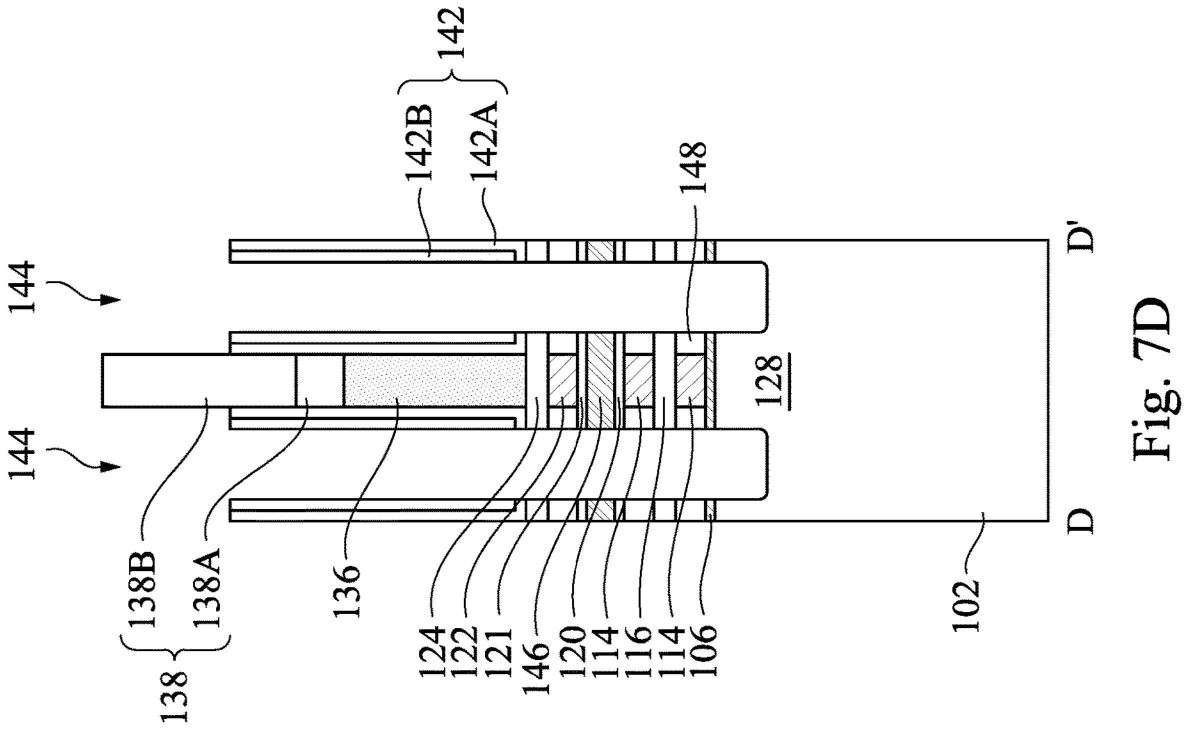
Figure 7C:
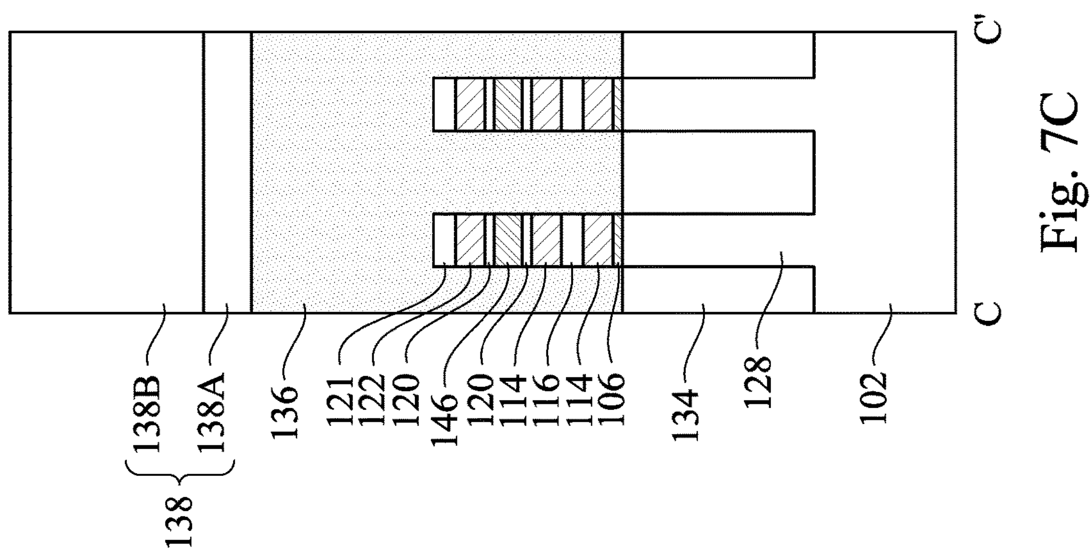
Figure 9A:
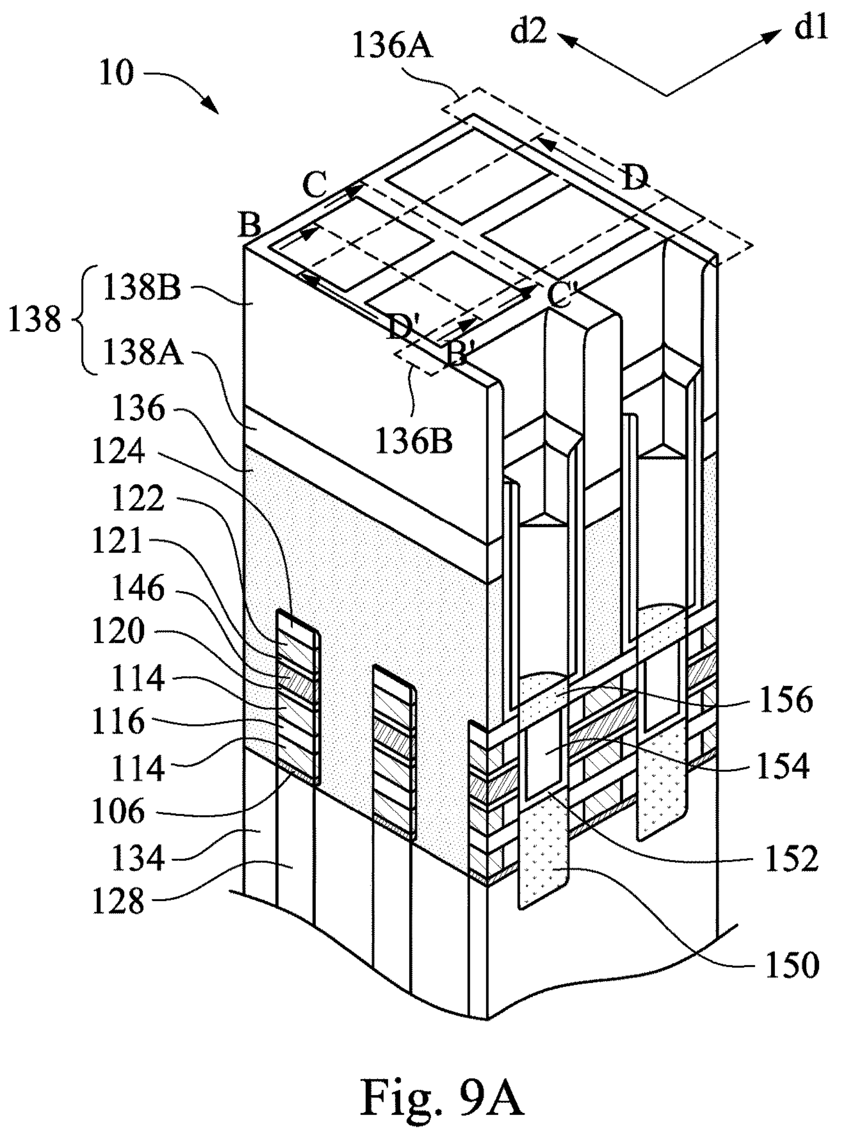
FIG. 9A is a perspective view of manufacturing the IC structure in accordance with some embodiments.
Figure 9B:
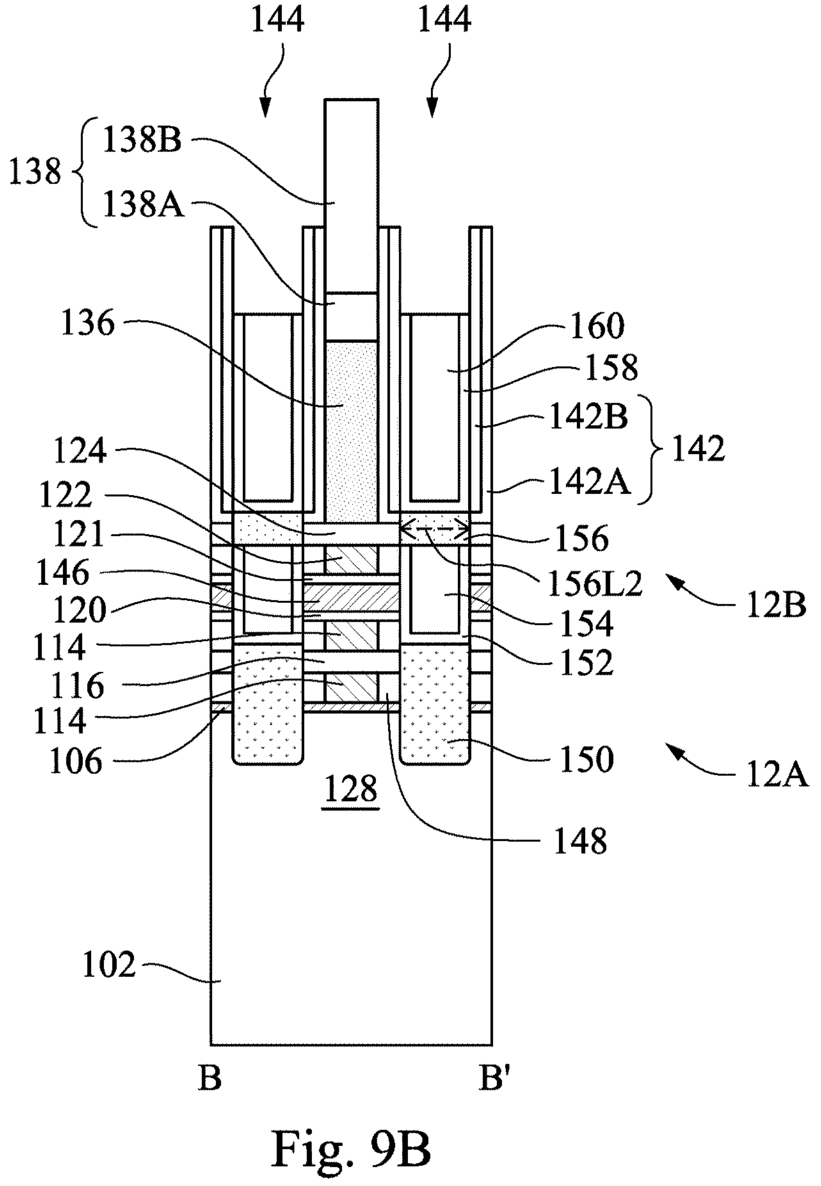
FIG. 9B is a cross-sectional view along line B-B' of FIG. 9A.
Figure 9D:
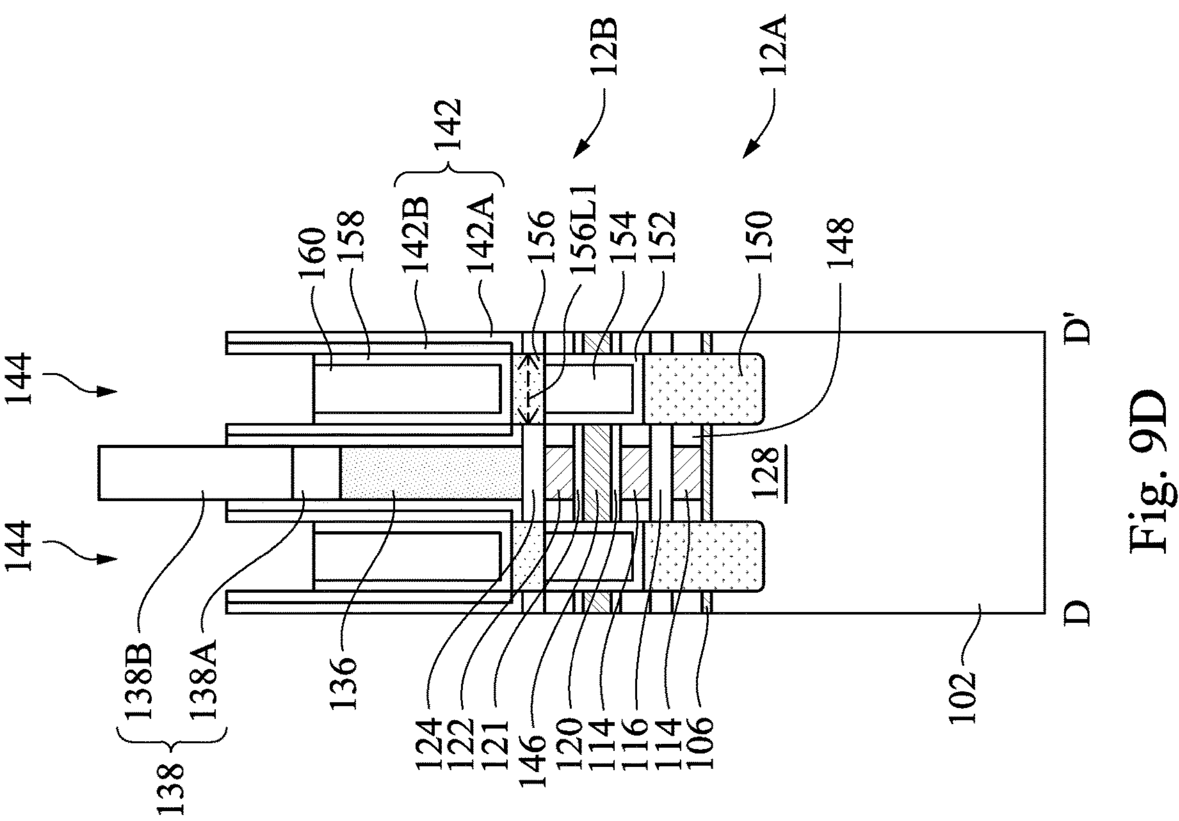
FIG. 9D is a cross-sectional view along line D-D' of FIG. 9A.
Figure 9C:
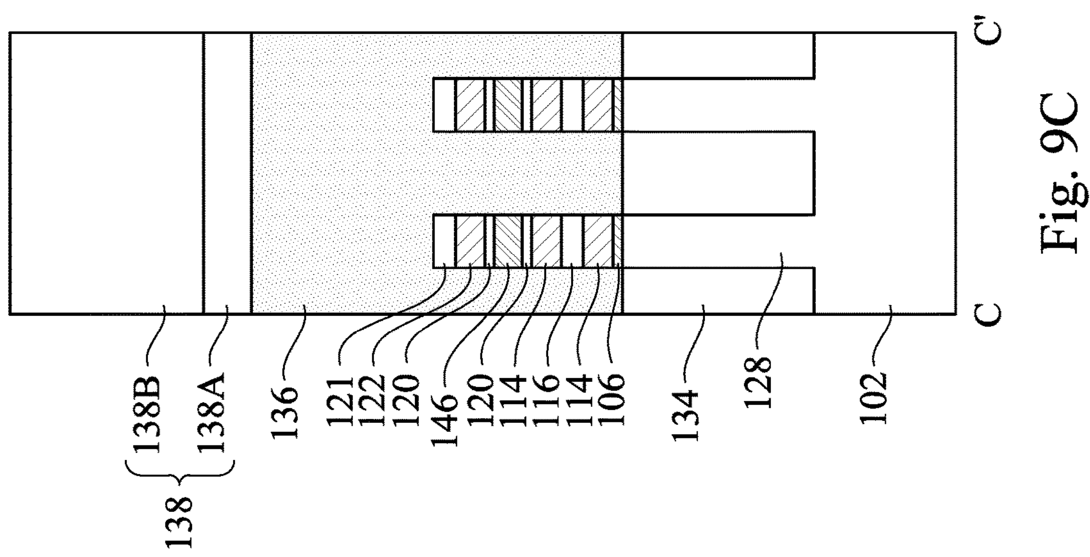
FIG. 9C is a cross-sectional view along line C-C' of FIG. 9A.
Figure 10B:
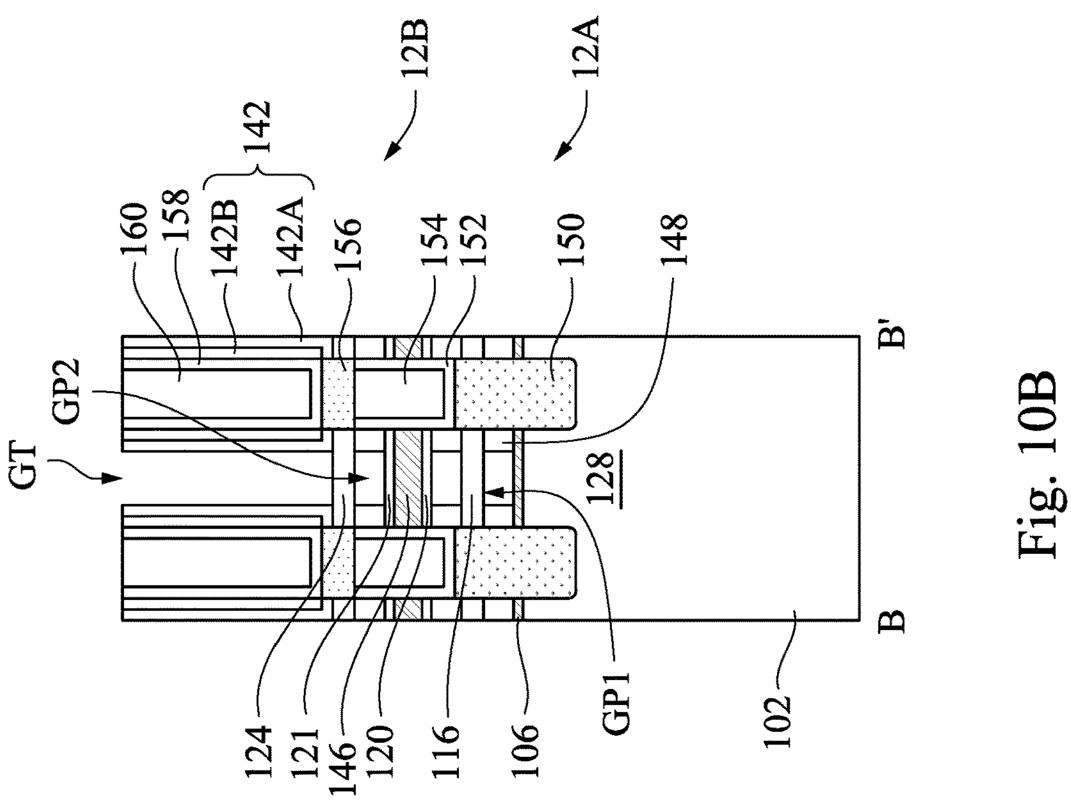
FIG. 10B is a cross-sectional view along line B-B' of FIG. 10A.
Figure 10A:
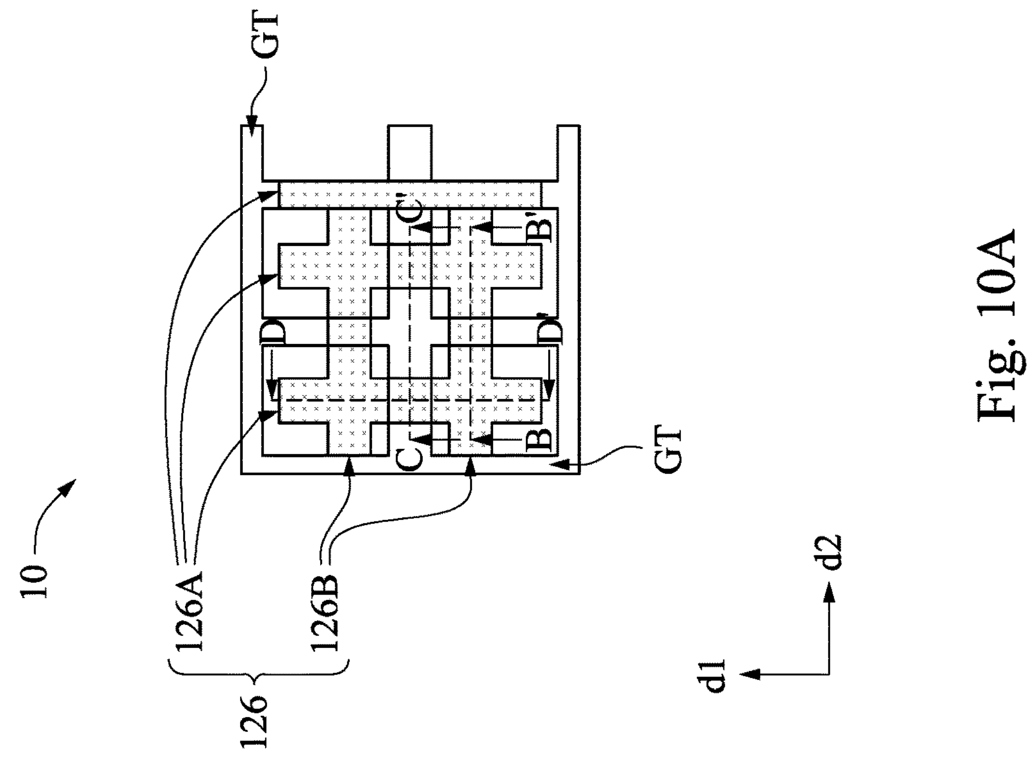
FIG. 10A is a top view of manufacturing the IC structure in accordance with some embodiments.
Figure 10D:
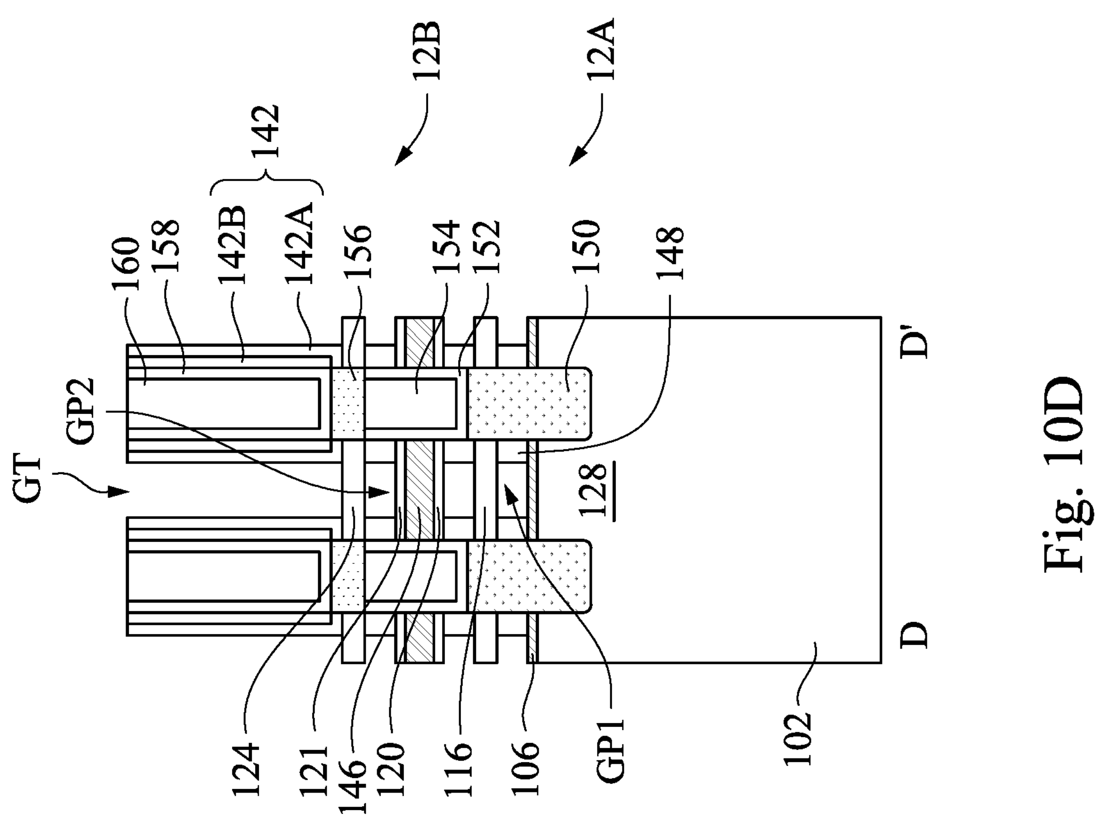
FIG. 10D is a cross-sectional view along line D-D' of FIG. 10A.
Figure 10C:
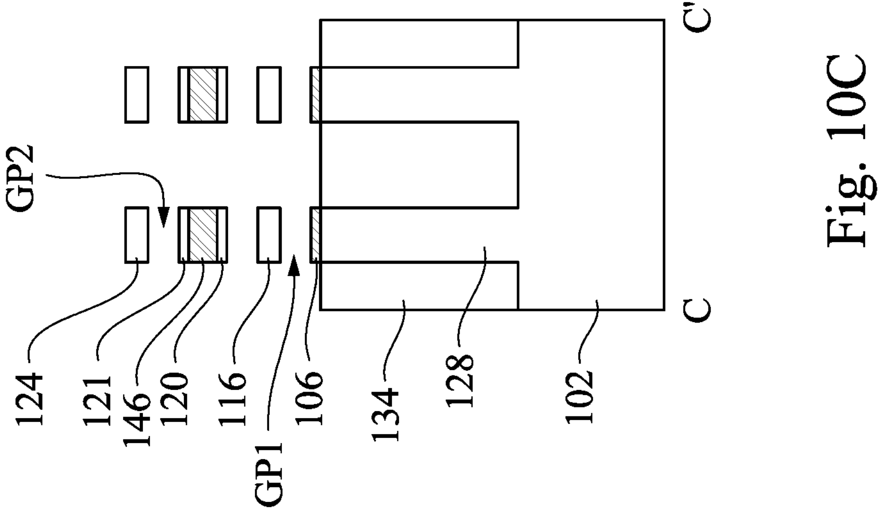
FIG. 10C is a cross-sectional view along line C-C' of FIG. 10A.
Figure 11A:
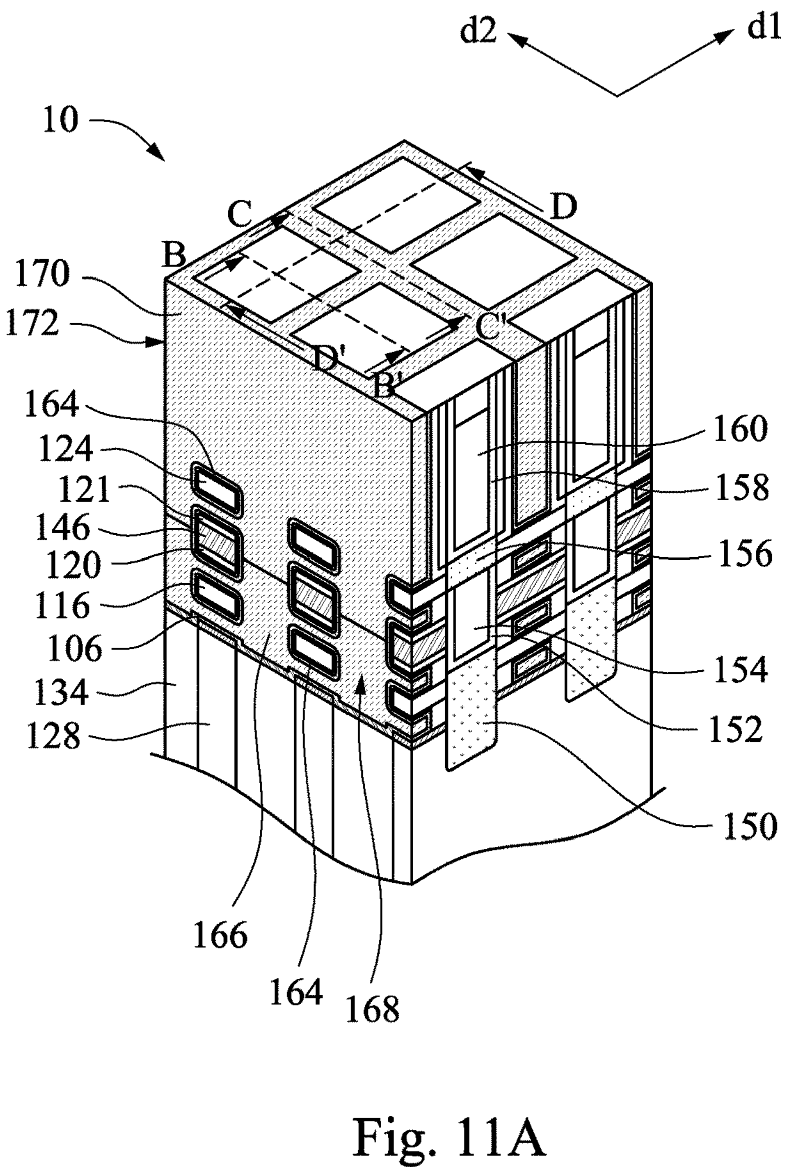
FIGS. 11A and 12A are perspective views of manufacturing the IC structure in accordance with some embodiments.
Figure 11B:
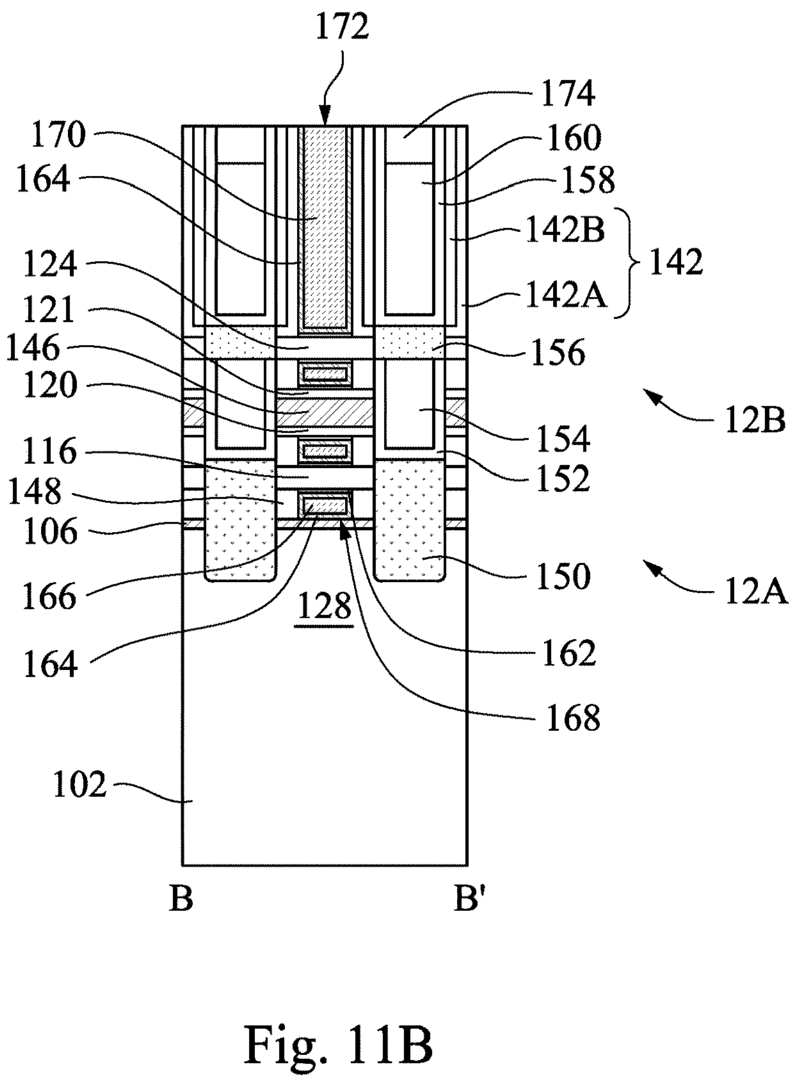
FIGS. 11B and 12B are cross-sectional views along line B-B' of FIGS. 11A and 12A, respectively.
Figure 11D:
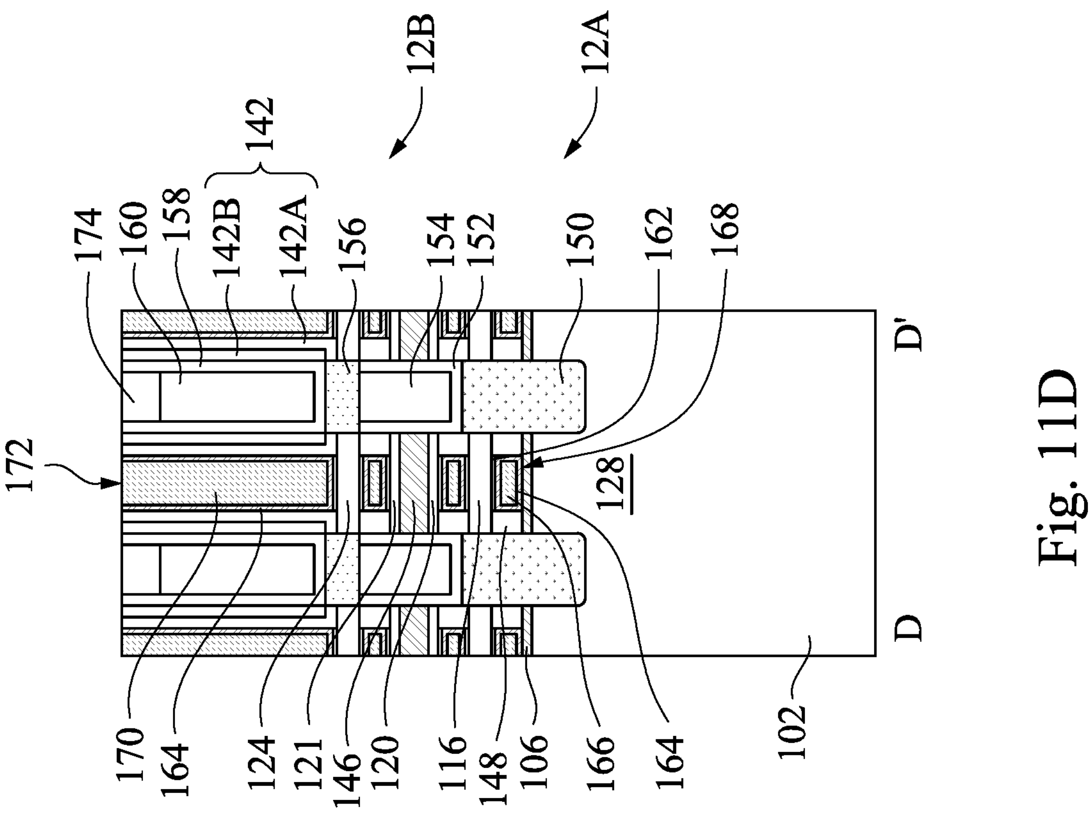
FIGS. 11D and 12D are cross-sectional views along line D-D' of FIGS. 11A and 12A, respectively.
Figure 11C:
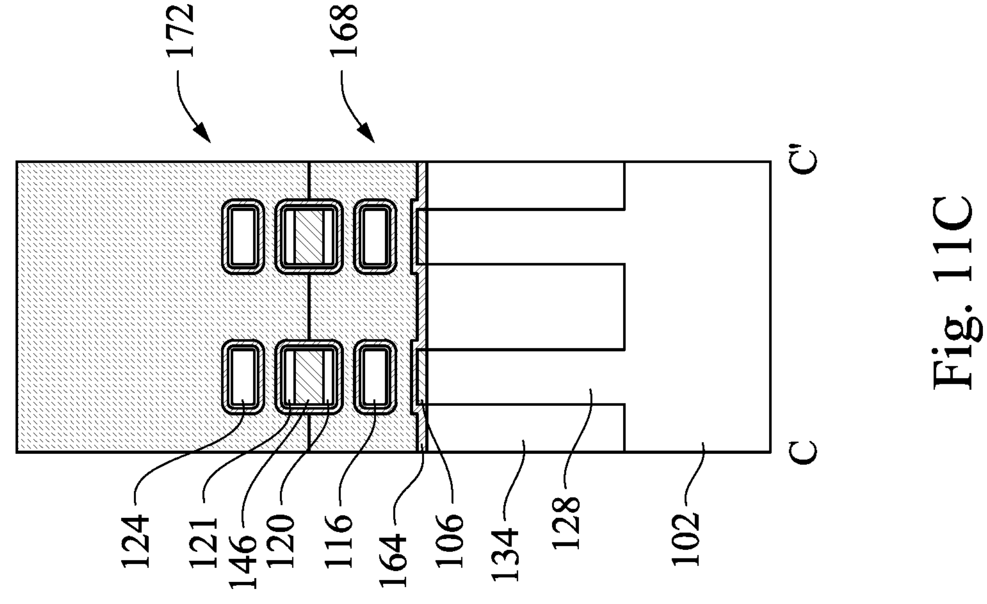
FIGS. 11C and 12C are cross-sectional views along line C-C' of FIGS. 11A and 12A, respectively.
Figure 12B:
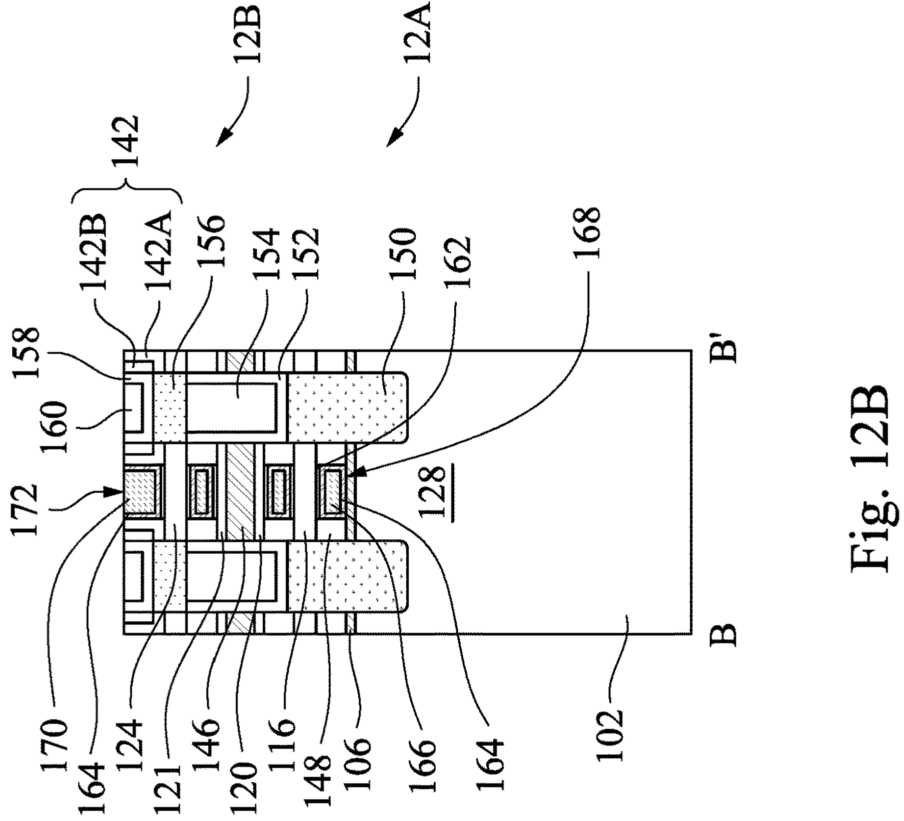
Figure 12A:
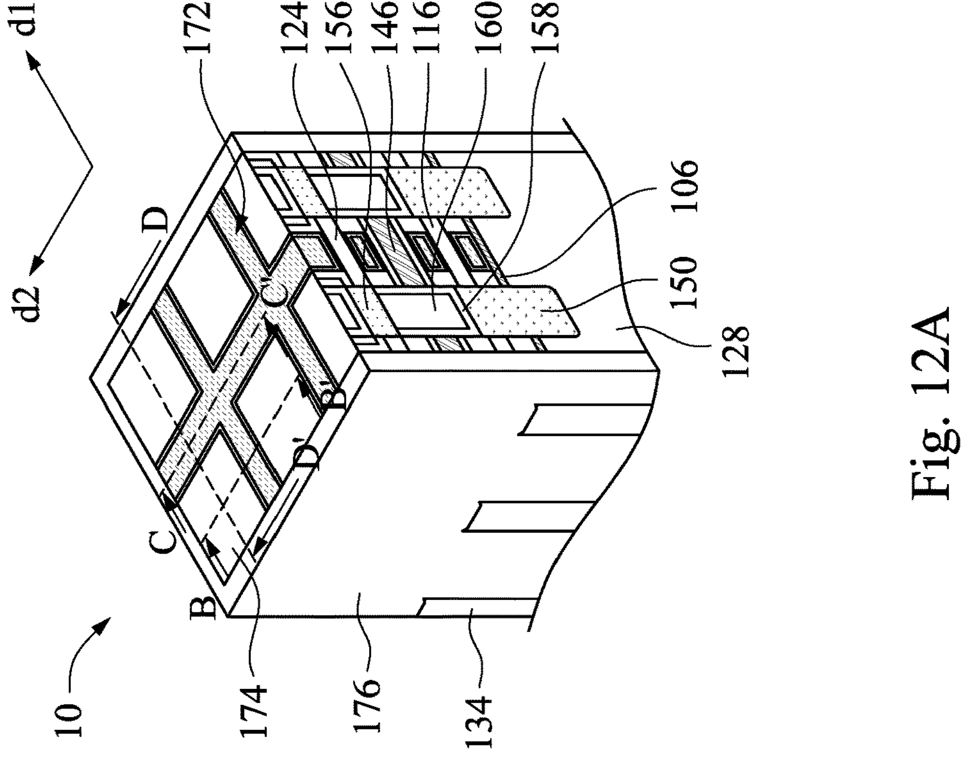
Figure 12D:
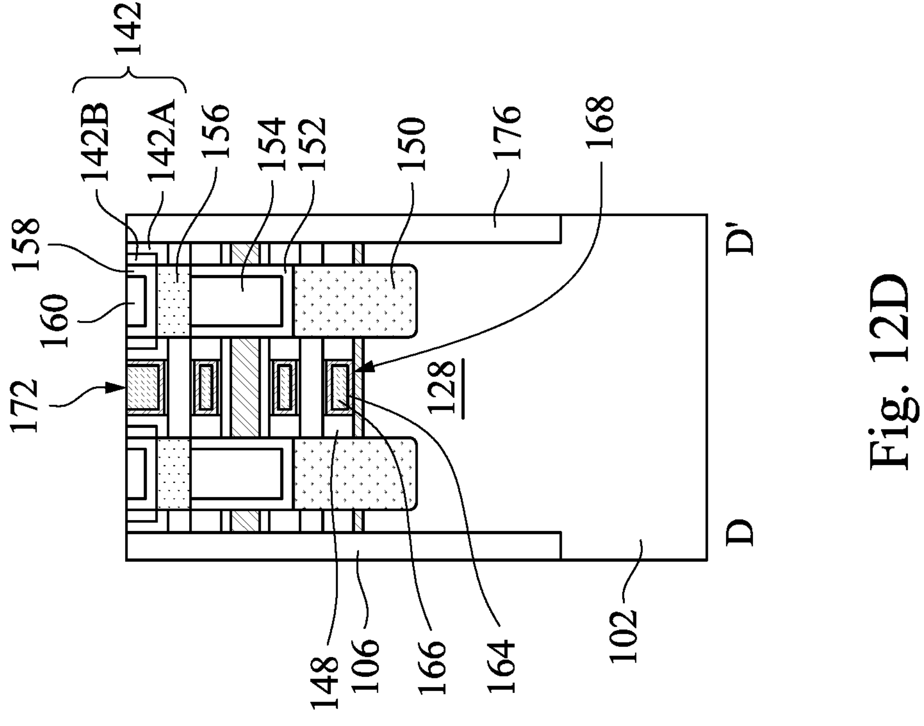
Figure 12C:
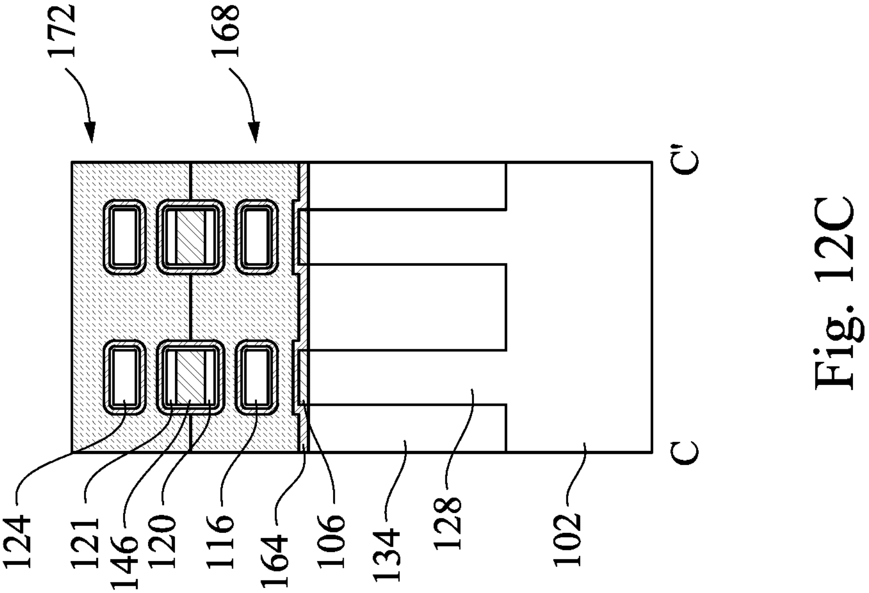
Figure 13B:
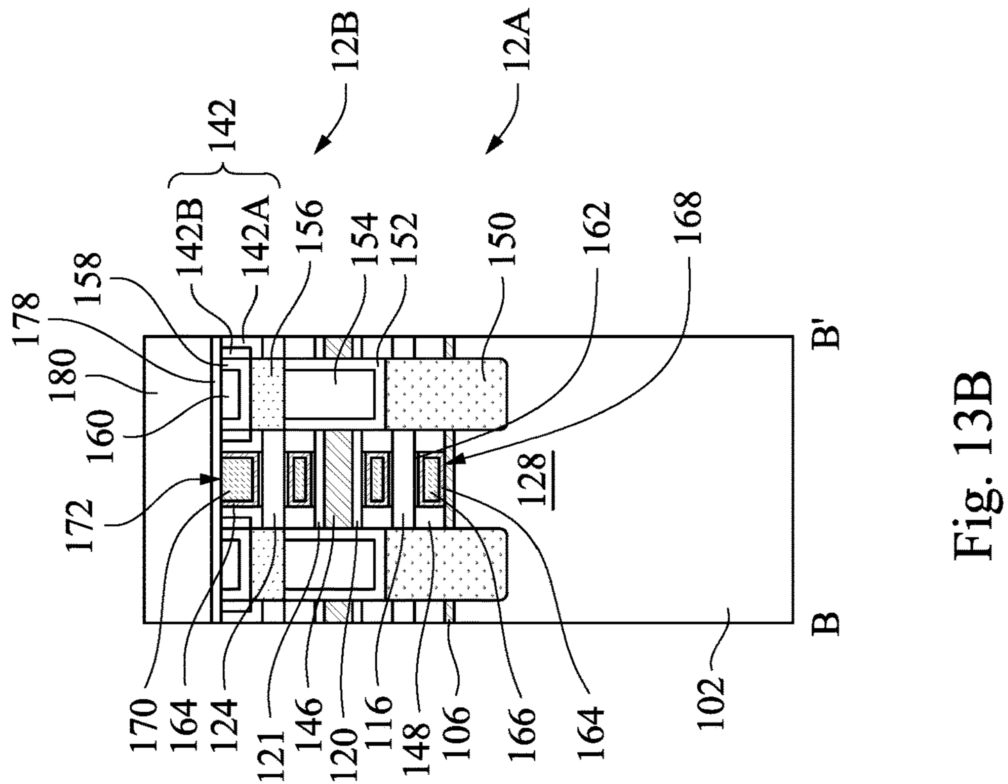
FIGS. 13B, 14B, 15B, 16B, 17B, 18B, 19B and 20B are cross-sectional views along line B-B' of FIGS. 13A, 14A, 15A, 16A, 17A, 18A, 19A and 20A, respectively.
Figure 13A:
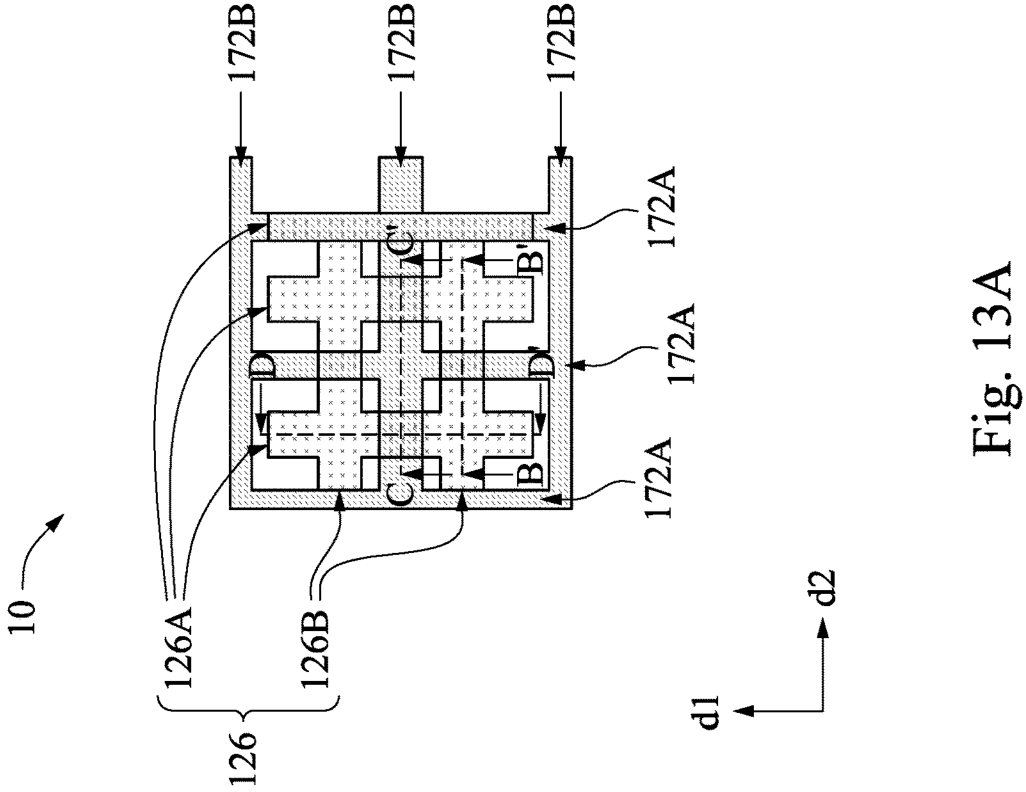
FIGS. 13A, 14A, 15A, 16A, 17A, 18A, 19A and 20A are top views of manufacturing the IC structure in accordance with some embodiments.
Figure 13D:
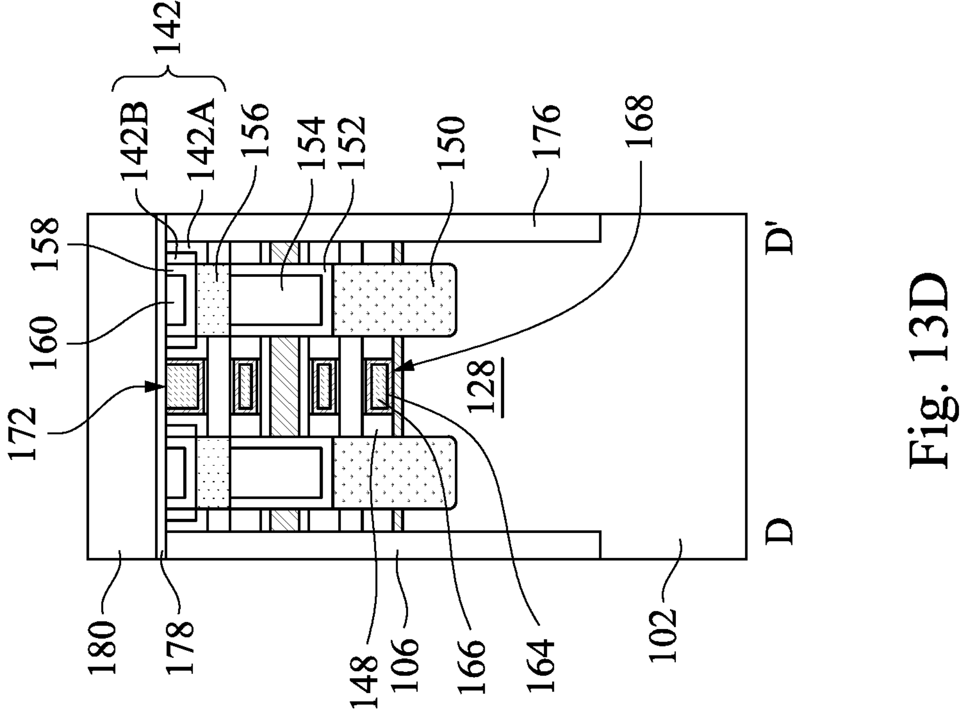
FIGS. 13D, 14D, 15D, 16D, 17D, 18D, 19D and 20D are cross-sectional views along line D-D' of FIGS. 13A, 14A, 15A, 16A, 17A, 18A, 19A and 20A, respectively.
Figure 13C:
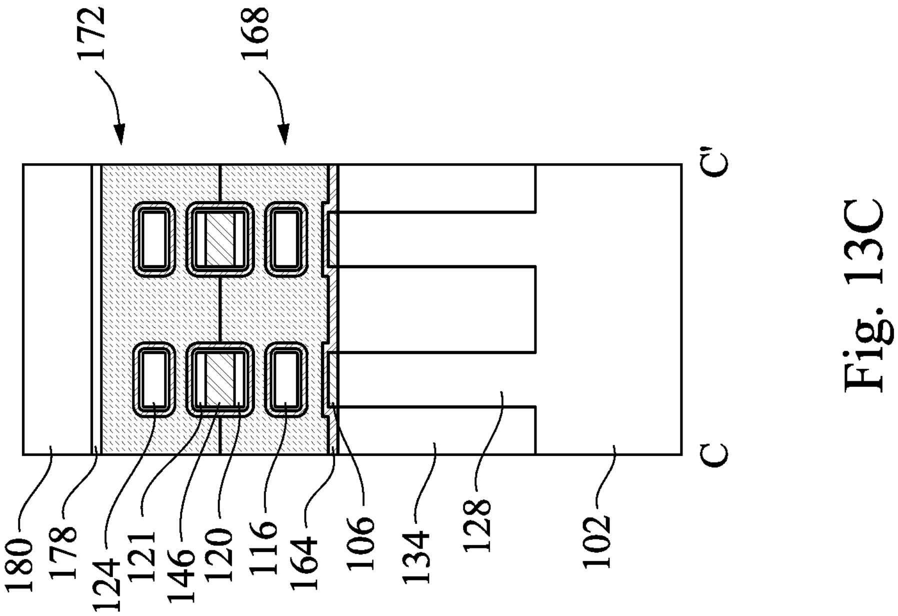
FIGS. 13C, 14C, 15C, 16C, 17C, 18C, 19C and 20C are cross-sectional views along line C-C' of FIGS. 13A, 14A, 15A, 16A, 17A, 18A, 19A and 20A, respectively.
Figure 14B:
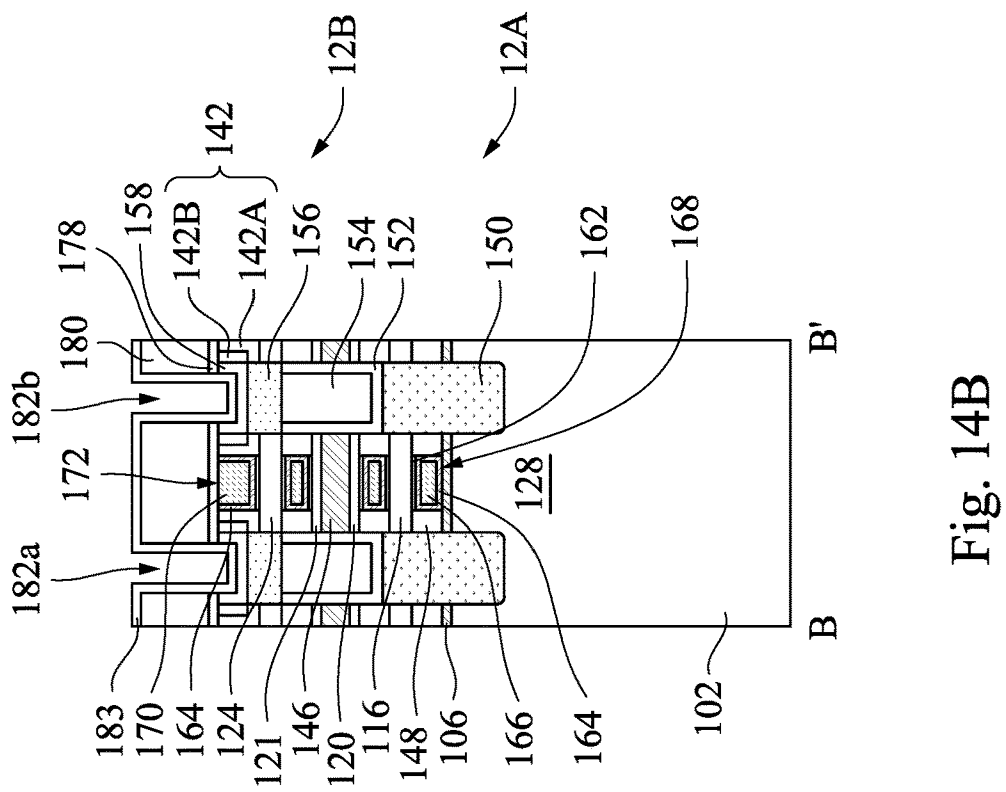
Figure 14A:
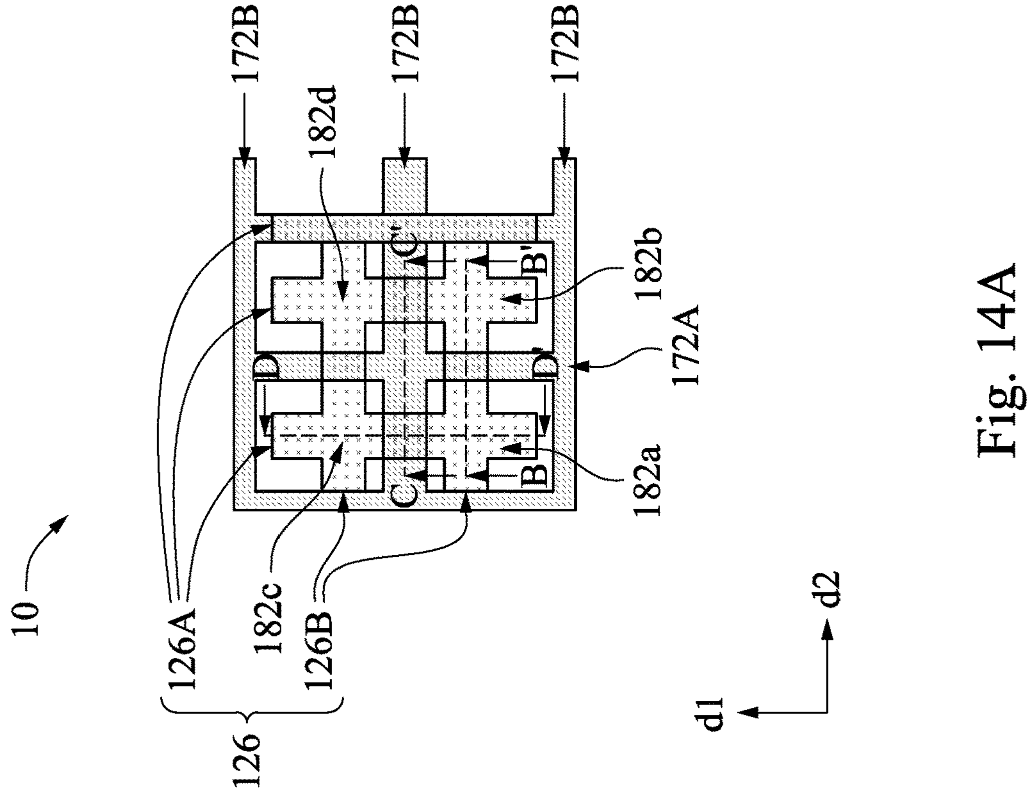
Figure 14D:
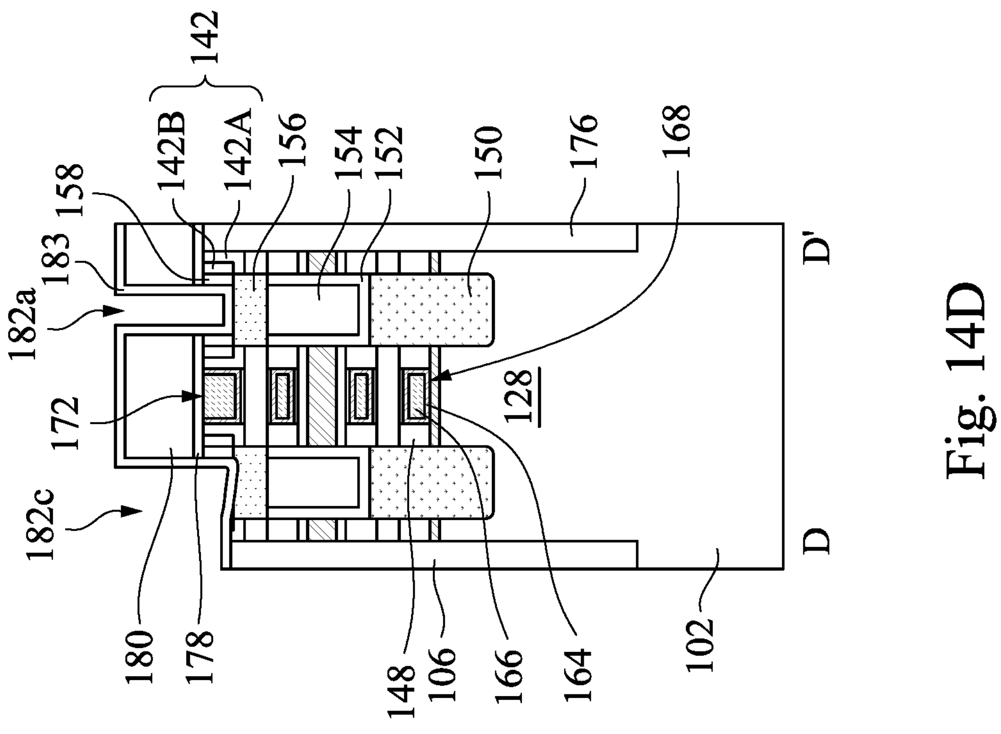
Figure 14C:
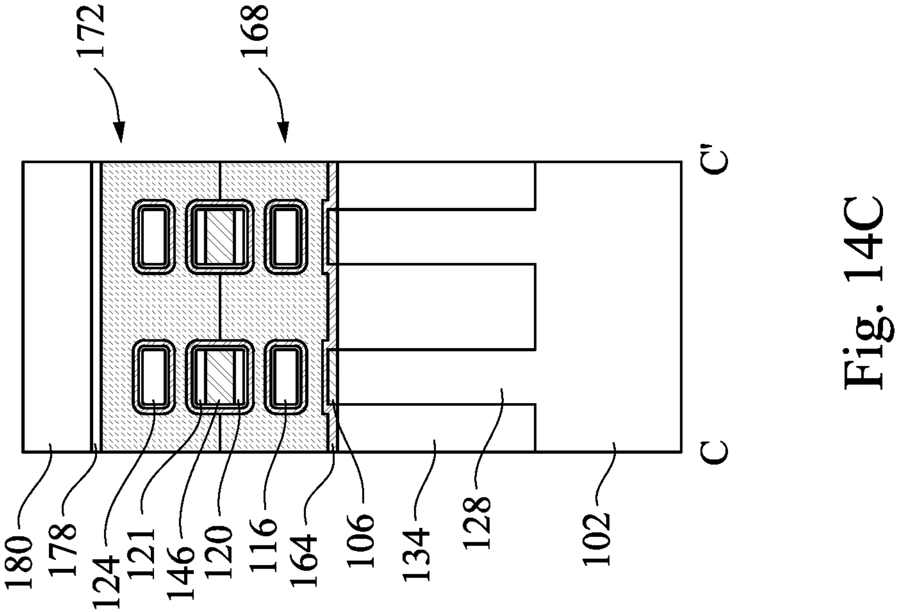
Figure 15B:
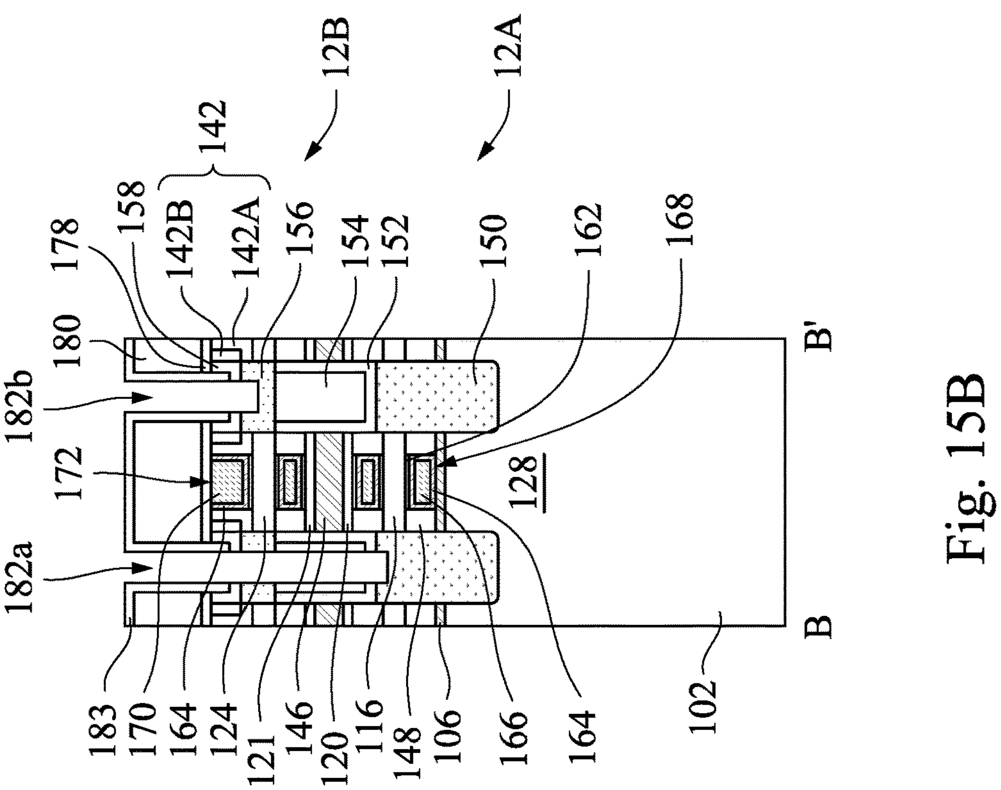
Figure 15A:
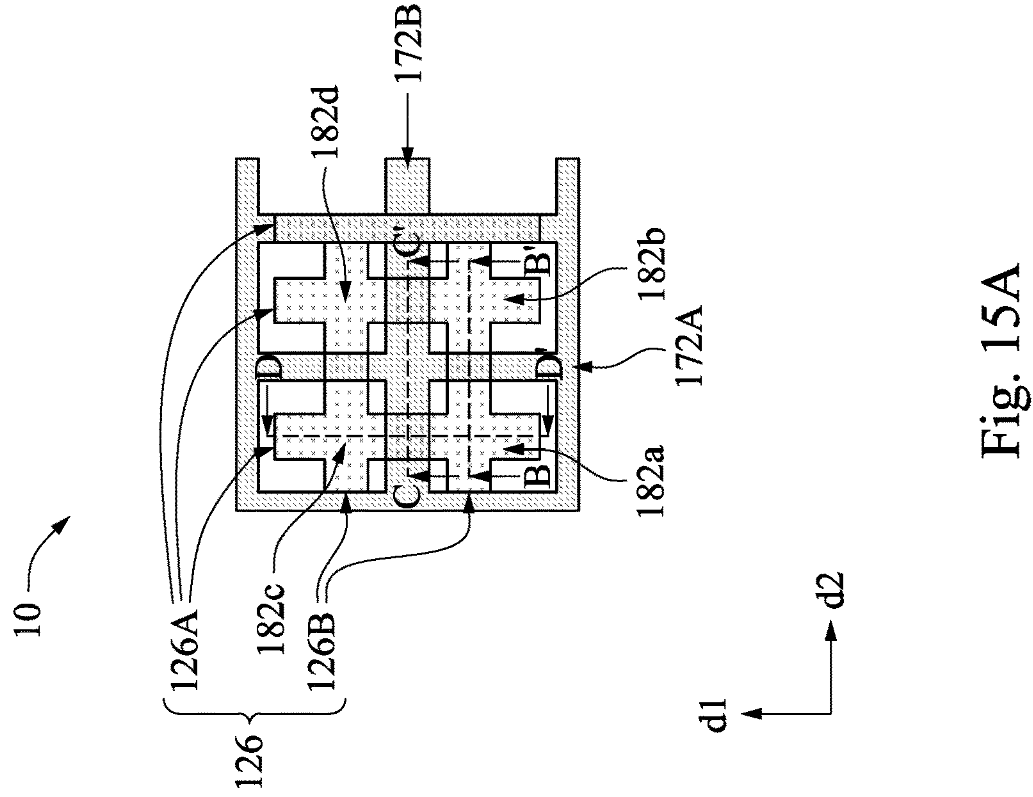
Figure 15D:
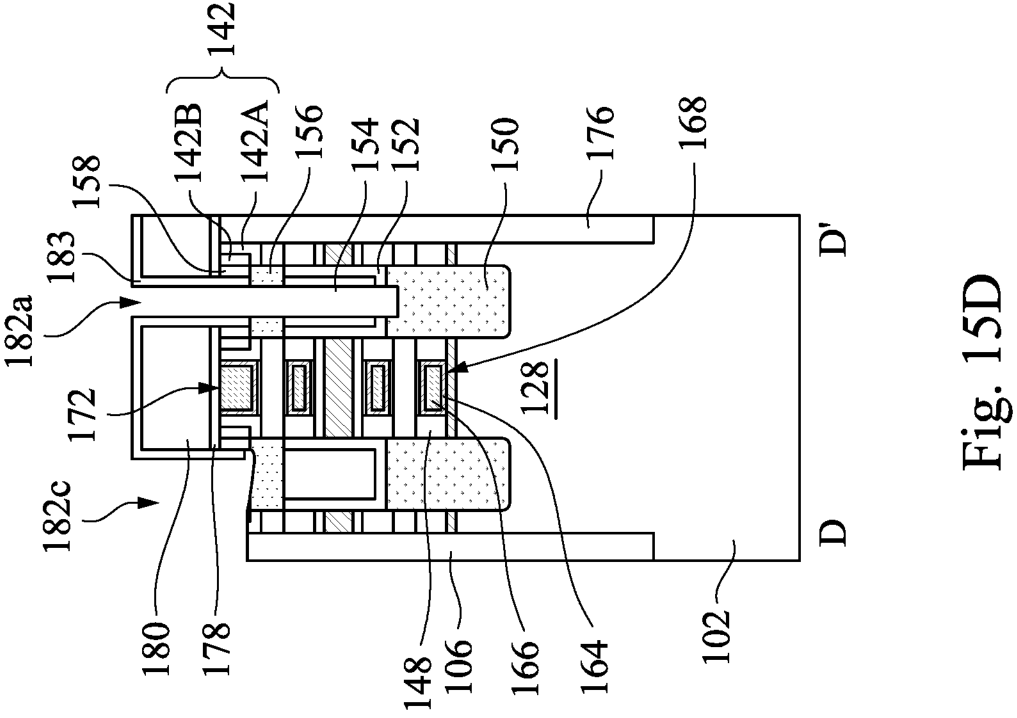
Figure 15C:
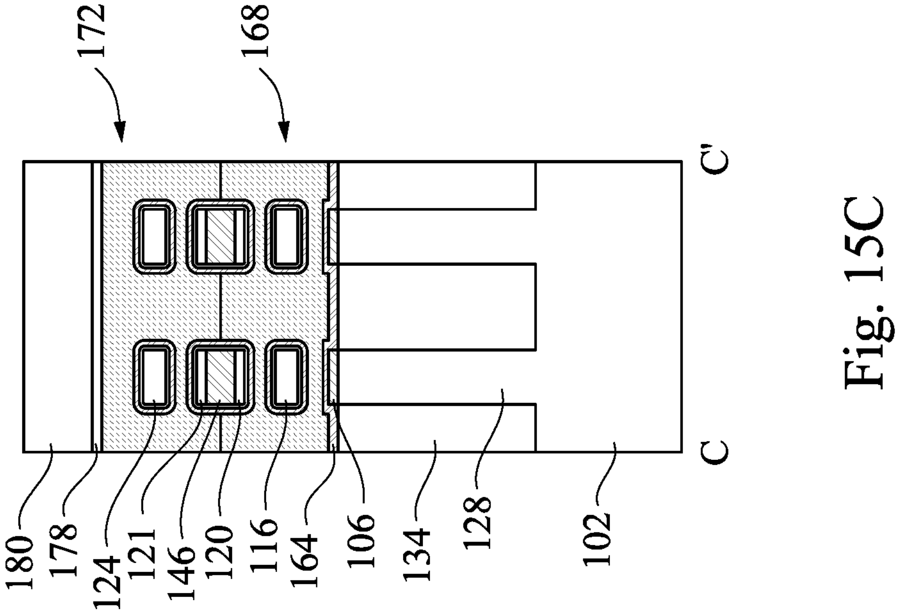
Figure 16B:
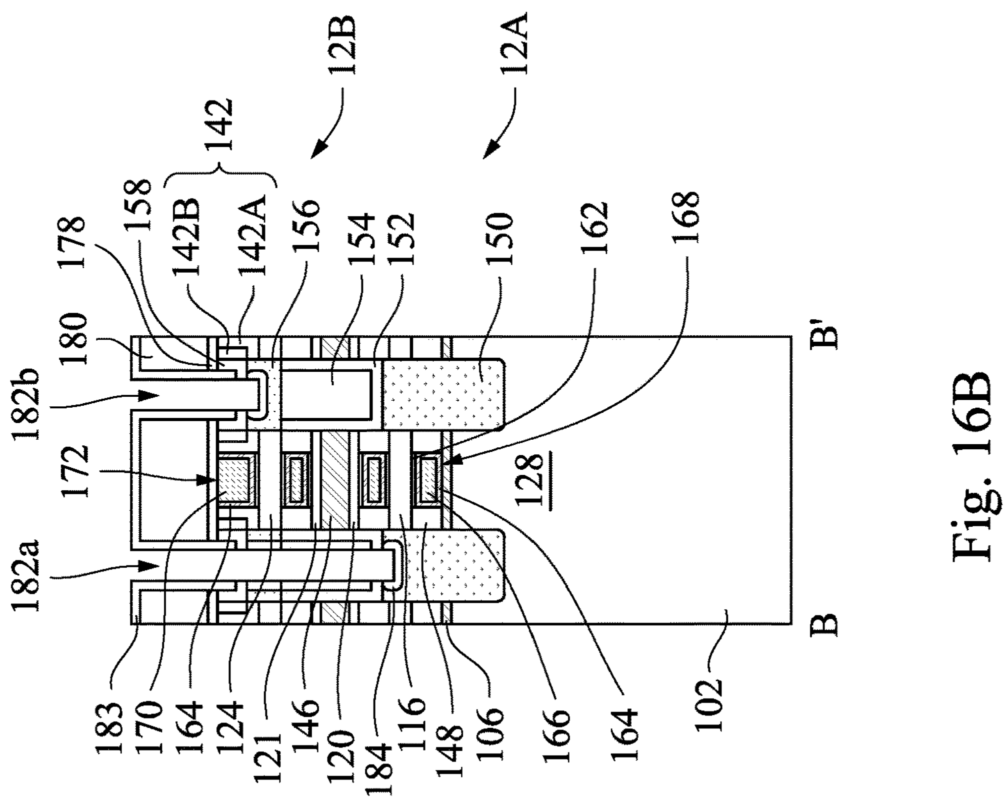
Figure 16A:
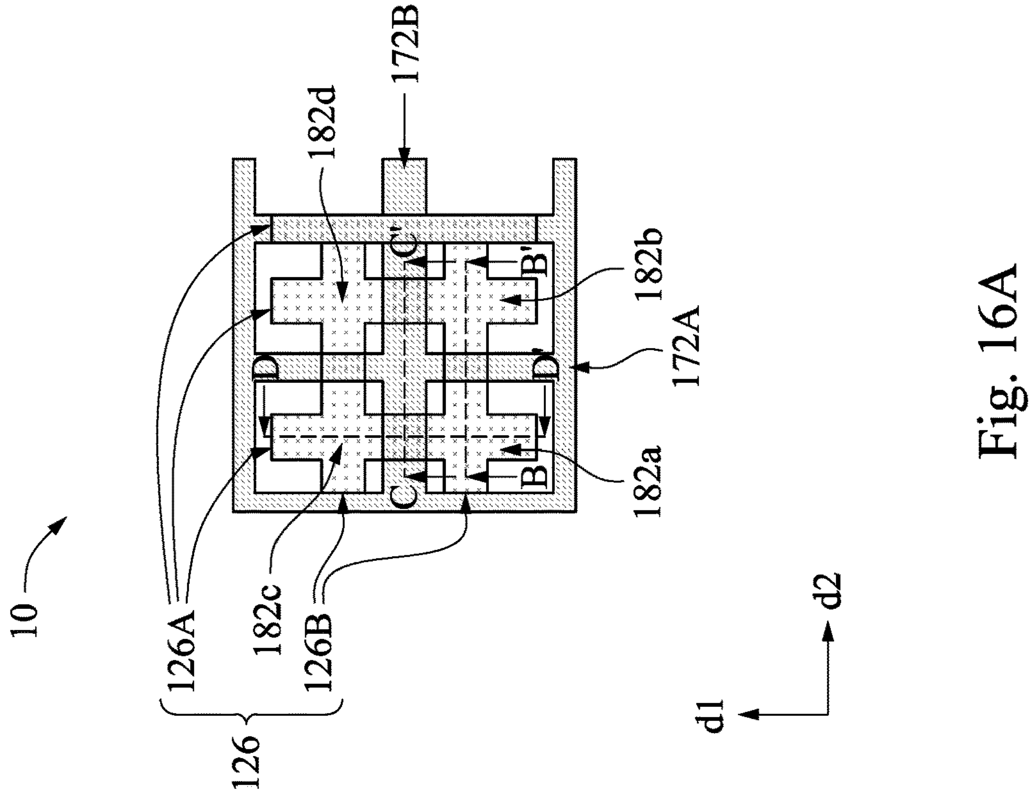
Figure 16D:
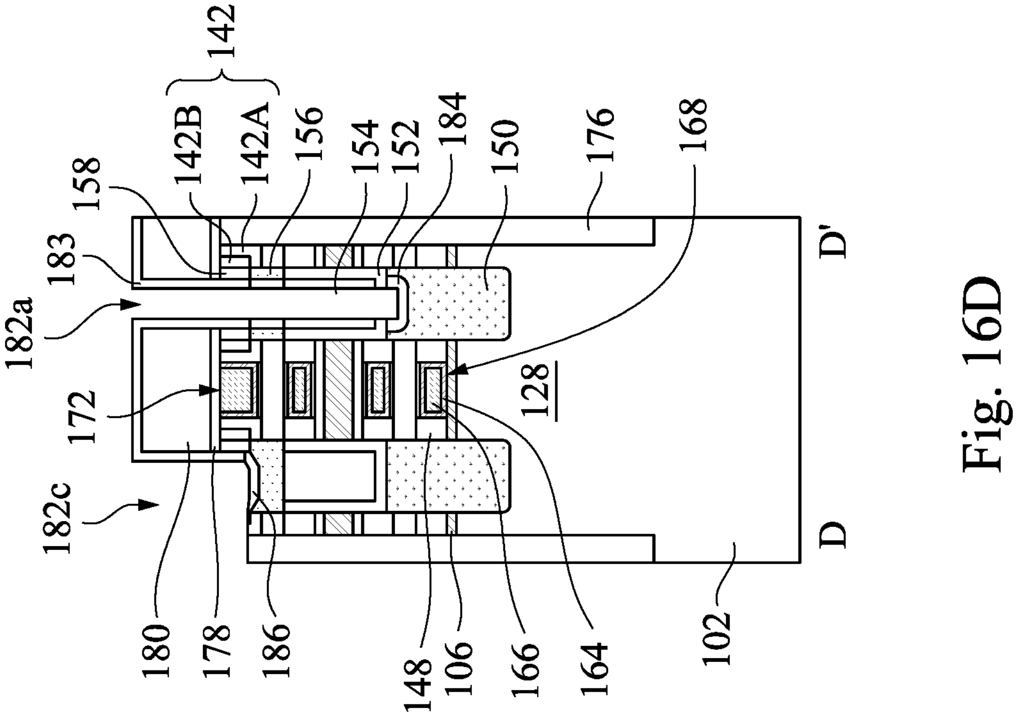
Figure 16C:
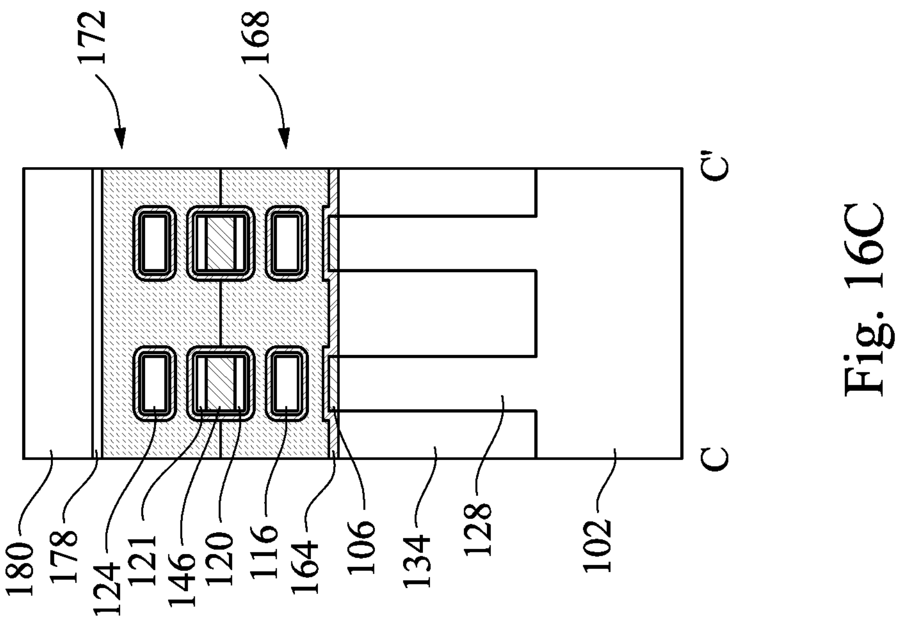
Figure 17B:
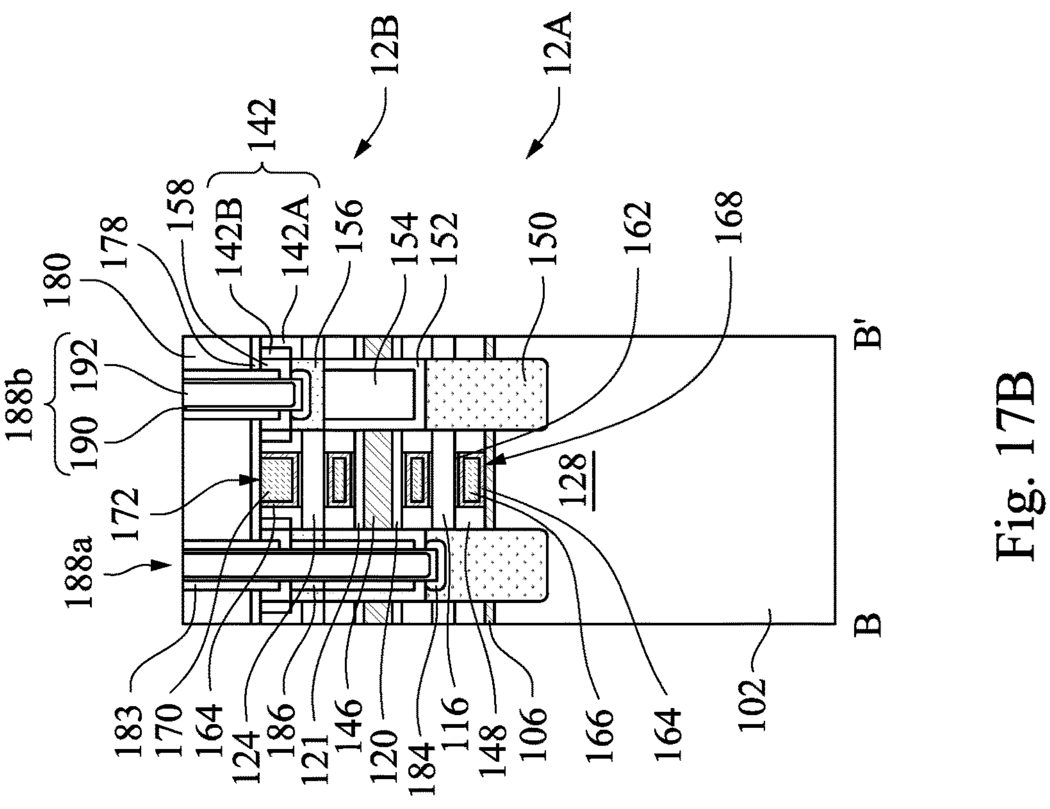
Figure 17A:
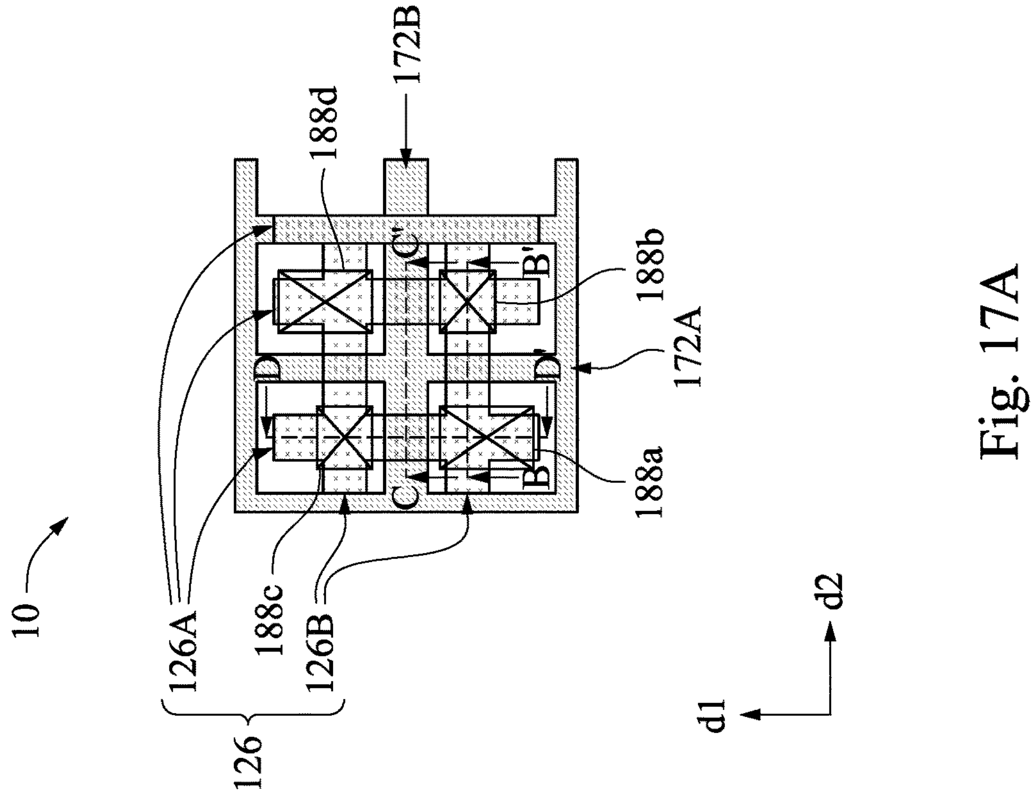
Figure 17D:
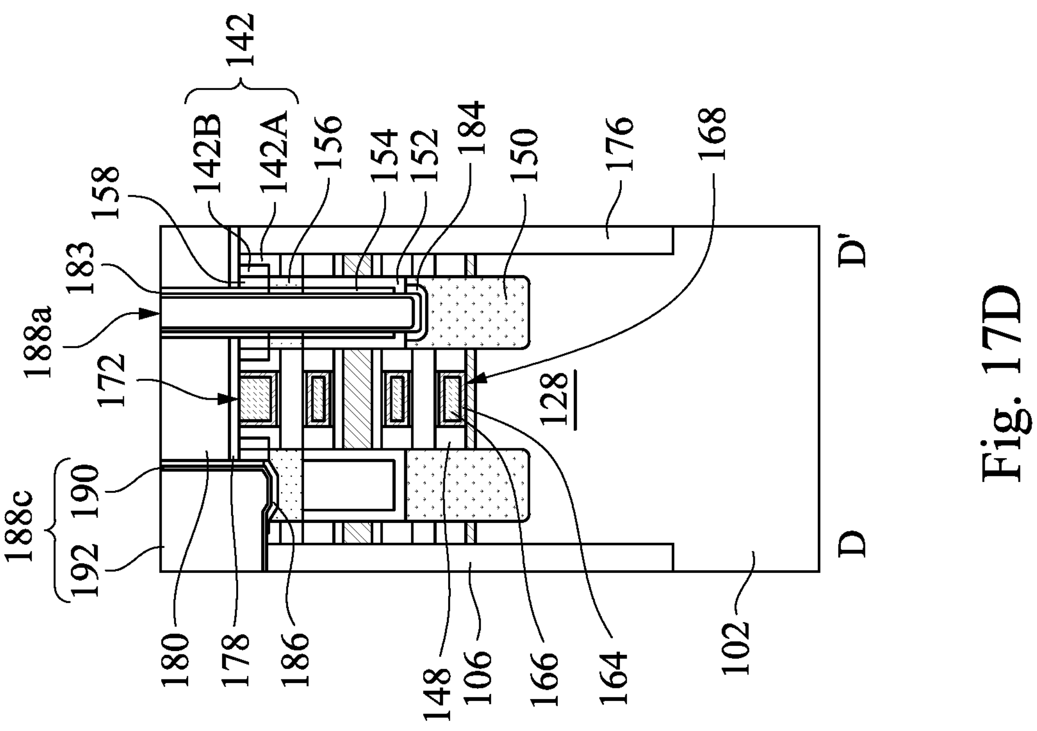
Figure 17C:
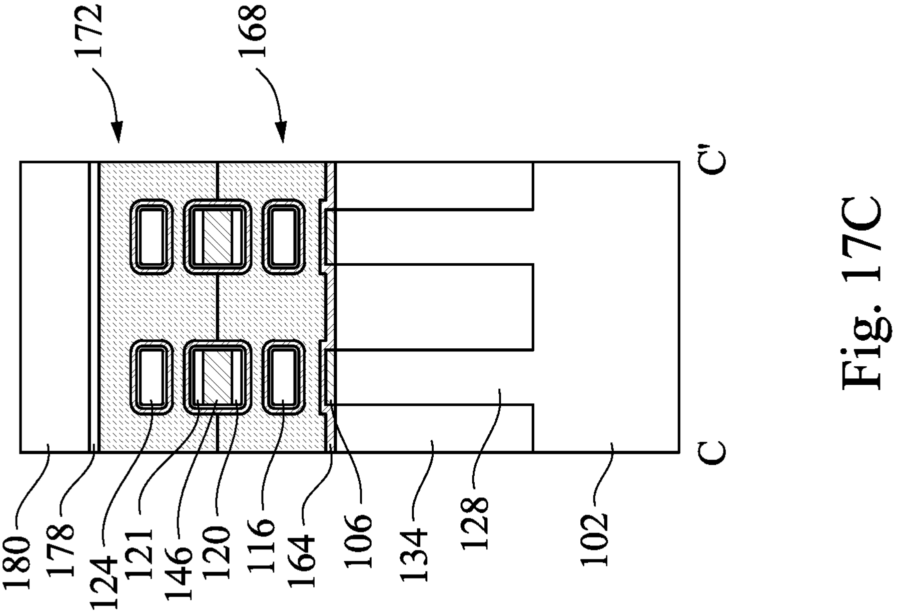
Figure 18B:
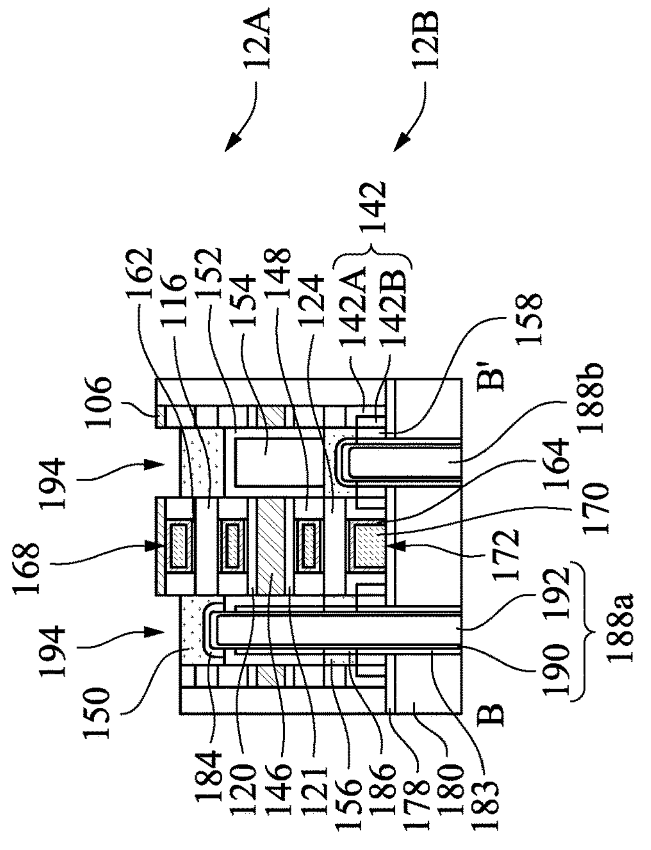
Figure 18A:
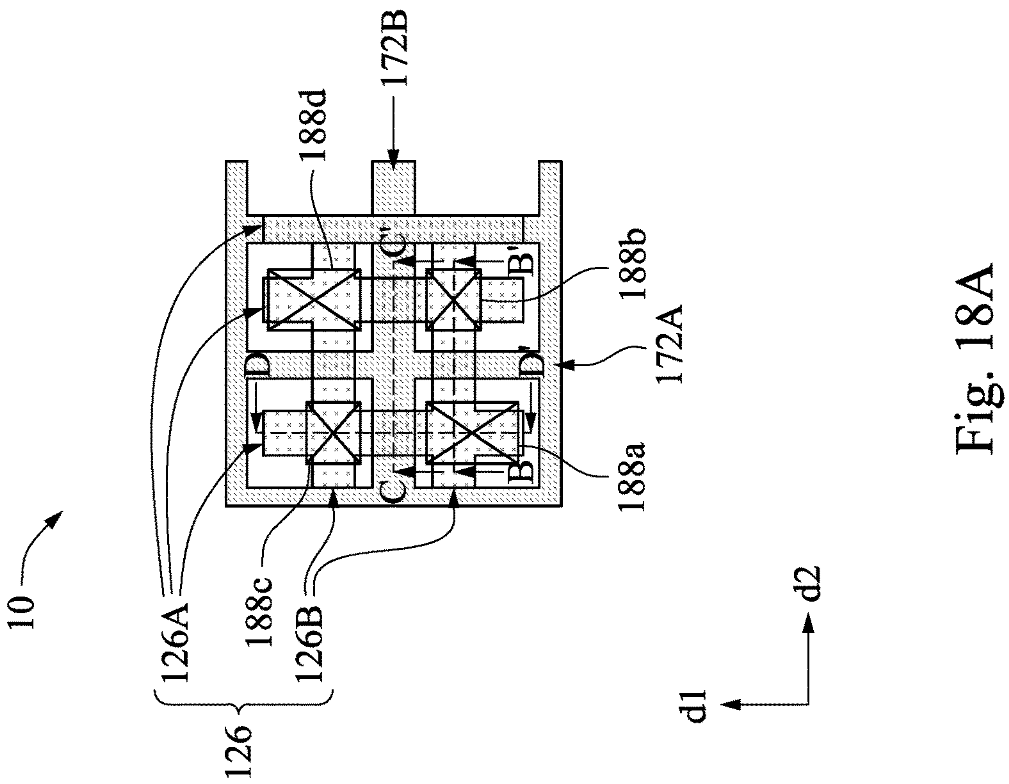
Figure 18D:
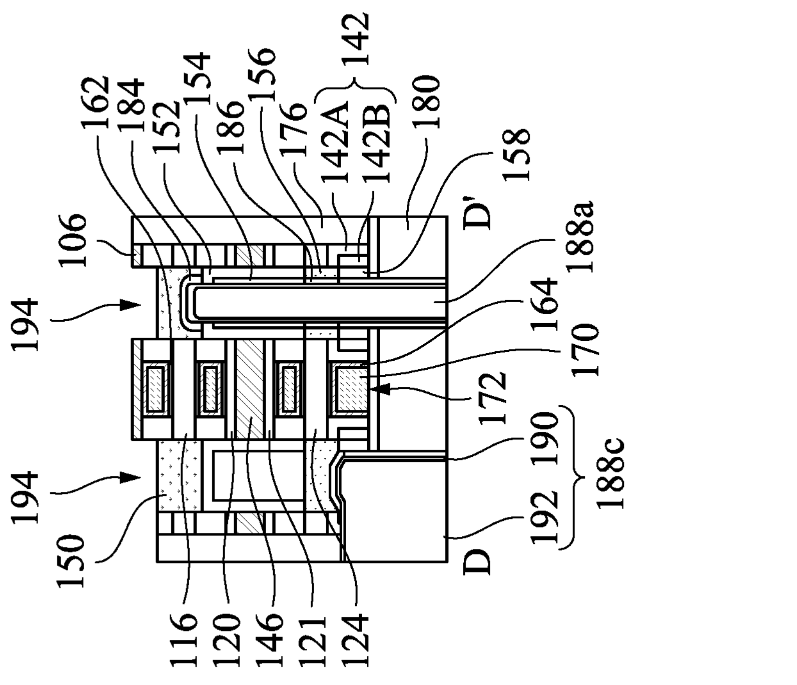
Figure 18C:
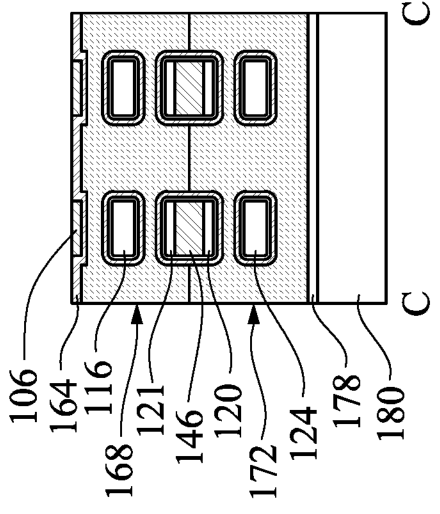
Figure 19B:
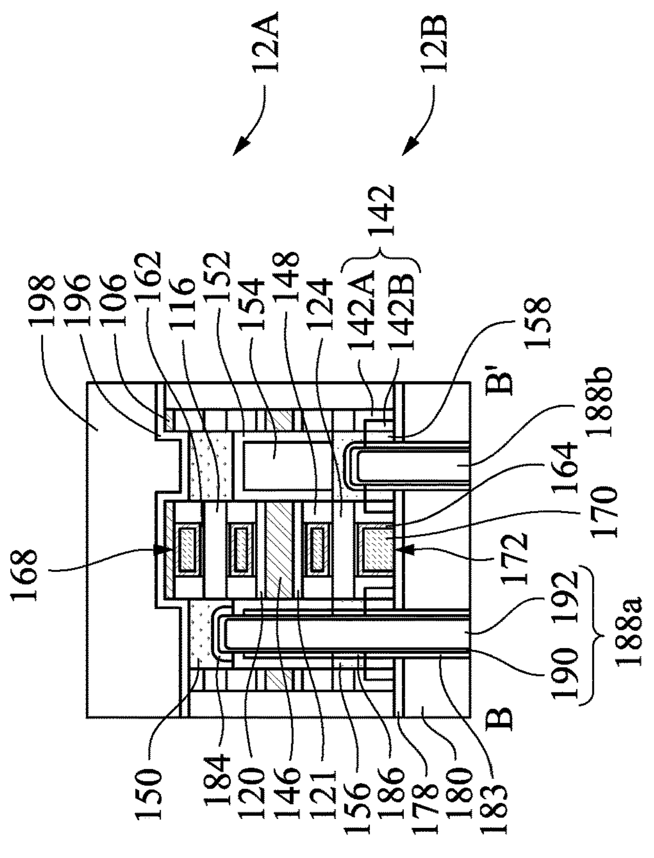
Figure 19A:
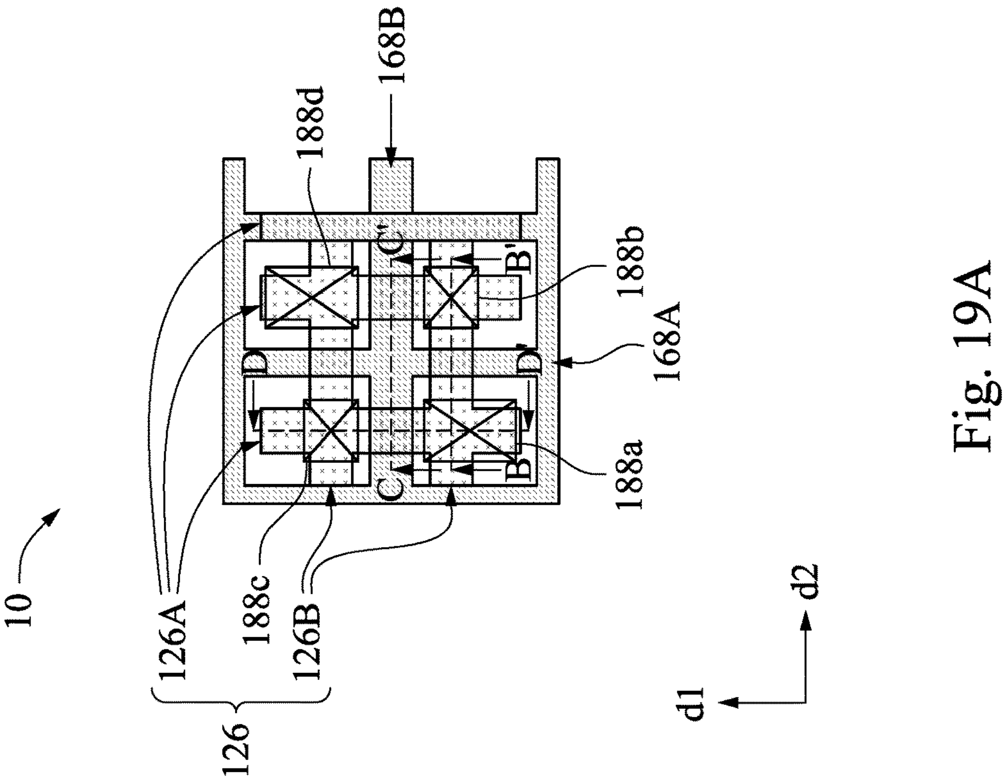
Figure 19D:
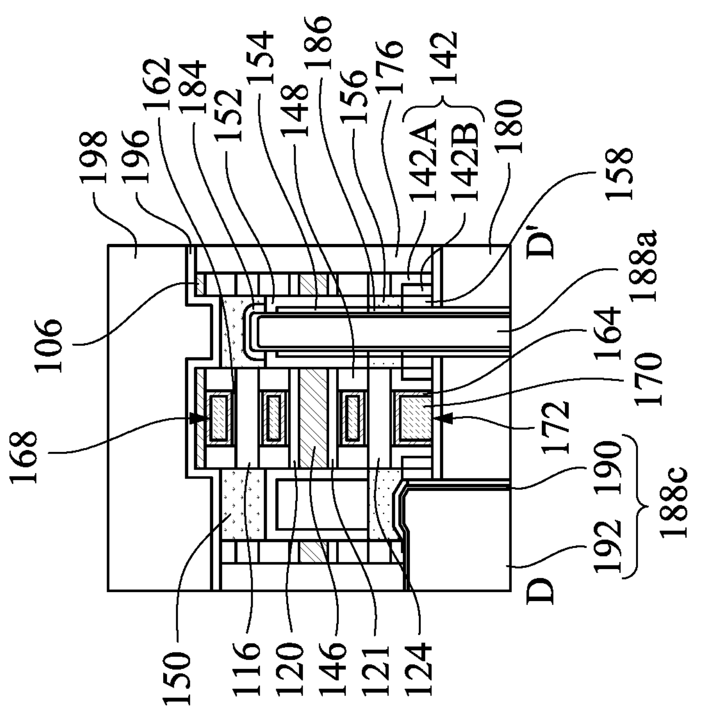
Figure 19C:
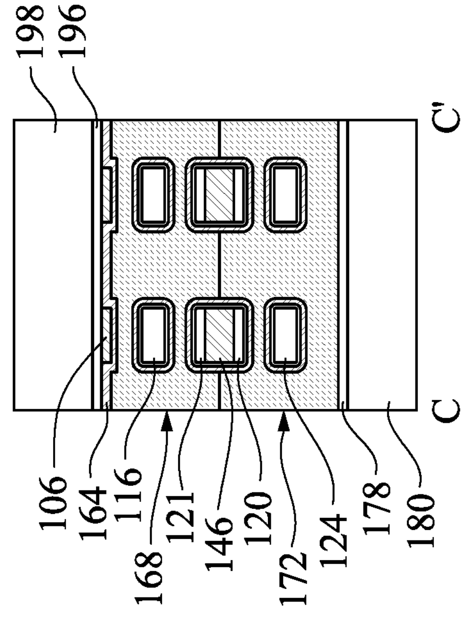
Figure 20B:
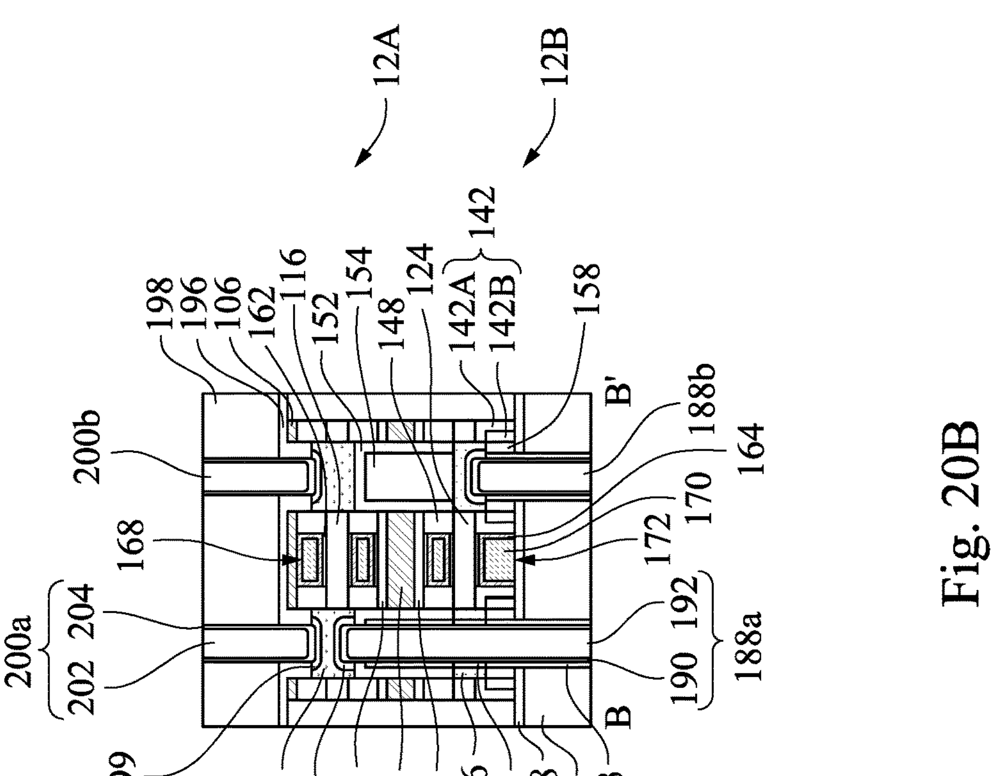
Figure 20A:
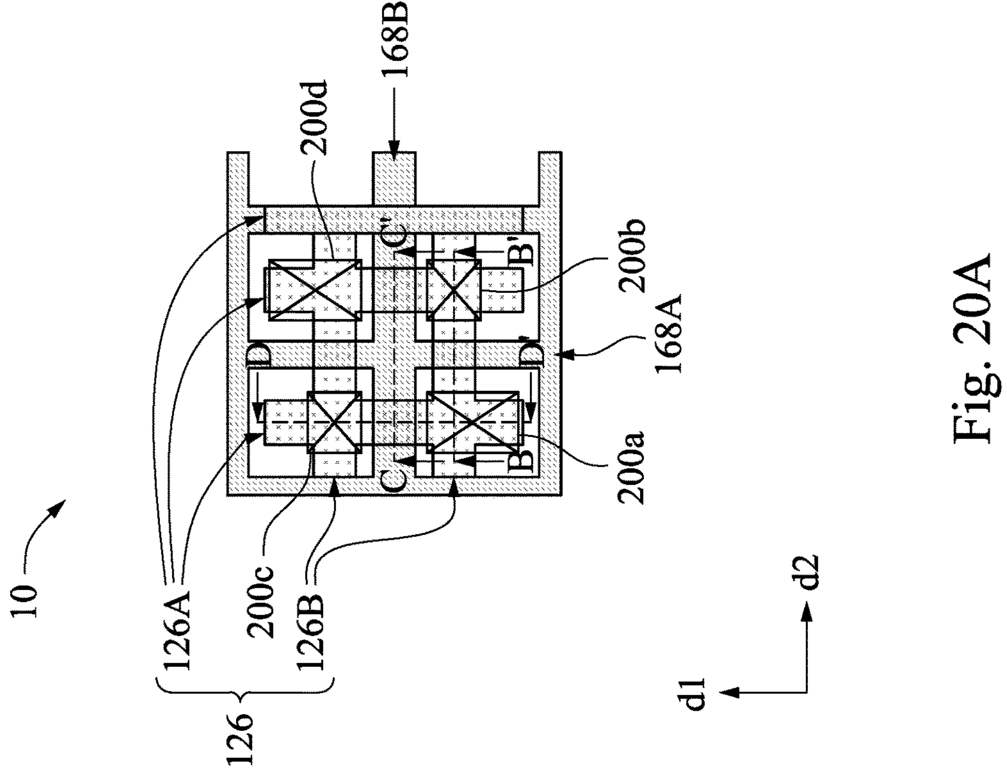
Figure 20D:
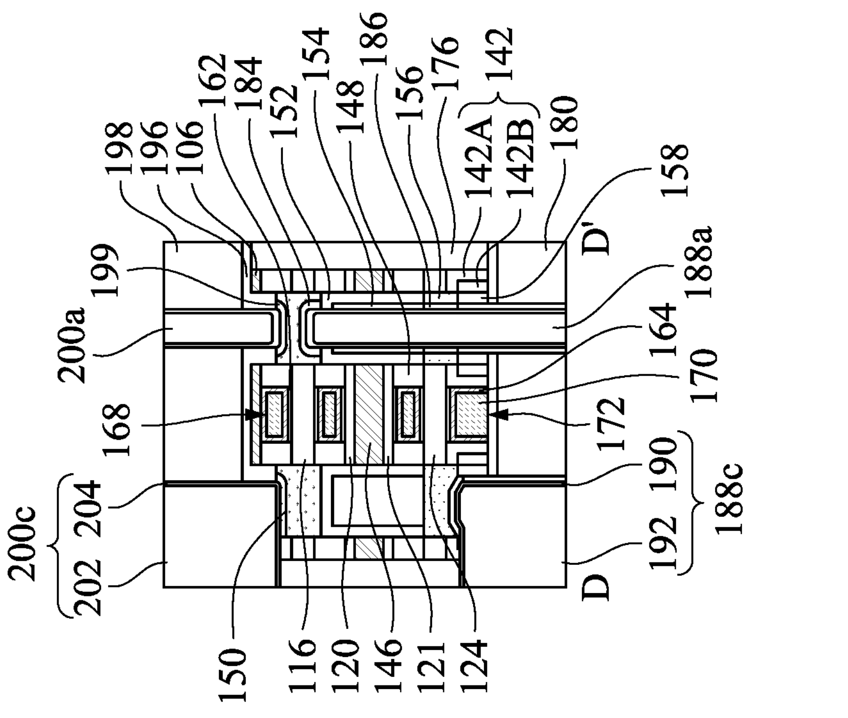
Figure 20C:
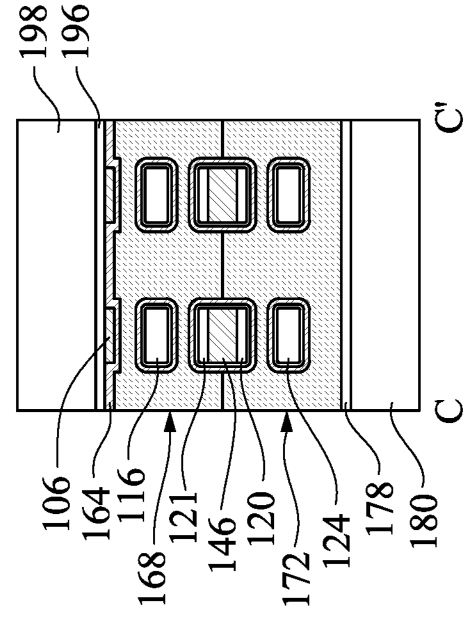
Figure 21A:
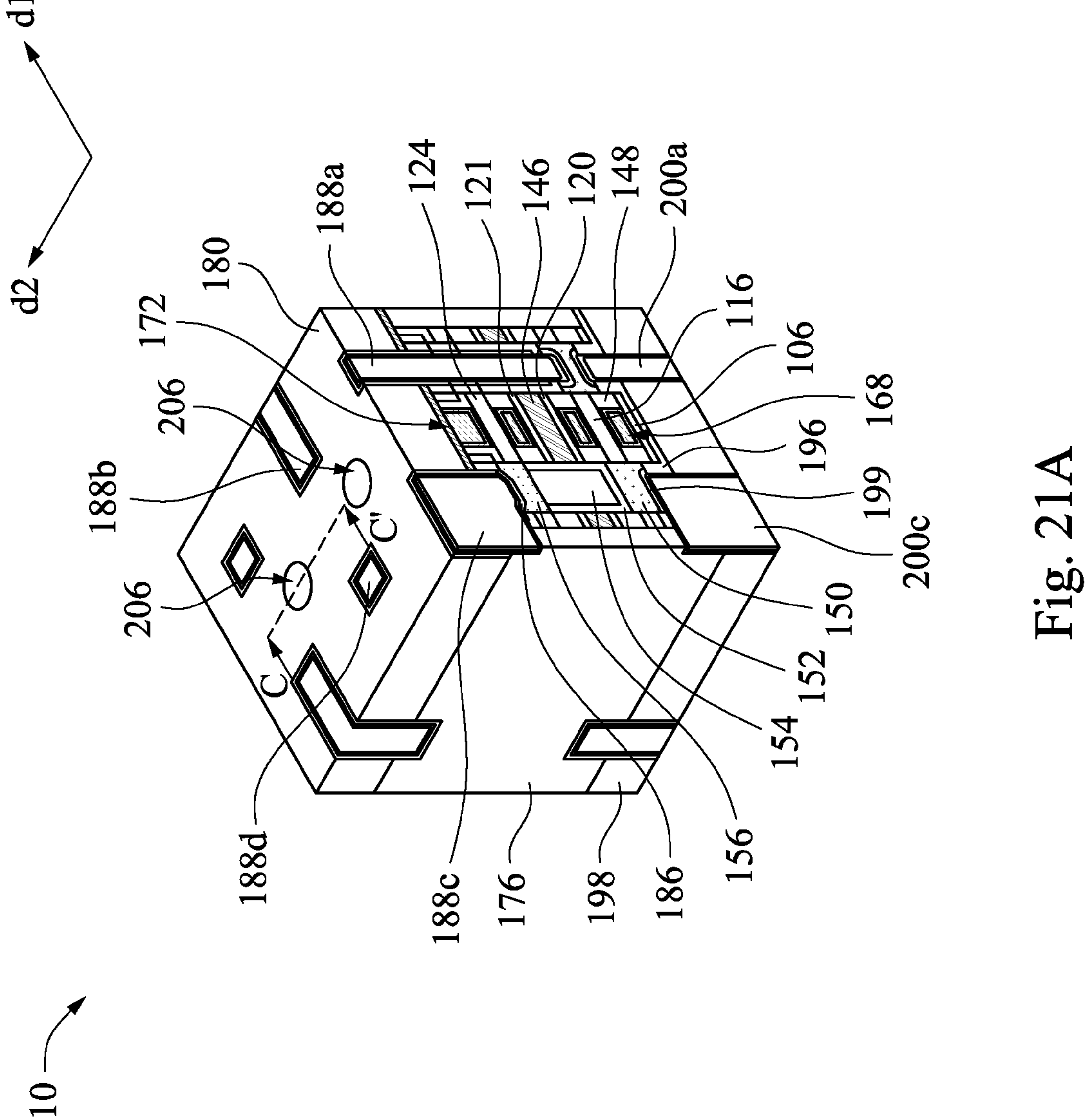
Figure 21B:
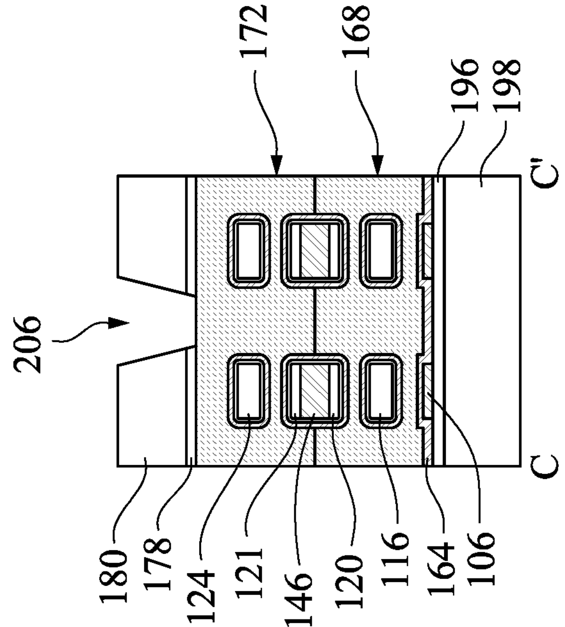
FIG. 21B is a cross-sectional view along line C-C' of FIG. 21A.
Figure 22A:
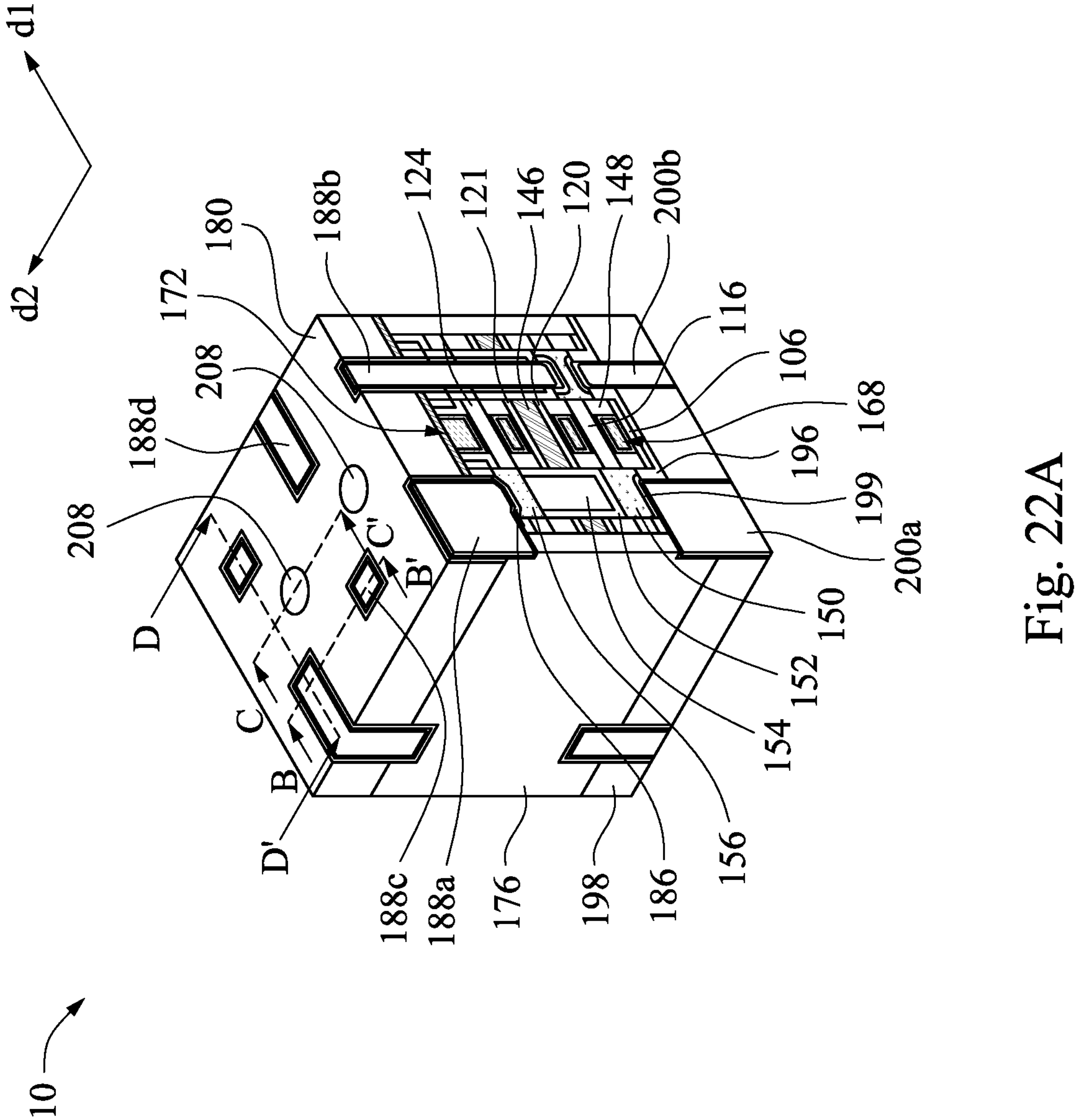
Figure 22B:
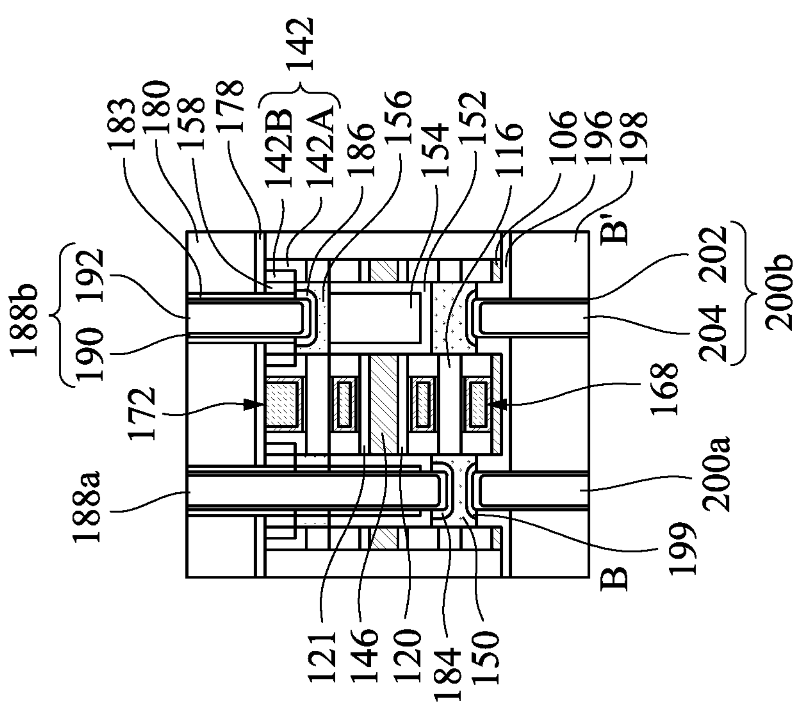
FIG. 22B is a cross-sectional view along line B-B' of FIG. 22A.
Figure 22D:
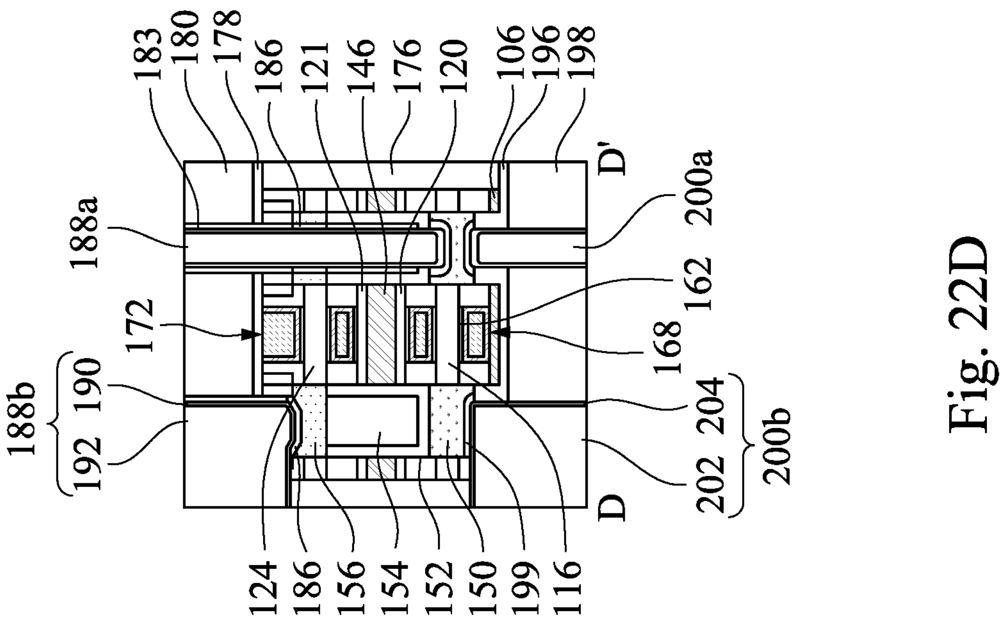
FIG. 22D is a cross-sectional view along line D-D' of FIG. 22A.
Figure 22C:
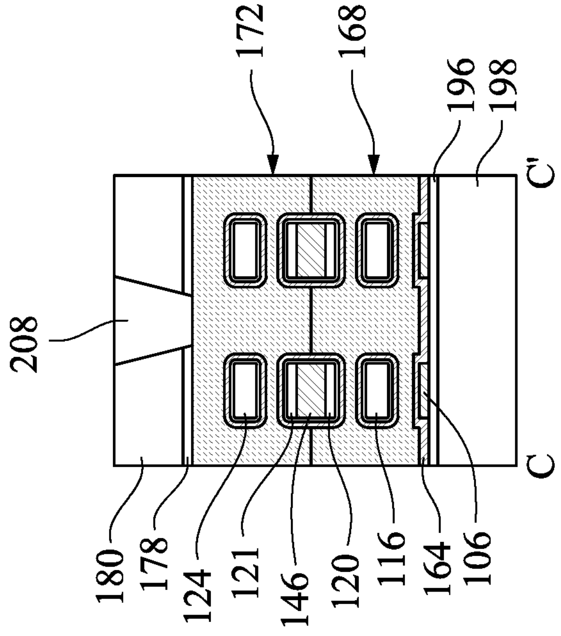
FIG. 22C is a cross-sectional view along line C-C' of FIG. 22A.

FIGS. 1, 2A, 3A and 4A are perspective views of manufacturing the IC structure 10 in accordance with some embodiments. FIG. 2B is a top view of FIG. 2A. FIGS. 3B and 4B are cross-sectional views along line B-B' of FIGS. 3A and 4A, respectively. FIGS. 3C and 4C are cross-sectional views along line C-C' of FIGS. 3A and 4A, respectively. FIGS. 3D and 4D are cross-sectional views along line D-D' of FIGS. 3A and 4A, respectively. FIG. 4E is a top view of FIG. 4A. FIGS. 5A, 6A, 7A and 8A are top views of manufacturing the IC structure 10 in accordance with some embodiments. FIGS. 5B, 6B, 7B and 8B are cross-sectional views along line B-B' of FIGS. 5A, 6A, 7A and 8A, respectively. FIGS. 5C, 6C, 7C and 8C are cross-sectional views along line C-C' of FIGS. 5A, 6A, 7A and 8A, respectively. FIGS. 5D, 6D, 7D and 8D are cross-sectional views along line D-D' of FIGS. 5A, 6A, 7A, and 8A respectively. FIG. 9A is a perspective view of manufacturing the IC structure 10 in accordance with some embodiments. FIG. 9B is a cross-sectional view along line B-B' of FIG. 9A. FIG. 9C is a cross-sectional view along line C-C' of FIG. 9A. FIG. 9D is a cross-sectional view along line D-D' of FIG. 9A. FIG. 10A is a top view of manufacturing the IC structure 10 in accordance with some embodiments. FIG. 10B is a cross-sectional view along line B-B' of FIG. 10A. FIG. 10C is a cross-sectional view along line C-C' of FIG. 10A. FIG. 10D is a cross-sectional view along line D-D' of FIG. 10A. FIGS. 11A and 12A are perspective views of manufacturing the IC structure 10 in accordance with some embodiments. FIGS. 11B and 12B are cross-sectional views along line B-B' of FIGS. 11A and 12A, respectively. FIGS. 11C and 12C are cross-sectional views along line C-C' of FIGS. 11A and 12A, respectively. FIGS. 11D and 12D are cross-sectional views along line D-D' of FIGS. 11A and 12A, respectively. FIGS. 13A, 14A, 15A, 16A, 17A. 18A, 19A and 20A are top views of manufacturing the IC structure 10 in accordance with some embodiments. FIGS. 13B, 14B, 15B, 16B, 17B, 18B, 19B and 20B are cross-sectional views along line B-B' of FIGS. 13A, 14A, 15A, 16A, 17A, 18A, 19A and 20A, respectively. FIGS. 13C, 14C, 15C, 16C, 17C, 18C, 19C and 20C are cross-sectional views along line C-C' of FIGS. 13A, 14A, 15A, 16A, 17A, 18A, 19A and 20A, respectively. FIGS. 13D, 14D, 15D, 16D, 17D, 18D, 19D and 20D are cross-sectional views along line D-D' of FIGS. 13A, 14A, 15A, 16A, 17A, 18A, 19A and 20A, respectively. FIGS. 21A, 22A and 23A are perspective views of manufacturing the IC structure 10 in accordance with some embodiments. FIG. 21B is a cross-sectional view along line C-C' of FIG. 21A. FIG. 22B is a cross-sectional view along line B-B' of FIG. 22A. FIG. 22C is a cross-sectional view along line C-C' of FIG. 22A. FIG. 22D is a cross-sectional view along line D-D' of FIG. 22A. FIG. 23B is a cross-sectional view along line B-B' of FIG. 23A. FIG. 23C is a cross-sectional view along line C-C' of FIG. 23A.

Reference is made to FIG. 1. A substrate 102 is provided. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 102 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A stack 104 is formed on the substrate 102. The stack 104 includes an etch stop layer 106, a first multilayer stack 108, a middle multilayer stack 110 and a second multilayer stack 112 formed on the substrate 102 in sequence. The etch stop layer 106 is formed on the substrate 102 and has an etch selectivity to the substrate 102. In some embodiments, the etch stop layer 106 includes a high-k dielectric material, and in these embodiments, the etch stop layer 106 may have a dielectric constant greater than about 7.0, and may include a metal oxide or a silicate of Hf, Al, Zr, La, Mg, Ba, Ti, or Pb, or combinations thereof. The formation methods of the etch stop layer 106 may include chemical vapor deposition (CVD), physical vapor deposition (PVD), atomic layer deposition (ALD), or the like.

The first multilayer stack 108 includes first sacrificial layers 114 and a first semiconductor layer 116 alternately deposited over the substrate 102. In some embodiments, the first sacrificial layers 114 may be made of a semiconductor material, and thus can also be referred to as semiconductor layers. The number of the first sacrificial layers 114 and the first semiconductor layer 116 illustrated in FIG. 1 is merely a non-limiting example. Other numbers of layers are also possible and are fully intended to be included within the scope of the present disclosure.

In some embodiments, the first sacrificial layers 114 include silicon germanium. In some embodiments, the first sacrificial layers 114 include $Si_{1-x}Ge_x$, where x can be in a range of 0.1 to 0.3. The first semiconductor layer 116 includes an epitaxial material. The first multilayer stack 108 (may also be referred to as an epitaxial material stack) will be patterned to form channel regions of a p-type sheet field effect transistor (PSFET) in subsequent processing. In particular, the first multilayer stack 108 will be patterned to form horizontal nanosheets, with the channel regions of the resulting PSFET including multiple horizontal nanosheets.

The first multilayer stack 108 may be formed by an epitaxial growth process, which may be performed in a growth chamber. During the epitaxial growth process, the growth chamber is cyclically exposed to a first set of precursors for selectively growing the first sacrificial layers 114, and then exposed to a second set of precursors for selectively growing the first semiconductor layer 116, in some embodiments. The first set of precursors includes precursors for the first sacrificial layers 114 (e.g., silicon germanium), and the second set of precursors includes precursors for the first semiconductor layer 116. In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing the first sacrificial layers 114; and (2) disabling the flow of the germanium precursor to the growth chamber when growing the first semiconductor layer 116. The cyclical exposure may be repeated until a target quantity of layers is formed.

The middle multilayer stack 110 is formed on the first multilayer stack 108. The middle multilayer stack 110 includes a SiGe layer 118 sandwiched between silicon layers 120, 121. Each of the silicon layers 120, 121 each is thinner than the first and second semiconductor layers 116, 124. The second multilayer stack 112 is formed on the middle multilayer stack 110. The second multilayer stack 112 includes a second sacrificial layer 122 and a second semiconductor layer 124 over the second sacrificial layer 122. The second sacrificial layer 122 and the second semiconductor layer 124 are similar to the first sacrificial layers 14 and the first semiconductor layer 116 in terms of composition and formation method, and thus the description thereof is omitted herein. The number of the second sacrificial layer 122 and the second semiconductor layer 124 illustrated in FIG. 1 is merely a non-limiting example. Other numbers of layers are also possible and are fully intended to be included within the scope of the present disclosure. The SiGe layer 118 has an etch selectivity to the first and second sacrificial layers 114, 122. For example, the SiGe layer 118 of the middle multilayer stack 110 has a germanium concentration higher than germanium concentrations of the second sacrificial layer 122 and the first sacrificial layers 114. In some embodiments, the SiGe layer 118 includes $Si_{1-x}Ge_x$, where x can be in a range of 0.3 to 0.6.

Figure 2A:
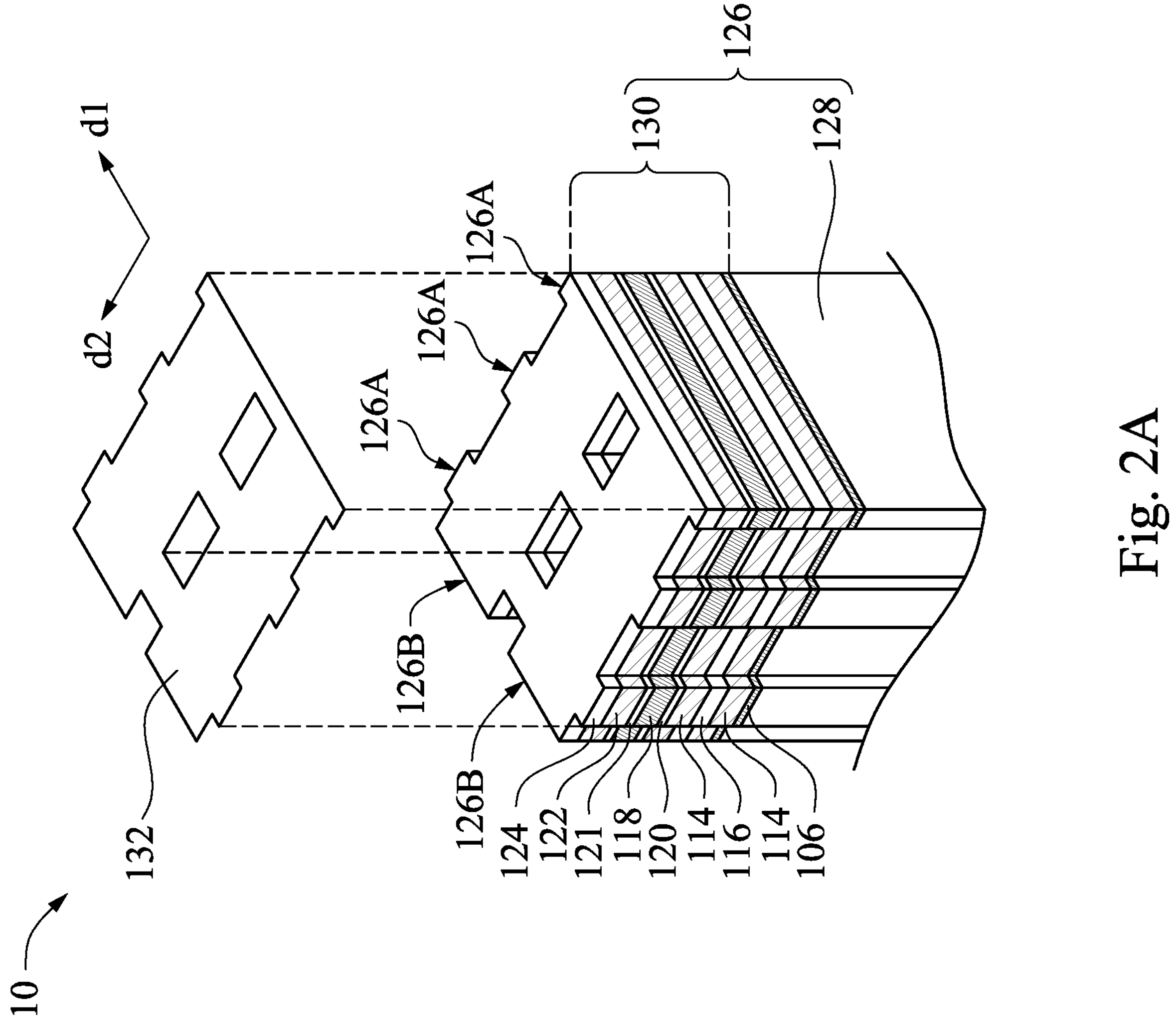
Figure 2B:
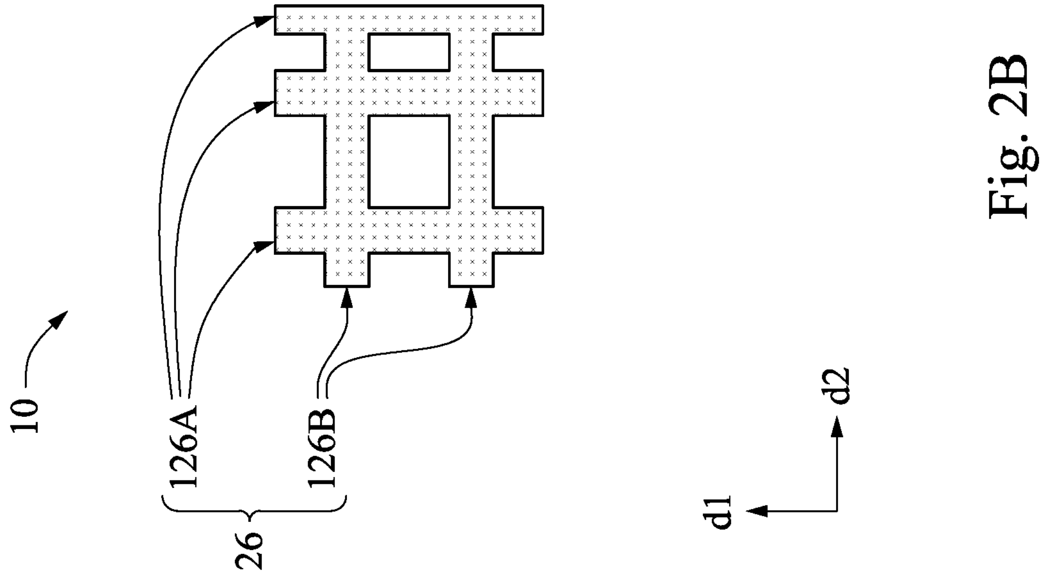
FIG. 2B is a top view of FIG. 2A.

Reference is made to FIGS. 2A-2B. Fin structure 126 is formed protruding above the substrate 102 (see FIG. 1). The fin structure 126 includes a semiconductor fin 128 and a nanostructure 130 overlying the semiconductor fin 128. The nanostructure 130 and the semiconductor fin 128 may be formed by etching trenches in the stack 104 and the substrate 102, respectively. In the illustrated embodiment, the nanostructure 130 also includes patterned alternating layers of the first sacrificial layers 114 and the first semiconductor layer 116, patterned silicon layer 120, patterned SiGe layer 118, patterned silicon layer 121, and patterned alternating layers of the second sacrificial layer 122 and the second semiconductor layer 124, and the semiconductor fin 128 is formed of a same material (e.g., silicon) as the substrate 102.

The fin structure 126 may be patterned by using a lithography process using a bi-axial mask 132, which can also be referred to as a bi-axial oxide definition (OD) mask. For example, when viewed from a top view, the bi-axial mask 132 has a grid shape, which may be interchangeable to a number sign shape, a hash shape, or a pound sign. The fin structure 126 may be patterned by any suitable method. For example, the fin structure 126 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fin structure 126.

In some embodiments, patterning the fin structure 126 includes forming a hard mask and a photoresist (not shown) on the stack 104 in sequence, patterning the photoresist using the bi-axial mask 132 to transfer the pattern of the bi-axial mask 132 to the photoresist, patterning the stack 104 and the hard mask using any acceptable anisotropic etch process (e.g., reactive ion etch (RIE), neutral beam etch (NBE), or the like) using the photoresist as an etch mask, and removing the hard mask and the photoresist using suitable etching or ashing method.

Due to the bi-axial mask 132, the fin structure 126 may have a bi-axial pattern, which can also be referred to as a "#"-like shape, which may be interchangeable to a number sign shape, a hash shape, or a pound sign. That is, the first sacrificial layers 114, the first semiconductor layer 116, the silicon layer 120, the SiGe layer 118, the silicon layer 121, the second sacrificial layer 122 and the second semiconductor layer 124 each has a bi-axial pattern. In other words, the fin structure 126 extends along a first direction d1 and a second direction d2 different from the first direction d1. The first direction d1 crosses the second direction d2. In some embodiments, the first direction d1 is substantially perpendicular to the second direction d2. The fin structure 126 has first strips 126A along the first direction d1 and second strips 126B along the second direction.

Next, in FIGS. 3A-3D, Shallow Trench Isolation (STI) regions 134 are formed over the substrate 102 and on opposing sides of the fin structure 126. As an example to form the STI regions 134, an insulation material may be formed over the substrate 102. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed after the insulation material is formed.

In an embodiment, the insulation material is formed such that excess insulation material covers the fin structure 126. In some embodiments, a liner is first formed along surfaces of the substrate 102 and fin structure 126, and a fill material, such as those discussed above is formed over the liner. In some embodiments, the liner is omitted.

Next, a removal process is applied to the insulation material to remove excess insulation material over the fin structure 126. In some embodiments, a planarization process such as a chemical mechanical polish (CMP), an etch back process, combinations thereof, or the like may be utilized. The planarization process exposes the nanostructure 130 such that a top surface of the nanostructure 130 and the insulation material are level after the planarization process is complete. Next, the insulation material is recessed to form the STI regions 134. The insulation material is recessed such that the nanostructure 130 protrudes from between neighboring STI regions 134. Further, the top surfaces of the STI regions 134 may have a flat surface as illustrated, a convex surface, a concave surface (such as dishing), or a combination thereof. The top surfaces of the STI regions 134 may be formed flat, convex, and/or concave by an appropriate etch. The STI regions 134 may be recessed using an acceptable etching process, such as one that is selective to the material of the insulation material (e.g., etches the material of the insulation material at a faster rate than the material of the semiconductor fin 128 and the nanostructure 130). For example, a chemical oxide removal with a suitable etchant such as dilute hydrofluoric (dHF) acid may be used.

Reference is made to FIGS. 4A-4E. A dummy gate 136 may be formed over the nanostructure 130 and over the STI regions 134. The dummy gate 136 includes a dummy gate dielectric and a dummy gate electrode (not separately illustrated) over the dummy gate dielectric. The dummy gate dielectric may be, for example, silicon oxide, silicon nitride, the like or a combination thereof, and may be deposited or thermally grown according to acceptable techniques. In an embodiment, a layer of silicon is conformally formed over the nanostructure 130 and over the upper surface of the STI regions 134, and a thermal oxidization process is performed to convert the deposited silicon layer into an oxide layer as the dummy gate dielectric.

The dummy gate electrode may be deposited over the dummy gate dielectric and then planarized, such as by a CMP. The dummy gate electrode may be a conductive material and may be selected from a group including amorphous silicon, polycrystalline-silicon (polysilicon), polycrystalline silicon-germanium (poly-SiGe), or the like. The dummy gate electrode may be deposited by physical vapor deposition (PVD), CVD, sputter deposition, or other techniques known and used in the art. The dummy gate electrode may be made of other materials that have a high etching selectivity to the STI regions 134.

A Mask 138 is then formed over the dummy gate 136. The mask 138 may be formed from silicon nitride, silicon oxynitride the like, or a combination thereof. In the illustrated embodiment, the mask 138 includes a first mask layer 138A (e.g., a silicon oxide layer) and a second mask layer 138B (e.g., a silicon nitride layer) over the first mask layer 138A. The dummy gate 136 and the mask 138 may be patterned by a lithography process using a bi-axial mask 140, which can also be referred to as a bi-axial poly definition mask. For example, when viewed from a top view, the bi-axial mask 140 has a 2×2 grid-like shape. The bi-axial mask 140 has a pattern different from a pattern of the bi-axial mask 132 when viewed from a top view.

In some embodiments, patterning the dummy gate 136 includes forming the mask 138 on the dummy gate 136 and forming a photoresist (not shown) on the mask 138 in sequence, patterning the photoresist using the bi-axial mask 140 to transfer the pattern of the bi-axial mask 140 to the photoresist. The pattern of the photoresist is then transferred to the mask 138 and the dummy gate 136 by by acceptable etching technique, such as using any acceptable anisotropic etch process (e.g., reactive ion etch (RIE), neutral beam etch (NBE), or the like) using the photoresist as an etch mask and removing the photoresist using suitable ashing method.

By using the bi-axial mask 140, the dummy gate 136 and the mask 138 may have a bi-axial pattern, which can also be referred to as a 2×2 grid-like shape. For example, the dummy gate 136 and the mask 138 extend along the first direction d1 and the second direction d2 different from the first direction d1. The first direction d1 crosses the second direction d2. In some embodiments, the first direction d1 is substantially perpendicular to the second direction d2. The dummy gate 136 has one or more first dummy gate strips 136A along the first direction d1 and one or more second dummy gate strips 136B along the second direction d2.

The dummy gate 136 covers a channel region of the nanostructure 130. Although one fin structure 126 and one dummy gate 136 are illustrated in the figures as a non-limiting example, it should be appreciated that other numbers of fin structure and other numbers of dummy gates may also be formed. The dummy gate crosses the fin structure.

Next, a gate spacer layer is formed by conformally depositing a first spacer layer 142A and a second spacer layer 142B in sequence over the nanostructure 130, the STI regions 134, the dummy gate 136 and the mask 138. The first spacer layer 142A and the second spacer layer 142B are subsequently patterned to form gate spacers 142 for forming self-aligned source/drain regions. In some embodiments, the gate spacer layer is etched by an anisotropic etching process. The anisotropic etching process may remove horizontal portions of the gate spacer layer (e.g., portions over the STI regions 134 and the dummy gate 136), with remaining vertical portions of the gate spacer layer (e.g., along sidewalls of the dummy gate 136 and the mask 138) forming the gate spacers 142. The gate spacers 142 include the first spacer layer 142A and the second spacer layer 142B over the first spacer layer 142A. The first spacer layer 142A may be formed of silicon oxide, silicon nitride, silicon oxynitride, or the like, using techniques such as thermal oxidation or deposited by CVD, ALD, or the like. The second spacer layer 142B may be formed of a material having a different etch rate than the material of the first spacer layer 142A, such as silicon oxide, silicon nitride, silicon oxynitride, or the like, and may be deposited by CVD, ALD, or the like.

The above disclosure generally describes a process of forming gate spacers. Other processes and sequences may be used. For example, fewer or additional spacers may be utilized, different sequence of steps may be utilized (e.g., the first spacer layer 142A may be patterned prior to depositing the second spacer layer 142B), additional spacers may be formed and removed.

After the formation of the gate spacers 142, implantation for lightly doped source/drain (LDD) regions (not shown) may be performed. Appropriate type (e.g., p-type or n-type) impurities may be implanted into the exposed nanostructure 130 and/or the semiconductor fin 128. The n-type impurities may be the any suitable n-type impurities, such as phosphorus, arsenic, antimony, or the like, and the p-type impurities may be the any suitable p-type impurities, such as boron, $BF_2$, indium, or the like. An anneal process may be used to activate the implanted impurities.

Source/drain recesses 144 are formed in the nanostructure 130 and the semiconductor fin 128. The resulting structure is shown in FIGS. 5A-5D. The source/drain recesses 144 may extend through the nanostructure 130 and into the semiconductor fin 128. A first portion of the first strips 126A and a second portion of the second strips 126B uncovered by the dummy gate 136 are recessed. The source/drain recesses 144 may be formed by any acceptable etching technique, using, e.g., the dummy gate 136 as an etching mask. The source/drain recesses 144 exposes end portions of the nanostructure 130 and the semiconductor fin 128.

Next, the SiGe layer 118 is removed, forming a gap between the silicon layers 120, 121. The removal of the SiGe layer 118 may be a selective etch process that removes the SiGe layer 118 but not the other layers of the nanostructure 130 and the semiconductor fin 128. An insulator layer 146 may be formed by depositing an isolation material in the gap, in the source/drain recesses 144 and on the mask 138 using PVD, CVD, ALD, or other suitable method, followed by an etch back process to remove the isolation material in the source/drain recesses 144 and on the mask 138. The resulting structure is shown in FIGS. 6A-6D. The insulator layer 146 may include one or more layers of dielectric material, such as a metal oxide, for example, a refractory metal oxide. Since the SiGe layer 118 is replaced with the insulator layer 146, the insulator layer 146 can inherit a profile of the SiGe layer 118. For example, the insulator layer 146 has a bi-axial pattern when viewed from a top view.

Sidewalls of the first sacrificial layers 114 and the second sacrificial layer 122 exposed by the source/drain recesses 144 are etched to form sidewall recesses. Although sidewalls of the first sacrificial layers 114 and the second sacrificial layer 122 are illustrated as being straight in FIGS. 7B and 7D, the sidewalls may be concave or convex. The sidewalls may be etched using isotropic etching processes, such as wet etching or the like. In some embodiments in which the first sacrificial layers 114 and the second sacrificial layer 122 include, e.g., SiGe, and the first semiconductor layer 116 and the second semiconductor layer 124 include, e.g., Si or SiC, a dry etch process with tetramethylammonium hydroxide (TMAH), ammonium hydroxide ($NH_4OH$), or the like may be used to etch sidewalls of the first and second sacrificial layers 114, 122.

Inner spacers 148 are then formed in the sidewall recesses. The resulting structure is shown in FIGS. 7A-7D. The inner spacers 148 may be formed by depositing an inner spacer layer (not separately illustrated) over the substrate 102, the sidewall recesses, the first semiconductor layer 116, the second semiconductor layer 124, the silicon layers 120, 121, the gate spacers 142 and the mask 138, followed by etching the inner spacer layer by an anisotropic etching process, such as RIE, NBE, or the like. The inner spacers 148 act as isolation features between subsequently formed epitaxial source/drain regions and gate structure. As will be discussed in greater detail below, epitaxial source/drain regions will be formed in the source/drain recesses 144, and the first and second sacrificial layers 114, 122 will be replaced with corresponding gate structures.

The inner spacer layer may be deposited by a conformal deposition process, such as CVD, ALD, or the like. The inner spacer layer may include a material such as silicon nitride or silicon oxynitride, although any suitable material, such as low-dielectric constant (low-k) materials having a k-value less than about 3.5, may be utilized. Although outer sidewalls of the inner spacers 148 are illustrated as being flush with sidewalls of the first and second semiconductor layers 116, 124, the outer sidewalls of the inner spacers 148 may extend beyond or be recessed from sidewalls of the first and second semiconductor layers 116, 124. Although the outer sidewalls of the inner spacers 148 are illustrated as being straight in FIGS. 7B and 7D, the outer sidewalls of the inner spacers 148 may be concave or convex. The inner spacer layer may be etched by an anisotropic etching process, such as RIE, NBE, or the like.

Figure 8A:
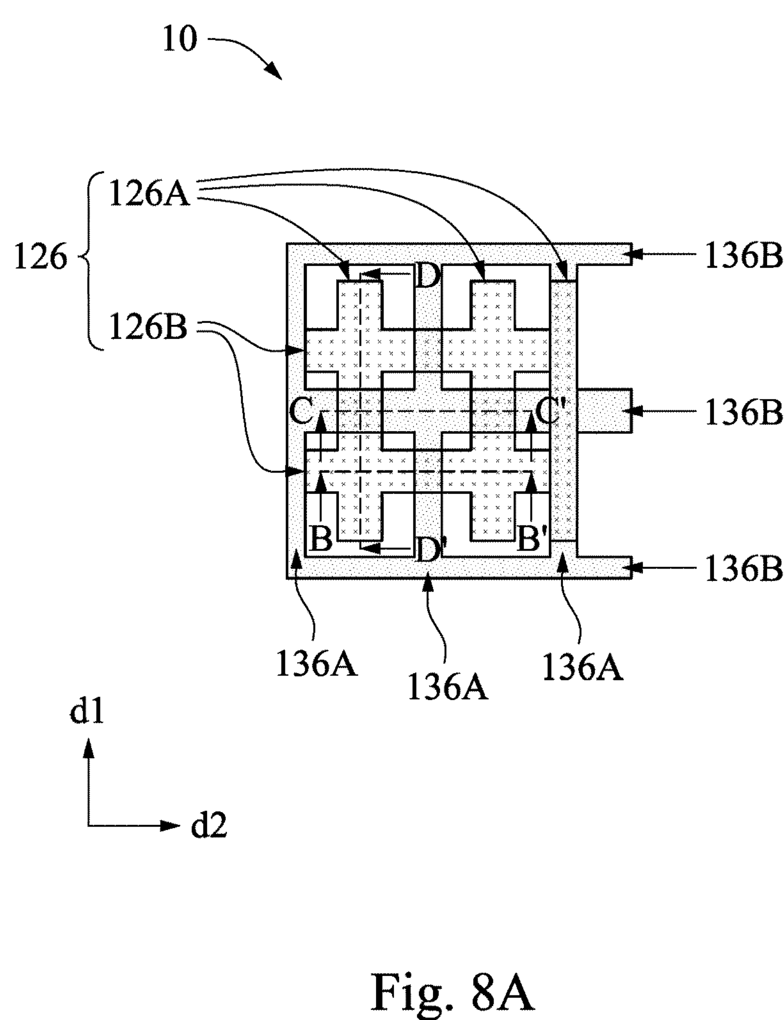
Figure 8B:
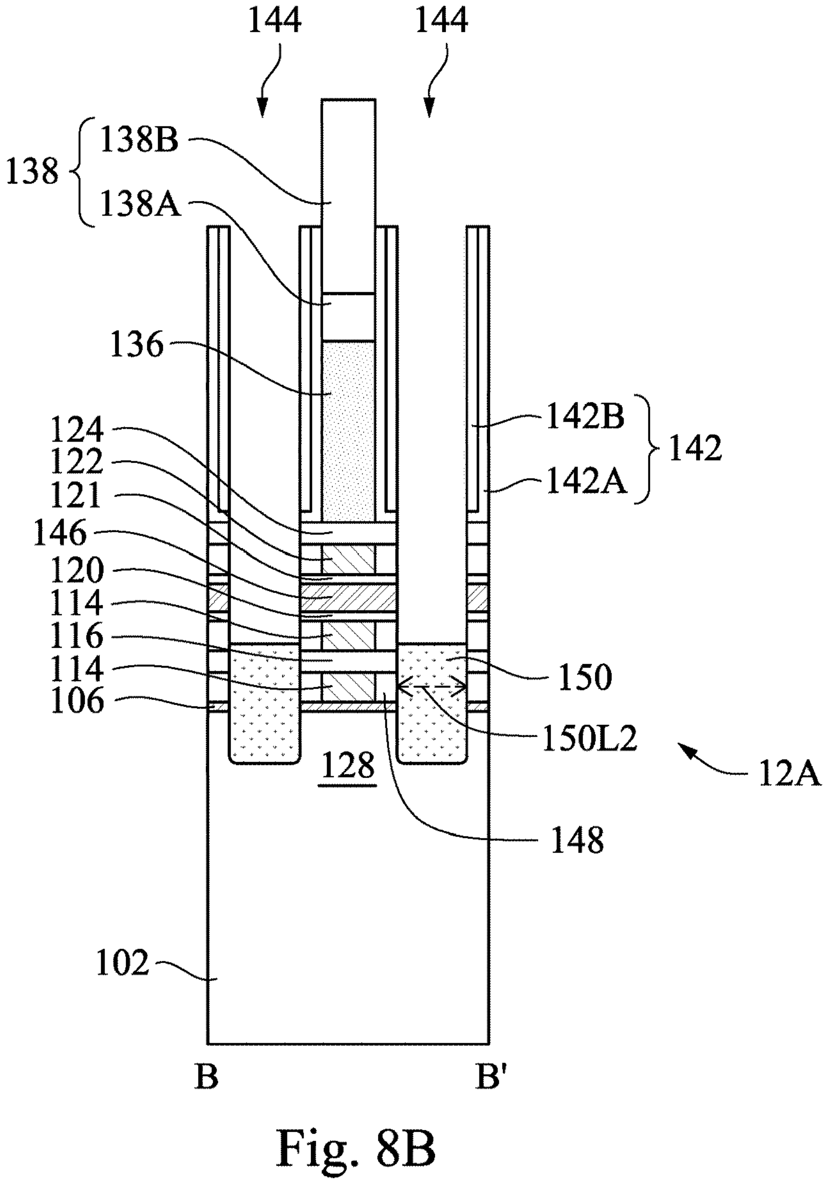
Figure 8D:
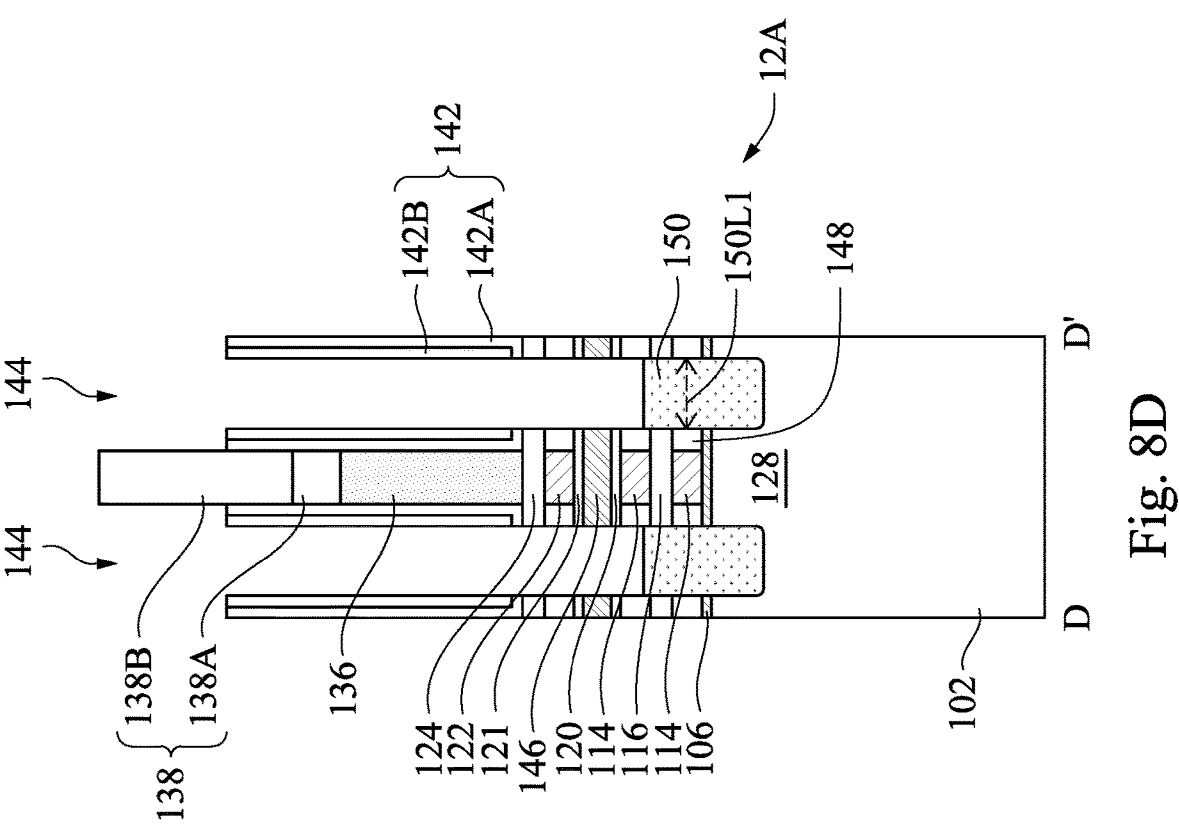
Figure 8C:
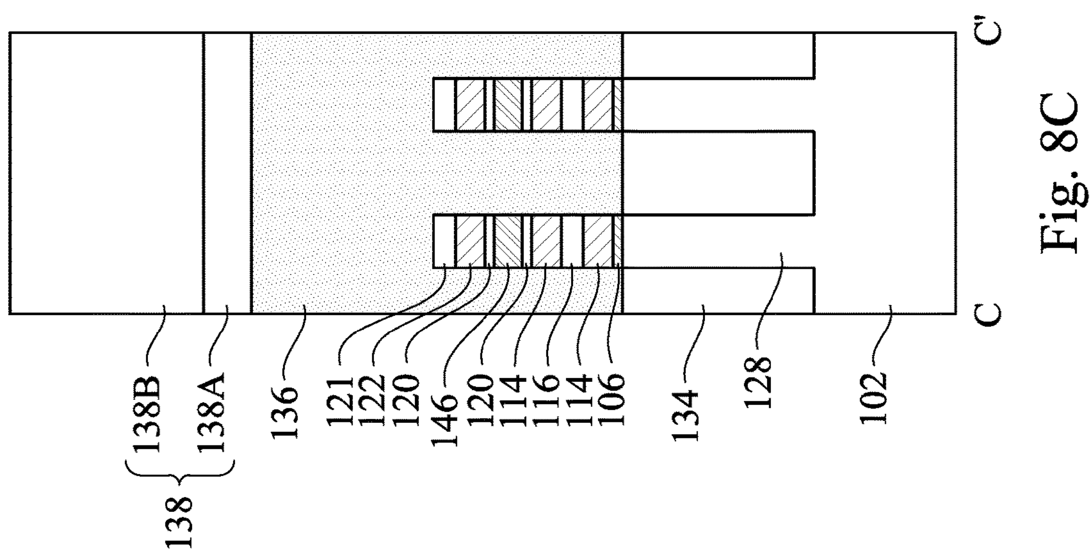

Next, in FIGS. 8A-8D, first epitaxial source/drain (S/D) regions 150 are formed in the source/drain recesses 144 by an epitaxial growth method using CVD, ALD or MBE. In FIG. 8B, the first epitaxial S/D regions 150 are grown from the recessed second strips 126B. In FIG. 8D, the first epitaxial S/D regions 150 are grown from the recessed first strips 126A. The first epitaxial S/D regions 150 are on opposite sides of the first semiconductor layer 116. In some embodiments, the first epitaxial S/D regions 150 are formed of an epitaxial material(s). In some embodiments, the first epitaxial S/D regions 150 are formed in the source/drain recesses 144 to exert stress in the respective channel regions of the first semiconductor device 12A formed, thereby improving carrier mobility. The first epitaxial S/D regions 150 are formed such that the dummy gate 136 is disposed between neighboring pairs of the first epitaxial S/D regions 150. In this disclosure, a source region and a drain region are interchangeably used, and the structures thereof are substantially the same.

The first epitaxial S/D regions 150 are epitaxially grown in the source/drain recesses 144, in some embodiments. The first epitaxial S/D regions 150 may include any acceptable material, such as appropriate for n-type or p-type device. For example, when n-type devices are formed, the first epitaxial S/D regions 150 may include materials exerting a tensile strain in the channel regions, such as silicon, SiC, SiCP, SiP, or the like. Likewise, when p-type devices are formed, the first epitaxial S/D regions 150 may include materials exerting a compressive strain in the channel regions, such as SiGe, SiGeB, Ge, GeSn, or the like.

The epitaxial growth of the first epitaxial S/D regions 150 is confined by the dummy gate 136 along the first direction d1 and the second direction d2. For example, a lateral dimension 150L2 of the first epitaxial S/D regions 150 is confined by the first row 136A of the dummy gate 136 along the first direction d1. Similarly, a lateral dimension 150L1 of the first epitaxial S/D regions 150 is confined by the second row 136B of the dummy gate 136 along the second direction d2. Therefore, huge epi-growth effort to limit epi-lateral dimension under criteria to prevent unwanted bridge between epitaxial structures for neighbor cells is not required. The first epitaxial S/D regions 150 have a top surface lower than a bottom surface of the insulator layer 146.

The first epitaxial S/D regions 150 and/or the semiconductor fin 128 may be implanted with dopants to form source/drain regions, similar to the process previously discussed for forming lightly-doped source/drain regions, followed by an anneal. The n-type and/or p-type impurities for first epitaxial S/D regions 150 may be any of the impurities previously discussed. In some embodiments, the first epitaxial S/D regions 150 may be in situ doped during growth.

Reference is made to FIGS. 9A-9D. A contact etch stop layer (CESL) 152 is formed (e.g., conformally) over the first epitaxial S/D regions 150 and over the mask 138, and a first interlayer dielectric (ILD) layer 154 is then deposited over the CESL 152. Next, the CESL 152 and the first ILD layer 154 are recessed to have a top surface lower than a bottom surface of the second semiconductor layer 124, for example, using an etch back process or the like. The CESL 152 is formed of a material having a different etch rate than the first ILD layer 154, and may be formed of silicon nitride using CVD, ALD, PVD or the like, although other dielectric materials such as silicon oxide, silicon oxynitride, the like, or a combination thereof could be used.

The first ILD layer 154 may be formed of a dielectric material, and may be deposited by any suitable method, such as CVD, plasma-enhanced CVD (PECVD), or FCVD. Dielectric materials for the first ILD layer 154 may include silicon oxide, Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used.

Second epitaxial source/drain (S/D) regions 156 are then formed in the source/drain recesses 144 and over the CESL 152 and the first ILD layer 154. The second epitaxial S/D regions 156 are on opposite sides of the second semiconductor layer 124. In some embodiments, the second epitaxial S/D regions 156 are formed of an epitaxial material(s). In some embodiments, the second epitaxial S/D regions 156 are formed in the source/drain recesses 144 to exert stress in the respective channel regions of the second semiconductor device 12B formed, thereby improving carrier mobility. The second epitaxial S/D regions 156 are formed such that the dummy gate 136 is disposed between neighboring pairs of the second epitaxial S/D regions 156.

The second epitaxial S/D regions 156 are epitaxially grown in the source/drain recesses 144 from the second semiconductor layer 124, in some embodiments. The second epitaxial S/D regions 156 may include any acceptable material, such as appropriate for n-type or p-type device. For example, when n-type devices are formed, the second epitaxial S/D regions 156 may include materials exerting a tensile strain in the channel regions, such as silicon, SiC, SiCP. SiP, or the like. Likewise, when p-type devices are formed, the second epitaxial S/D regions 156 may include materials exerting a compressive strain in the channel regions, such as SiGe, SiGeB, Ge, GeSn, or the like. In some embodiments, the first epitaxial S/D regions 150 and the second epitaxial regions 156 are of opposite conductivity types. For example, the first epitaxial S/D regions 150 are p-type epitaxial regions, while the second epitaxial S/D regions 154 are n-type epitaxial regions, and thus the resultant bottom transistor and top transistor can collectively serve as a complementary field effect transistor (CFET) structure.

The epitaxial growth of the second epitaxial S/D regions 156 is confined by the dummy gate 136 along the first direction d1 and the second direction d2. For example, a lateral dimension 156L2 along the second direction d2 of the first epitaxial S/D regions 156 is confined by the first row 136A of the dummy gate 136 along the first direction d1. Similarly, a lateral dimension 156L1 of the second epitaxial S/D regions 156 along the first direction d1 is confined by the second row 136B of the dummy gate 136 along the second direction d2. Therefore, huge epi-growth effort to limit epi-lateral dimension under criteria to prevent unwanted bridge between epitaxial structures for neighbor cells is not required. The second epitaxial S/D regions 156 have a top surface lower than a bottom surface of the dummy gate 136.

The second epitaxial S/D regions 156 may be implanted with dopants to form source/drain regions, similar to the process previously discussed for forming lightly-doped source/drain regions, followed by an anneal. The n-type and/or p-type impurities for the second epitaxial S/D regions 156 may be any of the impurities as previously discussed. In some embodiments, the second epitaxial S/D regions 156 may be in situ doped during growth.

Next, a contact etch stop layer (CESL) 158 is formed (e.g., conformally) over the second epitaxial S/D regions 156 and over the mask 138, and a second interlayer dielectric (ILD) layer 160 is then deposited over the CESL 158. Next, the CESL 158 and the second ILD layer 160 are recessed to have a top surface higher than a top surface of the dummy gate 136, for example, using an etch back process or the like. The CESL 158 is formed of a material having a different etch rate than the second ILD layer 160. The CESL 158 and the second ILD layer 160 are similar to the CESL 152 and the first ILD layer 154, respectively, in terms of composition and formation method, and thus the description thereof is omitted herein.

Next, as illustrated in FIGS. 10A-10D, the dummy gate 136 is removed. To remove the dummy gate 136, a planarization process, such as a CMP, may be performed to level the top surfaces of the second ILD layer 160 and the CESL 158 with the top surfaces of the dummy gate 136 and the gate spacers 142. The top surface of the dummy gate 136 is exposed. The planarization process may also remove the mask 138 (see FIG. 9B) on the dummy gate 136 (if the mask 138 has not been removed by the anisotropic etching process to form the gate spacers 142), and portions of the gate spacers 142 along sidewalls of the mask 138 and the dummy gate 136.

After the planarization process, the dummy gate 136 is removed in an etching step(s), so that a gate trench (may also be referred to as an opening) GT is formed between the gate spacers 142. In some embodiments, the dummy gate 136 is removed by an anisotropic dry etch process. For example, the etching process may include a dry etch process using reaction gas(es) that selectively etches the dummy gate 136 without etching the second ILD layer 160, the CESL 158 or the gate spacers 142. The gate trench GT exposes the channel regions of the first and second semiconductor devices 12A, 12B. The channel regions are disposed between neighboring pairs of the first epitaxial S/D regions 150 and between neighboring pairs of the second epitaxial S/D regions 156. After removal of the dummy gate 136, the first sacrificial layers 114, the first semiconductor layer 116, the silicon layers 120, 121, the insulator layer 146, the second sacrificial layer 122 and the second semiconductor layer 124 that were disposed under the dummy gate 136 are exposed by the gate trench GT.

Next, the first and second sacrificial layers 114, 122 are removed to release the first semiconductor layer 116 and the second semiconductor layer 124. The first and second semiconductor layers 116, 124 form a plurality of nanosheets that extend horizontally (e.g., parallel to a major upper surface of the substrate 102). The first semiconductor layer 114 may be referred to as the channel region or the channel layer of the first semiconductor device 12A. The second semiconductor layer 124 may be referred to as the channel region or the channel layer of the second semiconductor device 12B. The first and second semiconductor layers 116, 124 may also be referred to as nanowires, and the first and second semiconductor device 12A, 12B may also be referred to as a gate-all-around (GAA) device, in some embodiments.

In some embodiments, the first and second sacrificial layers 114, 122 are removed by a selective etching process using an etchant that is selective to (e.g., having a higher etch rate for) the first and second sacrificial layers 114, 122, such that the first and second sacrificial layers 114, 122 are removed without substantially attacking the first and second semiconductor layer 116, 124. In an embodiment, an isotropic etching process is performed to remove the first and second sacrificial layers 114, 122. Gaps GP1 are formed between the etch stop layer 106 and the first semiconductor layer 116 and between the first semiconductor layer 116 and the silicon layer 120. A Gap GP2 is formed between the silicon layer 121 and the second semiconductor layer 124.

Next, in FIGS. 11A-11D, a first metal gate structure 168 is formed in the gaps GP1, and a second metal gate structure 172 is formed in the gap GP2 and the gate trench GT. The insulator layer 146 is vertically between the first metal gate structure 168 and the second metal gate structure 172. The first metal gate structure 168 includes an interfacial layer 162, a gate dielectric layer 164 and a gate electrode 166. For example, the interfacial layer 162 is formed (e.g., conformally) in the gate trench GT and in the gaps GP1, GP2. The interfacial layer 162 wraps around the first semiconductor layer 116, the silicon layer 120, 121 and the second semiconductor layer 124. The interfacial layer 162 may be a silicon oxide-containing layer. For example, the interfacial layer 162 may include a dielectric material such as silicon oxide ($SiO_2$) or silicon oxynitride (SiON). The interfacial layer 162 may be formed by chemical oxidation, thermal oxidation, atomic layer deposition (ALD), chemical vapor deposition (CVD), and/or other suitable method.

The gate dielectric layer 164 is formed on the interfacial layer 162 (e.g., conformally) in the gate trench GT and in the gaps GP1, GP2. The etch stop layer 106 is between the substrate 102 and the gate dielectric layer 164. The gate dielectric layer 164 wraps around the first semiconductor layer 116, the second semiconductor layer 124, lines sidewalls of the gate spacers 142, and extends along the etch stop layer 106 on the semiconductor fin 128 and along the STI region 134. In some embodiments, the gate dielectric layer 164 includes silicon oxide, silicon nitride, or a multilayer thereof. In some embodiments, the gate dielectric layer 164 includes a high-k dielectric material, and in these embodiments, the gate dielectric layer 164 may have a dielectric constant greater than about 7.0, and may include a metal oxide or a silicate of Hf, Al, Zr, La, Mg. Ba, Ti, or Pb, or a combination thereof. The gate dielectric layer 164 may be formed by ALD, PVD. CVD or other suitable methods.

Next, a gate electrode 166 (e.g., an electrically conductive material) is formed on the gate dielectric layer 164. The gate electrode 166 fills the remaining portions of the gate trench GT and in the gaps GP1, GP2. For example, the gate electrode 166 includes one or more work function layers and a fill metal layer (not separately illustrated). A CMP is then performed on the gate electrode 166 and the gate dielectric layer 164 until the second ILD layer 160 is exposed, resulting in the gate electrode 166 and the gate dielectric layer 164, the CESL 158, and the second ILD layer 160 having substantially level top surfaces.

The one or more work function layers may be deposited to surround the first semiconductor layer 116, the insulator layer 146, the silicon layers 120, 121 and the second semiconductor layer 124. The one or more work function layers can provide a suitable work function for the first metal gate structure 168. For an n-type device, the one or more work function layers may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TIC), aluminum carbide (AIC)), aluminides, and/or other suitable materials. On the other hand, for a p-type device, the one or more work function layers may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal layer may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. Since the dummy gate 136 is replaced with the first metal gate structure 168 and the second metal gates structure 172, the first metal gate structure 168 and the second metal gate structure 172 inherits a profile of the dummy gate. For example, the first metal gate structure 168 and the second metal gate structure 172 each has a cross pattern when viewed from a top view (see FIGS. 23B and 23C).

The gate electrode 166 is then etched back in an etching step(s), so that a recess is formed. For example, the gate electrode 166 is etched to expose an upper portion of the insulator layer 146 and the silicon layer 121. A gate electrode 170 is then formed in the recess, covering the upper portion of the insulator layer 146, the silicon layer 121, the CESL 158 and the second ILD layer 160. A CMP is performed to the second metal gate structure 172 until the second ILD layer 160 is exposed, resulting in the second metal gate structure 172, the CESL 158, and the second ILD layer 160 having substantially level top surfaces.

The second metal gate structure 172 includes a gate electrode 170, the gate dielectric layer 164 and the interfacial layer 162. For example, the gate electrode 170 includes one or more work function layers and a fill metal layer (not separately illustrated) over the work function layers. The one or more work function layers may be deposited to surround the insulator layer 146, the silicon layer 121 and the second semiconductor layer 124. The one or more work function layers can provide a suitable work function for the second metal gate structure 172. For an n-type device, the one or more work function layers may include one or more n-type work function metals (N-metal) as discussed above. On the other hand, for a p-type device, the one or more work function layers may include one or more p-type work function metals (P-metal) as discussed above.

The second ILD layer 160 is etched back in an etching step(s), so that a recess is formed. The recess allows for a contact etch stop layer (CESL) 174 to be formed within the recess. The second ILD layer 160 may be recessed using an acceptable etching process, such as one that is selective to the material of the second ILD layer 160.

The CESL 174 may be made of SiN, SiON, $SiO_2$, the like, or a combination thereof. The CESL 174 may be formed by CVD, PVD, ALD, a spin-on-dielectric process, the like, or a combination thereof. A planarization process, such as a CMP process, may be performed to level a top surface of the second metal gate structure 172 with a top surface of the CESL 174. Accordingly, the top surface of the second metal gate structure 172 is exposed.

The first metal gate structure 168 and the second metal gate structure 172 are patterned using acceptable photolithography and etching techniques. In some embodiments, portions of the first metal gate structure 168 and the second metal gate structure 172, first semiconductor layers 116, second semiconductor layers 124, insulator layer 146, and semiconductor fins 128 at cell boundaries are removed, forming continuous poly on oxide definition (CPODE) openings. A CPODE pattern 176 is then formed in the openings to serve as electrical isolation from other standard cells on the substrate 102. Reference is made to FIGS. 12A-12D. Formation of the CPODE pattern 176 may include depositing an insulating material in the openings followed by a planarization process to remove excess materials of the material over the second metal gate structure 172 and the second ILD layer 160. The CESL 174 is removed. The CPODE pattern 176 represents cut sections or patterning areas where the second metal gate structure 172 and the first metal gate structure 168 first semiconductor layers 116, second semiconductor layers 124, insulator layer 146, and semiconductor fins 128 are removed.

Reference is made to FIGS. 13A-13D. A contact etch stop layer (CESL) 178 and a third interlayer dielectric (ILD) layer 180 are formed on the second metal gate structure 172, the second ILD layer 160 and the CPODE pattern 176. The CESL 178 and the third ILD layer 180 are similar to the CESL 152 and the first ILD layer 154 in terms of composition and formation method, and thus the description thereof is omitted herein.

Reference is made to FIGS. 14A-14D. The second ILD layer 160, the CESL 158, the third ILD layer 180 and the CESL 178 are patterned using acceptable photolithography and etching techniques, exposing the second epitaxial S/D regions 156 and the CPODE pattern 176, forming openings 182*a*, 182*b*, 182*c*, 182*d* over the second epitaxial S/D regions 156. A barrier layer 183 is formed in the openings 182*a*, 182*b*, 182*c*. 182*d* conformally by using PVD, ALD, CVD or the like. The barrier layer 183 may include a layer selected from the group consisting of a Ti layer, a TiN layer, a Ta layer, a TaN layer, and a multilayer thereof.

A hard mask and a photoresist (not shown) may then be formed on the structure in FIGS. 14A-14D. The hard mask and the photoresist are patterned to expose the opening 182*a* and protect the openings 182*b*, 182*c*, 182*d*. An etch process is performed to extend the opening 182*a* by removing the first ILD layer 154, the CESL 152 and the second epitaxial S/D regions 156, exposing the first epitaxial S/D regions 150. The resulting structure is shown in FIGS. 15A-15D.

Reference is made to FIGS. 16A-16D. Silicide layers 184, 186 are formed on the first and second epitaxial S/D regions 150, 156, respectively. Formation method of the silicide layers 184, 186 may include depositing a metal layer (not shown), such as nickel, titanium, cobalt, or a combination thereof, on the first and second epitaxial S/D regions 150, 156 in the openings 182*a*, 82*b*, 182*c*, 182*d*, annealing the meal layer to cause the metal layer to react with the first and second epitaxial S/D regions 150, 156 and removing remaining un-reacted metal layer by an etching process that attacks the metal layer but does not attack the silicide layers 184, 186. In some embodiments the hard mask and the photoresist (not shown) are removed during the etching process. In some embodiments, the silicide layer 186 in the opening 182*a* extends along opposite sidewalls of the second epitaxial S/D regions 156.

Reference is made to FIGS. 17A-17D. Source/drain contacts 188*a*, 188*b*, 188*c*, 188*d* are formed in the openings 182*a*, 182*b*, 182*c*, 182*d*. The source/drain contacts 188*a*, 188*b*, 188*c*, 188*d* may include a diffusion barrier layer 190 and a metal layer 192 over the diffusion barrier layer 190. The diffusion barrier layer 190 can prevent metal in the metal layer 192 from diffusing into the first ILD layer 154 and the third ILD layer 180. The diffusion barrier layer 190 may include titanium, titanium nitride, tantalum, tantalum nitride, ruthenium, ruthenium nitride, or the like. The metal layer 192 may include copper, copper alloy, aluminum, silver, gold, or the like. Formation method of the source/drain contacts 188*a*, 188*b*, 188*c*, 188*d* may include depositing a thin layer of diffusion barrier layer 190, and then forming the metal layer 192 to fill the openings 182*a*, 182*b*, 182*c*, 182*d* using CVD, ALD, PVD or the like. A chemical mechanical polish (CMP) is performed to remove excess material of the diffusion barrier layer 190 and the metal layer 192 and level the top surfaces of the contact plugs 188 with the third ILD layer 180. The barrier layer 183 over the third ILD layer 180 may be removed during the CMP process.

The silicide layers 186 contacting the source/drain contacts 188*a*, 188*b* each have different shapes in a cross-sectional view along the B-B' line. For example, the silicide layer 186 extends along opposite sidewalls of the source/drain contact 188*a*, and the silicide layer 186 cups a bottom of the source/drain contact 188*b*. The silicide layer 184 has a shape different form a shape of the silicide layer 186 over the silicide layer 184 when viewed from a cross-sectional view. For example, the silicide layer 184 cups a bottom of the source/drain contact 188*a*. In a cross-sectional view along the D-D' line, the silicide layer 186 cups a bottom of the source/drain contact 188*c*, and the silicide layer 186 extends along the opposite sidewalls of the source/drain contact 188*a*, while the silicide layer 184 cups a bottom of the source/drain contact 188*a*.

Reference is made to FIGS. 18A-18D. The IC structure 10 is flipped upside down. The substrate 102 is thinned down by a thinning process using grinding, CMP, etch back process, or other acceptable processes. For example, the substrate 102 can be etched to expose the etch stop layer 106. In some embodiments, the substrate 102 is removed entirely. The second epitaxial S/D region 156 is then etched back, forming recesses 194.

Reference is made to FIGS. 19A-19D. A contact etch stop layer (CESL) 196 and a fourth interlayer dielectric (ILD) layer 198 fill in the recesses 194 and cover the etch stop layer 106 and the CPODE pattern 176. The CESL 196 and the fourth ILD layer 198 are similar to the CESL 152 and the first ILD layer 154 in terms of composition and formation method thereof, and thus the description thereof is omitted herein.

The fourth ILD layer 198 and the CESL 196 are patterned using acceptable photolithography and etching techniques, exposing the first epitaxial S/D regions 150, forming openings over the first epitaxial S/D regions 150. Silicide layers 199 are then formed in the openings over the first epitaxial S/D regions 150. The silicide layers 199 are similar to the silicide layers 184 and 186 in terms of composition and formation method, and thus the description thereof is omitted herein. The silicide layer 199 and the silicide layer 184 are on opposite sides of the first epitaxial S/D regions 150 over the source/drain contact 188*a*.

Next, source/drain contacts 200*a*, 200*b*, 200*c*, 200*d* are formed in the CESL 196 and the fourth ILD layer 198. The resulting structure is shown in FIGS. 20A-20D. The source/drain contacts 200*a*, 200*b*, 200*c*, 200*d* may include a diffusion barrier layer 202 and a metal layer 204 over the diffusion barrier layer 202. The source/drain contacts 200*a*. 200*b*. 200*c*. 200*d* are similar to the source/drain contacts 188*a*, 188*b*, 188*c*. 188*d* in terms of composition and formation method, and thus the description thereof is omitted herein. The silicide layers 199 cup a bottom of the source/drain contact 200*a* and a bottom of the source/drain contact 200*b*.

Reference is made to FIGS. 21A and 21B. After forming the source/drain contacts 200*a*, 200*b*, 200*c*, 200*d*, the IC structure 10 is flipped upside down again such that the source/drain contacts 188*a*, 188*b*, 188*c* and 188*d* and the third ILD layer 180 face upward. Through holes 206 are formed in the CESL 178 and the third ILD layer 180, exposing the second metal gate structure 172. The through holes 206 may be formed by applying and developing a photoresist (not shown), and removing the CESL 178 and the third ILD layer 180 by an etch process. The photoresist is then ashed by plasma ashing or other suitable method.

Reference is made to FIGS. 22A-22D. The through holes 206 are filled with a conductive material such as one or more metals using a deposition process such as CVD, PVD, plating, ALD, or the like. Alternatively, a liner layer, such as titanium nitride or tantalum nitride is deposited on sidewalls of the through holes 206, and then the conductive material is filled therein. A CMP process is performed subsequently to remove the excess conductive material over the third ILD layer 180, forming gate contacts 208. The conductive material may include copper, copper alloy, aluminum, silver, gold, or the like.

Reference is made to FIGS. 23A-23C. The IC structure 10 is then flipped upside down, forming an interconnect structure 210A including vias 212 and metal lines 214 on the source/drain contacts 200*a*, 200*b*, 200*c* and 200*d*. In some embodiments, the vias 212 and the metal lines 214 are formed using a dual damascene process or a single damascene process. The IC structure 10 is then flipped upside down again, forming an interconnect structure 210B including vias 216 and metal lines 218 on the source/drain contacts 200*a*, 200*b*, 200*c* and 200*d*. In some embodiments, the vias 216 and the metal lines 218 are formed using a dual damascene process or a single damascene process. The metal lines 214, 218 may extend along the second direction d2.

The resulting IC structure 10 has the first semiconductor device 12A and the second semiconductor device 12B. The first semiconductor device 12A can be referred to as a first floor of the IC structure 10, and the second semiconductor device 12B can be referred to as a second floor of the IC structure 10. In the first floor, the first semiconductor device 12A constructs four transistors T1*a*, T1*b*, T1*c*, T1*d*. Similarly, in the second floor, the second semiconductor device 12B constructs four transistors T2*a*, T2*b*, T2*c*, T2*d*. In some embodiments, the first semiconductor device 12A is a p-type device. That is, the transistors T1*a*, T1*b*, T1*c*, T1*d* are p-type transistors, and the gate electrode of the first metal gate structure 168 includes P-metal. The first semiconductor layer 116 may be referred to as a p-type oxide definition (OD) region. In some embodiments, the second semiconductor device 12B is a n-type device. That is, the transistors T2*a*, T2*b*, T2*c*, T2*d* are n-type transistors, and the gate electrode of the second metal gate structure 172 includes N-metal. The second semiconductor layer 124 may be referred to as an n-type oxide definition (OD) region.

As discussed previously with regard to FIGS. 11A-11D, the first metal gate structure 168 and the second metal gate structure 172 each has a cross pattern when viewed from a top view. Reference is made to FIGS. 23B and 23C. For example, the first metal gate structure 168 has one or more first gate strips 168A along the first direction d1 and one or more second gate strips 168B along the second direction d2. The second metal gate structure 172 has one or more first gate strips 172A along the first direction d1 and one or more second gate strips 172B along the second direction d2. In other words, the first metal gate structure 168 and the second metal gate structure 172 each have a cross pattern.

The first semiconductor layer 116 has first strips 116A along the first direction d1 and second strips 116B along the second direction d2. The second semiconductor layer 124 has first strips 124A along the first direction d1 and second strips 124B along the second direction d2. An intersecting region of one of the first gate strips 168A and one of the second gate strips 168B non-overlaps with the first strips 116A and the second strips 116B of the first semiconductor layer 116, and the first strips 124A and the second strips 124B of the second semiconductor layer 124. Similarly, an intersecting region of one of the first gate strips 172A and one of the second gate strips 172B non-overlaps with the first strips 116A and the second strips 116B of the first semiconductor layer 116, and the first strips 124A and the second strips 124B of the second semiconductor layer 124.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that the bi-axial OD direction CFET design offers more OD width (effect width) under the same cell area. Another advantage is that the bi-axial OD direction design can provide OD with different directions, which is beneficial for OD width design flexibility and improved control over lateral dimension of an epitaxial structure.

In some embodiments, a semiconductor device includes a substrate, a semiconductor nanostructure over the substrate, a gate dielectric layer wrapping around the semiconductor nanostructure and a gate electrode over the gate dielectric layer. The semiconductor nanostructure includes a plurality of first strips extending along a first direction and a plurality of second strips along a second direction, and wherein the second direction crosses the first direction. In some embodiments, the gate electrode includes a cross pattern when viewed from a top view. In some embodiments, the gate electrode includes first gate strips extending along the first direction and second gate strips extending along the second direction. In some embodiments, the semiconductor device further comprises an etch stop layer between the substrate and the gate dielectric layer. In some embodiments, the etch stop layer is a high-k dielectric layer.

In some embodiments, an integrated circuit device comprises a substrate, a first semiconductor layer over the substrate, a first gate structure wrapping around the first semiconductor layer, a second gate structure wrapping around the second semiconductor layer and an insulator layer vertically between the first gate structure and the second gate structure. The first gate structure has a cross pattern when viewed from a top view. The second gate structure has a cross pattern when viewed from a top view.

In some embodiments, the insulator layer has a grid pattern when viewed from a top view. In some embodiments, the integrated circuit device further comprises a silicon layer between the insulator layer and the first gate structure. In some embodiments, the silicon layer is thinner than the first semiconductor layer. In some embodiments, the silicon layer has a cross pattern when viewed from a top view. In some embodiments, the integrated circuit device further comprises a silicon layer between the insulator layer and the second gate structure. In some embodiments, the silicon layer is thinner than the second semiconductor layer. In some embodiments, the silicon layer has a cross pattern when viewed from a top view. In some embodiments, the integrated circuit device further comprises first epitaxial source/drain regions on opposite sides of the first semiconductor layer, a first silicide layer on one of the first epitaxial source/drain regions, second epitaxial source/drain regions on opposite sides of the second semiconductor layer and a second silicide layer on one of the second epitaxial source/drain regions, wherein the first silicide layer and the second silicide layer have different shapes when viewed from a cross-sectional view. In some embodiments, the integrated circuit device further comprises a source/drain contact connecting the one of the first epitaxial source/drain region and the one of the second epitaxial source/drain regions.

In some embodiments, a method of forming an integrated circuit device comprises the following steps. A stack is formed on a substrate. The stack is patterned by a lithography process using a first grid-shaped mask such that the stack comprises a plurality of first semiconductor strips along a first direction and a plurality of second semiconductor strips along a second direction crossing the first direction. The plurality of first semiconductor strips is recessed. First epitaxial source/drain regions are grown from the recessed plurality of first semiconductor strips. In some embodiments, the method further comprises recessing the plurality of second semiconductor strips and growing second epitaxial source/drain regions from the recessed plurality of second semiconductor strips. In some embodiments, the method further comprises forming a gate structure over the substrate, the gate structure comprising a plurality of first gate strips along the first direction and a plurality of second gate strips along the second direction. In some embodiments, forming the gate structure comprises forming a dummy gate over the stack and patterning the dummy gate by a lithography process using a second grid-shaped mask such that the dummy gate comprises a plurality of first dummy gate strips along the first direction and a plurality of second dummy gate strips along the second direction, and replacing the dummy gate with the gate structure. In some embodiments, an intersecting region of one of the plurality of first gate strips and one of the plurality of second gate strips non-overlaps with the plurality of first semiconductor strips and the plurality of second semiconductor strips.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit device, comprising:

forming a stack on a substrate;

patterning the stack by a lithography process using a first grid-shaped mask such that the stack comprises a plurality of first semiconductor stack strips along a first direction and a plurality of second semiconductor stack strips along a second direction crossing the first direction;

recessing the plurality of first semiconductor stack strips; and growing first epitaxial source/drain regions from the recessed plurality of first semiconductor stack strips.

2. The method of claim 1, further comprising:

recessing the plurality of second semiconductor stack strips; and growing second epitaxial source/drain regions from the recessed plurality of second semiconductor stack strips.

3. The method of claim 1, further comprising:

forming a gate structure over the substrate, the gate structure comprising a plurality of first gate strips along the first direction and a plurality of second gate strips along the second direction.

4. The method of claim 3, wherein forming the gate structure comprises:

forming a dummy gate over the stack;

patterning the dummy gate by a lithography process using a second grid-shaped mask such that the dummy gate comprises a plurality of first dummy gate strips along the first direction and a plurality of second dummy gate strips along the second direction; and replacing the dummy gate with the gate structure.

5. The method of claim 3, wherein an intersecting region of one of the plurality of first gate strips and one of the plurality of second gate strips non-overlaps with the plurality of first semiconductor stack strips and the plurality of second semiconductor stack strips.

6. A method of forming a semiconductor device, comprising:

forming a semiconductor nanostructure over a substrate, wherein the semiconductor nanostructure includes:

a plurality of first semiconductor stack strips extending along a first direction; and a plurality of second semiconductor stack strips along a second direction, and wherein the second direction crosses the first direction;

forming a gate dielectric layer wrapping around the semiconductor nanostructure; and forming a gate electrode over the gate dielectric layer.

7. The method of claim 6, wherein the gate electrode includes a cross pattern when viewed from a top view.

8. The method of claim 6, wherein the gate electrode includes:

first gate strips extending along the first direction; and second gate strips extending along the second direction.

9. The method of claim 6, further comprising:

forming an etch stop layer between the substrate and the gate dielectric layer.

10. The method of claim 9, wherein the etch stop layer is a high-k dielectric layer.

11. A method of forming an integrated circuit device, comprising:

forming a first semiconductor layer, an insulator layer and a second semiconductor layer over a substrate in sequence;

forming a first gate structure wrapping around the first semiconductor layer, wherein the first gate structure has a cross pattern when viewed from a top view; and forming a second gate structure wrapping around the second semiconductor layer, wherein the second gate structure has a cross pattern when viewed from a top view, the insulator layer is vertically between the first gate structure and the second gate structure.

12. The method of claim 11, wherein the insulator layer has a grid pattern when viewed from a top view.

13. The method of claim 11, further comprising:

forming a silicon layer between the insulator layer and the first gate structure.

14. The method of claim 13, wherein the silicon layer is thinner than the first semiconductor layer.

15. The method of claim 13, wherein the silicon layer has a cross pattern when viewed from a top view.

16. The method of claim 11, further comprising:

forming a silicon layer between the insulator layer and the second gate structure.

17. The method of claim 16, wherein the silicon layer is thinner than the second semiconductor layer.

18. The method of claim 16, wherein the silicon layer has a cross pattern when viewed from a top view.

19. The method of claim 16, further comprising:

growing first epitaxial source/drain regions on opposite sides of the first semiconductor layer;

forming a first silicide layer on one of the first epitaxial source/drain regions;

growing second epitaxial source/drain regions on opposite sides of the second semiconductor layer; and forming a second silicide layer on one of the second epitaxial source/drain regions, wherein the first silicide layer and the second silicide layer have different shapes when viewed from a cross-sectional view.

20. The method of claim 19, further comprising:

forming a source/drain contact connecting the one of the first epitaxial source/drain regions and the one of the second epitaxial source/drain regions.

* * * * *